US012660718B2

(12) United States Patent (10) Patent No.: US 12,660,718 B2

Chen et al. (45) **Date of Patent: \*Jun. 16, 2026**

(54) SEMICONDUCTOR PACKAGES WITH STACKED DIES AND METHODS OF FORMING THE SAME

(71) Applicant: Taiwan Semiconductor Manufacturing Co., Ltd., Hsinchu (TW)

(72) Inventors: Ming-Fa Chen, Taichung City (TW); Hsien-Wei Chen, Hsinchu (TW); Sung-Feng Yeh, Taipei City (TW); Jie Chen, New Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,225

(22) Filed: Apr. 30, 2024

(65) Prior Publication Data

US 2024/0282732 A1 Aug. 22, 2024

Related U.S. Application Data

(63) Continuation of application No. 18/346,550, filed on Jul. 3, 2023, now Pat. No. 12,002,778, which is a (Continued)

(51) Int. Cl.
| | |
|---|---|
| *H01L 23/00* | (2006.01) |
| *H01L 25/00* | (2006.01) |
| *H01L 25/065* | (2023.01) |

(52) U.S. Cl.
CPC .............. *H01L 24/08* (2013.01); *H01L 24/05* (2013.01); *H01L 24/80* (2013.01); (Continued)

(58) Field of Classification Search
CPC ......... H01L 24/08; H01L 24/05; H01L 24/80; H01L 25/0652; H01L 25/0657; H01L 2224/05124; H01L 2224/08145
See application file for complete search history.

(56) References Cited

U.S. PATENT DOCUMENTS

| | | | |
|---|---|---|---|
| 8,883,561 B2 | 11/2014 | Park et al. | |
| 9,768,145 B2 * | 9/2017 | Yu ..................... | H01L 23/49838 |

(Continued)

FOREIGN PATENT DOCUMENTS

| | | |
|---|---|---|
| CN | 110504247 A | 11/2019 |
| CN | 112133691 A | 12/2020 |

(Continued)

*Primary Examiner* — Mamadou L Diallo
(74) *Attorney, Agent, or Firm* — Slater Matsil, LLP

(57) ABSTRACT

A semiconductor package includes a first semiconductor die, a second semiconductor die and a plurality of bumps. The first semiconductor die has a front side and a backside opposite to each other. The second semiconductor die is disposed at the backside of the first semiconductor die and electrically connected to first semiconductor die. The plurality of bumps is disposed at the front side of the first semiconductor die and physically connects first die pads of the first semiconductor die. A total width of the first semiconductor die may be less than a total width of the second semiconductor die.

20 Claims, 41 Drawing Sheets

Related U.S. Application Data continuation of application No. 17/315,487, filed on May 10, 2021, now Pat. No. 11,735,544.

(60) Provisional application No. 63/136,752, filed on Jan. 13, 2021.

(52) U.S. Cl.
CPC ...... *H01L 25/0652* (2013.01); *H01L 25/0657* (2013.01); *H01L 25/50* (2013.01); *H01L 2224/05124* (2013.01); *H01L 2224/08145* (2013.01); *H01L 2224/80895* (2013.01); *H01L 2224/80896* (2013.01); *H01L 2225/06541* (2013.01); *H01L 2225/06586* (2013.01); *H01L 2225/06589* (2013.01)

(56) References Cited

U.S. PATENT DOCUMENTS

| | | | | |
|---|---|---|---|---|
| 10,141,259 | B1 * | 11/2018 | Nakano | H01L 23/5226 |
| 10,510,629 | B2 | 12/2019 | Chen et al. | |
| 10,535,636 | B2 | 1/2020 | Hu et al. | |
| 10,879,214 | B2 | 12/2020 | Chen et al. | |
| 11,018,066 | B2 | 5/2021 | Chen et al. | |
| 11,114,383 | B2 * | 9/2021 | Kaeding | H01L 25/167 |
| 11,587,894 | B2 * | 2/2023 | Chen | H01L 21/76807 |
| 2014/0217604 | A1 | 8/2014 | Chou et al. | |
| 2015/0123278 | A1 * | 5/2015 | Park | H01L 24/03 |
| | | | | 257/774 |
| 2015/0380394 | A1 * | 12/2015 | Jang | H01L 24/92 |
| | | | | 438/108 |
| 2016/0155724 | A1 * | 6/2016 | Kim | H01L 21/6835 |
| | | | | 257/774 |
| 2017/0092626 | A1 | 3/2017 | Yuan et al. | |
| 2017/0170155 | A1 * | 6/2017 | Yu | H01L 25/50 |
| 2017/0200698 | A1 * | 7/2017 | Graf | H01L 23/495 |
| 2018/0005984 | A1 | 1/2018 | Yu et al. | |
| 2018/0102311 | A1 | 4/2018 | Shih | |
| 2018/0247915 | A1 * | 8/2018 | Kinsley | H01L 23/36 |
| 2018/0269188 | A1 * | 9/2018 | Yu | H01L 23/3128 |
| 2019/0355637 | A1 * | 11/2019 | Chen | H01L 21/56 |
| 2020/0006251 | A1 * | 1/2020 | Chen | H01L 23/5389 |
| 2020/0161277 | A1 * | 5/2020 | Lee | H01L 25/50 |
| 2020/0235073 | A1 * | 7/2020 | Chen | H01L 23/5383 |
| 2020/0251397 | A1 | 8/2020 | Lai et al. | |
| 2020/0381397 | A1 | 12/2020 | Yu et al. | |
| 2020/0402942 | A1 | 12/2020 | Chen et al. | |
| 2021/0028146 | A1 * | 1/2021 | Lee | H01L 21/565 |
| 2021/0125955 | A1 * | 4/2021 | Suh | H01L 24/27 |
| 2021/0134760 | A1 * | 5/2021 | Gaide | H01L 24/80 |
| 2021/0175199 | A1 * | 6/2021 | Song | H01L 25/16 |
| 2021/0202395 | A1 * | 7/2021 | Lu | H01L 24/13 |
| 2021/0327819 | A1 * | 10/2021 | Fang | H01L 24/05 |
| 2021/0384130 | A1 * | 12/2021 | Cheah | H01L 24/17 |
| 2021/0384137 | A1 * | 12/2021 | Choi | H01L 23/293 |
| 2022/0013441 | A1 * | 1/2022 | Liu | H01L 23/49811 |
| 2022/0013502 | A1 * | 1/2022 | Lee | H01L 23/5385 |
| 2022/0013503 | A1 * | 1/2022 | Jung | H01L 25/0657 |
| 2022/0068829 | A1 * | 3/2022 | Park | H01L 23/544 |
| 2022/0139880 | A1 * | 5/2022 | Lee | H01L 25/0657 |
| | | | | 257/621 |
| 2022/0157757 | A1 * | 5/2022 | Seok | H01L 25/105 |
| 2022/0181299 | A1 * | 6/2022 | Kim | H01L 23/3135 |
| 2022/0199539 | A1 * | 6/2022 | Karhade | H01L 25/0655 |
| 2022/0199562 | A1 * | 6/2022 | Waidhas | H01L 24/17 |
| 2022/0199575 | A1 * | 6/2022 | Karhade | H01L 24/17 |
| 2022/0208669 | A1 * | 6/2022 | Li | H01L 25/0655 |
| 2022/0238440 | A1 * | 7/2022 | Seidemann | H01L 21/76885 |
| 2022/0359449 | A1 | 11/2022 | Chen et al. | |

FOREIGN PATENT DOCUMENTS

| | | | |
|---|---|---|---|
| DE | 102016116088 | A1 | 6/2017 |
| KR | 20140099806 | A | 8/2014 |
| TW | 201814843 | A | 4/2018 |
| TW | 202034477 | A | 9/2020 |
| TW | 202044507 | A | 12/2020 |
| TW | 202044518 | A | 12/2020 |
| TW | 202101724 | A | 1/2021 |

* cited by examiner

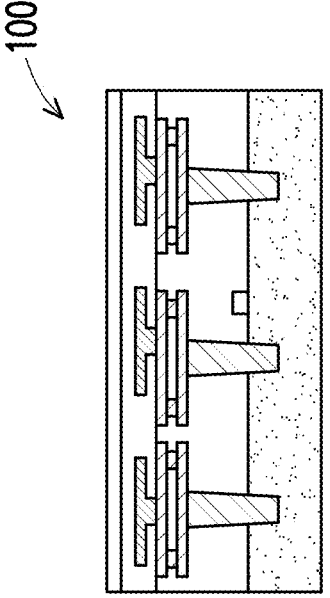
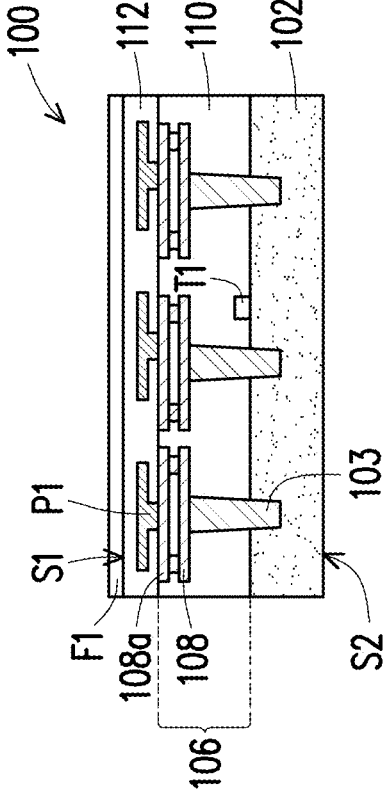
FIG. 1

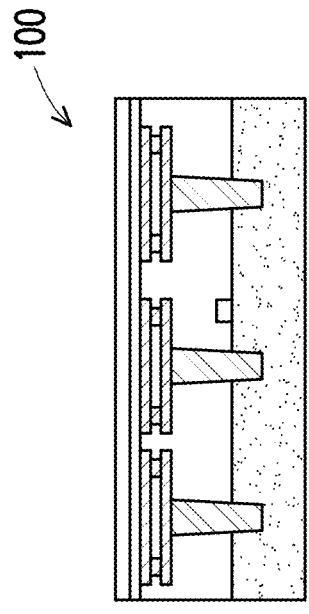
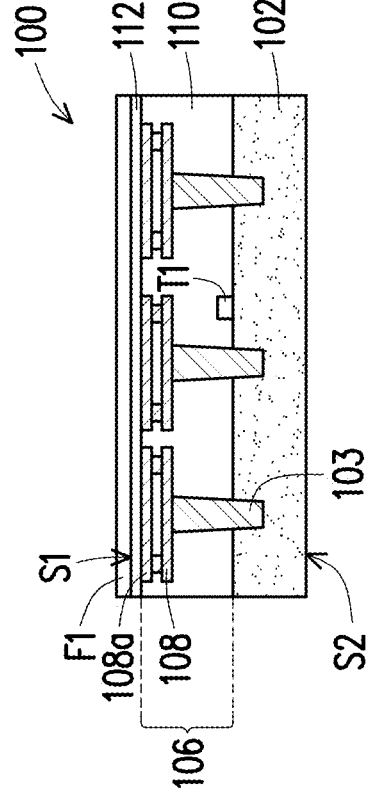
FIG. 12

120:BF1,BP11,BP12
220:BF2,BP21,BP22

120: BF1, BP11, BP12
220: BF2, BP21, BP22

120: BF1, BP11, BP12
220: BF2, BP21, BP22

120: BF1,BP11,BP12
220: BF2,BP21,BP22

120:BF1,BP11,BP12
220:BF2,BP21,BP22

120:BF1,BP11,BP12
220:BF2,BP21,BP22

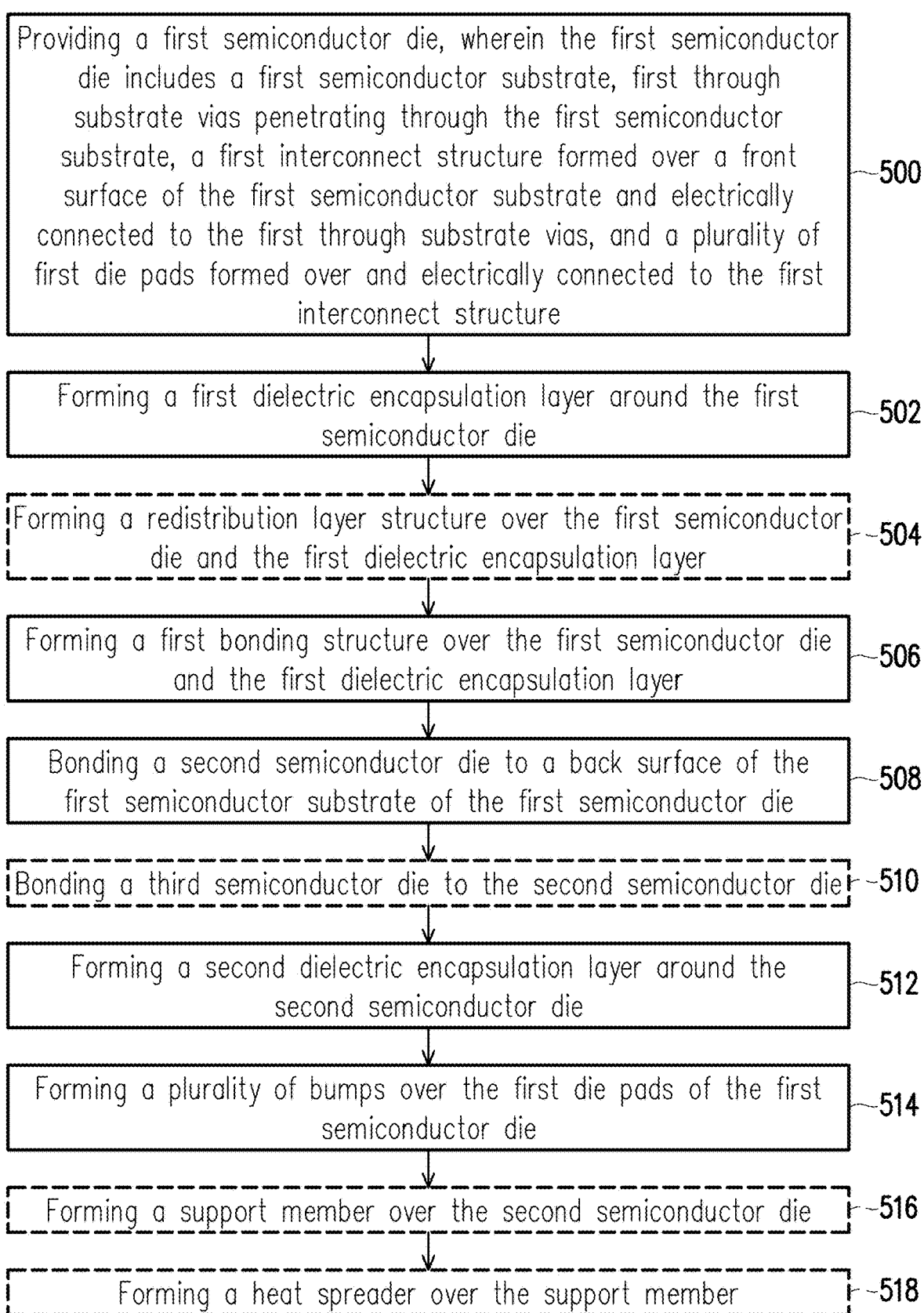

Providing a first semiconductor die, wherein the first semiconductor die includes a first semiconductor substrate, first through substrate vias penetrating through the first semiconductor substrate, a first interconnect structure formed over a front surface of the first semiconductor substrate and electrically connected to the first through substrate vias, and a plurality of first die pads formed over and electrically connected to the first interconnect structure ~500

Forming a first dielectric encapsulation layer around the first semiconductor die ~502

Forming a redistribution layer structure over the first semiconductor die and the first dielectric encapsulation layer ~504

Forming a first bonding structure over the first semiconductor die and the first dielectric encapsulation layer ~506

Bonding a second semiconductor die to a back surface of the first semiconductor substrate of the first semiconductor die ~508

Bonding a third semiconductor die to the second semiconductor die ~510

Forming a second dielectric encapsulation layer around the second semiconductor die ~512

Forming a plurality of bumps over the first die pads of the first semiconductor die ~514

Forming a support member over the second semiconductor die ~516

Forming a heat spreader over the support member ~518

FIG. 32

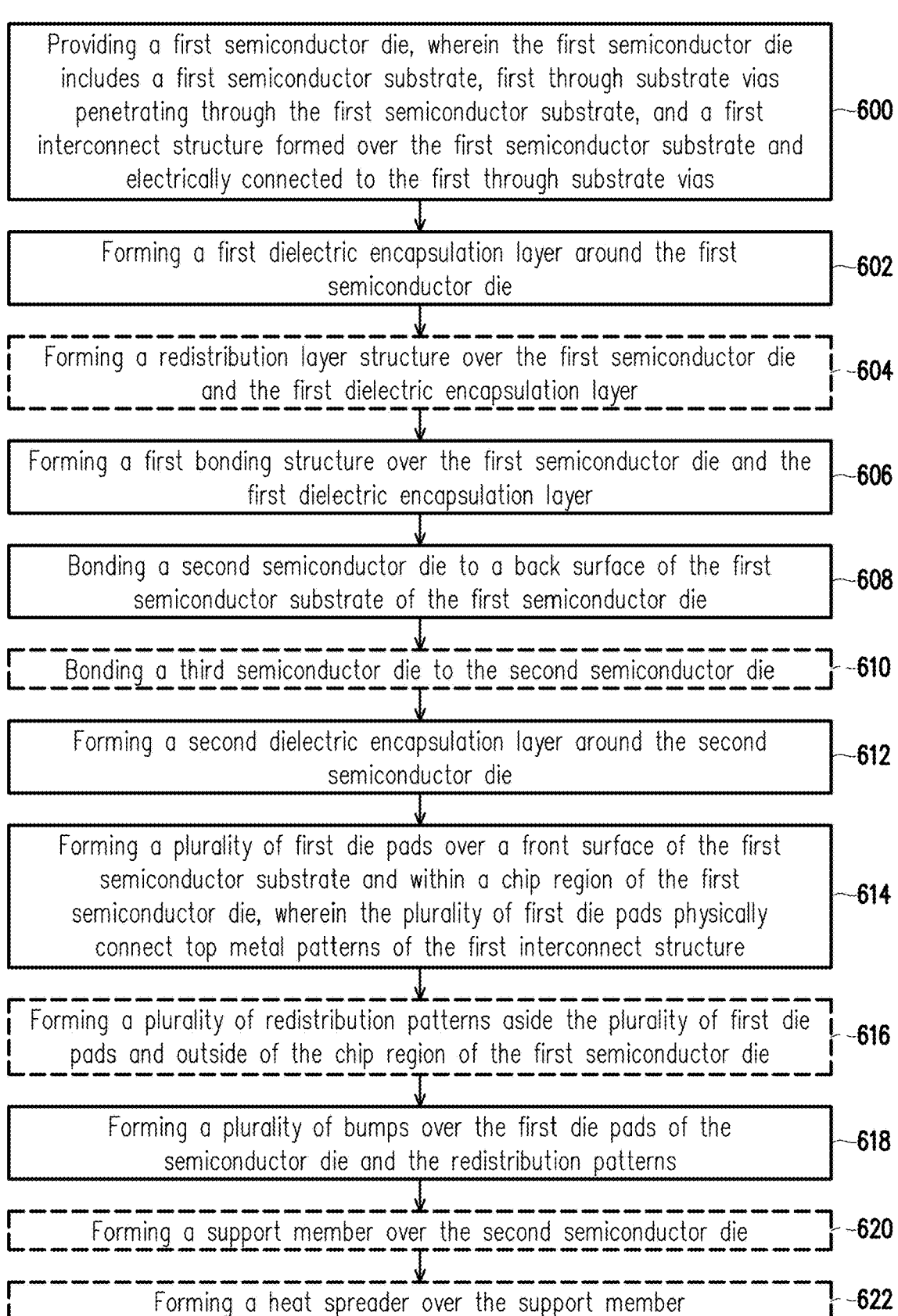

Providing a first semiconductor die, wherein the first semiconductor die includes a first semiconductor substrate, first through substrate vias penetrating through the first semiconductor substrate, and a first interconnect structure formed over the first semiconductor substrate and electrically connected to the first through substrate vias ~600

Forming a first dielectric encapsulation layer around the first semiconductor die ~602

Forming a redistribution layer structure over the first semiconductor die and the first dielectric encapsulation layer ~604

Forming a first bonding structure over the first semiconductor die and the first dielectric encapsulation layer ~606

Bonding a second semiconductor die to a back surface of the first semiconductor substrate of the first semiconductor die ~608

Bonding a third semiconductor die to the second semiconductor die ~610

Forming a second dielectric encapsulation layer around the second semiconductor die ~612

Forming a plurality of first die pads over a front surface of the first semiconductor substrate and within a chip region of the first semiconductor die, wherein the plurality of first die pads physically connect top metal patterns of the first interconnect structure ~614

Forming a plurality of redistribution patterns aside the plurality of first die pads and outside of the chip region of the first semiconductor die ~616

Forming a plurality of bumps over the first die pads of the semiconductor die and the redistribution patterns ~618

Forming a support member over the second semiconductor die ~620

Forming a heat spreader over the support member ~622

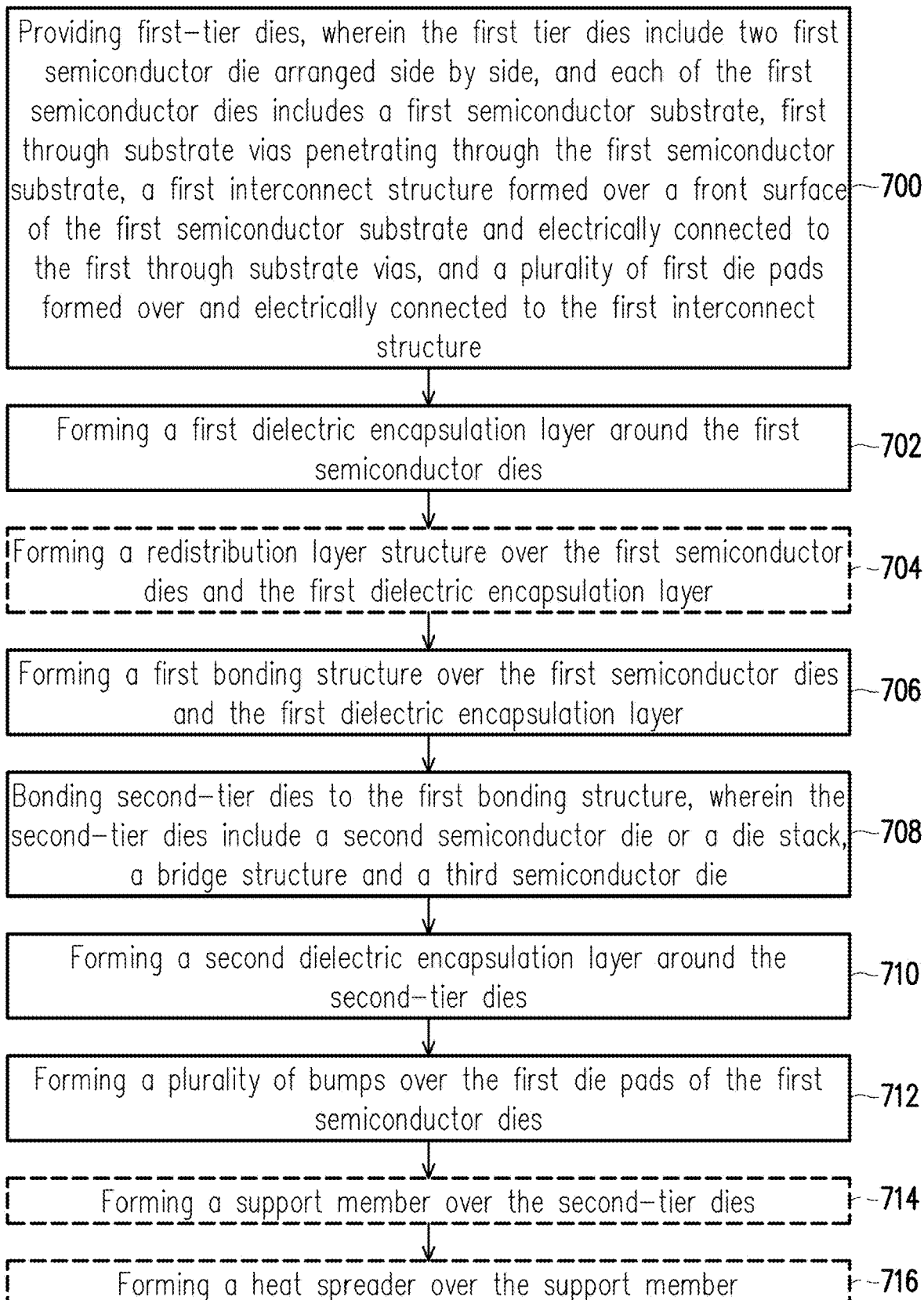

Providing first-tier dies, wherein the first tier dies include two first semiconductor die arranged side by side, and each of the first semiconductor dies includes a first semiconductor substrate, first through substrate vias penetrating through the first semiconductor substrate, a first interconnect structure formed over a front surface of the first semiconductor substrate and electrically connected to the first through substrate vias, and a plurality of first die pads formed over and electrically connected to the first interconnect structure ~700

Forming a first dielectric encapsulation layer around the first semiconductor dies ~702

Forming a redistribution layer structure over the first semiconductor dies and the first dielectric encapsulation layer ~704

Forming a first bonding structure over the first semiconductor dies and the first dielectric encapsulation layer ~706

Bonding second-tier dies to the first bonding structure, wherein the second-tier dies include a second semiconductor die or a die stack, a bridge structure and a third semiconductor die ~708

Forming a second dielectric encapsulation layer around the second-tier dies ~710

Forming a plurality of bumps over the first die pads of the first semiconductor dies ~712

Forming a support member over the second-tier dies ~714

Forming a heat spreader over the support member ~716

FIG. 40

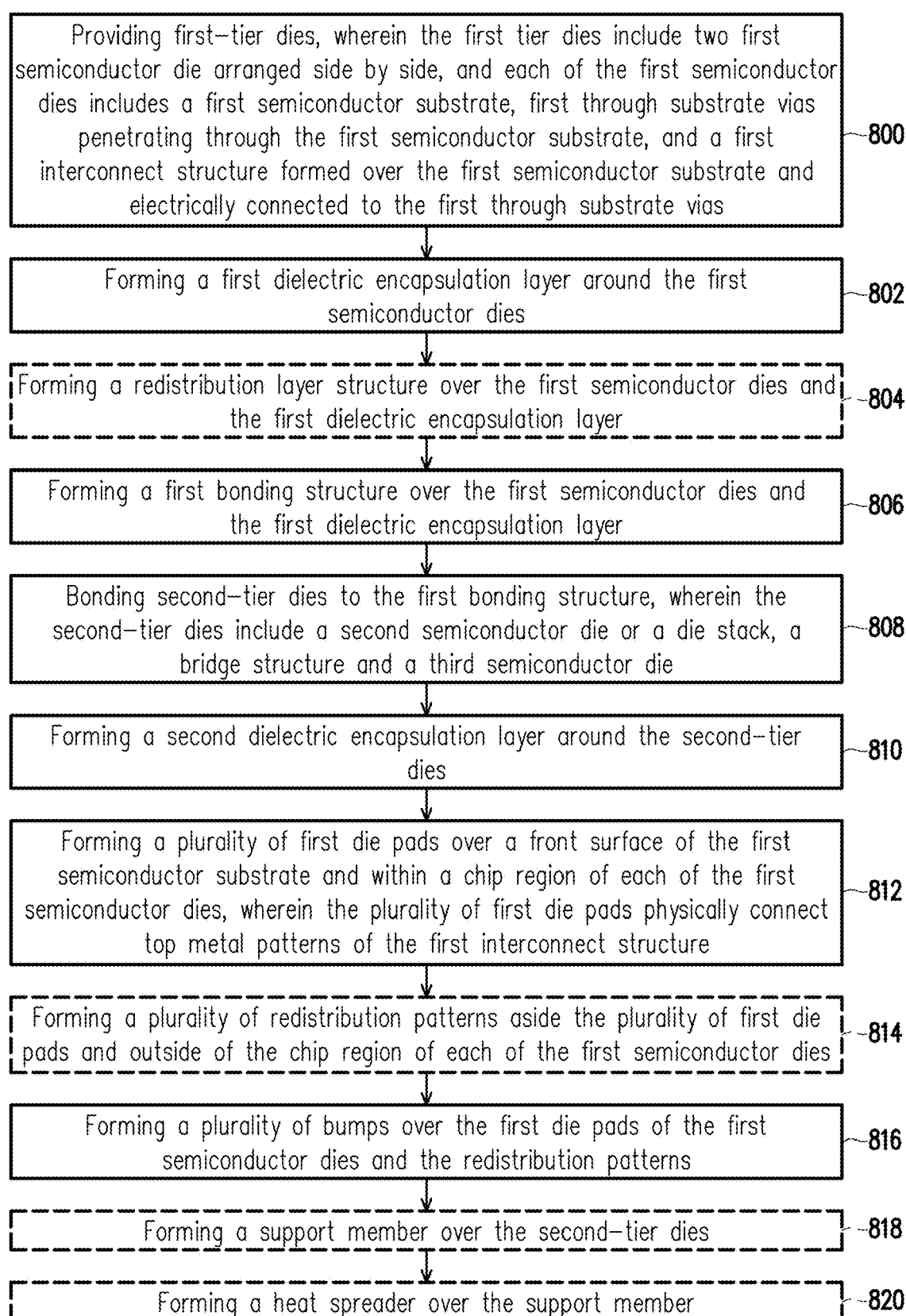

Providing first-tier dies, wherein the first tier dies include two first semiconductor die arranged side by side, and each of the first semiconductor dies includes a first semiconductor substrate, first through substrate vias penetrating through the first semiconductor substrate, and a first interconnect structure formed over the first semiconductor substrate and electrically connected to the first through substrate vias ─800

Forming a first dielectric encapsulation layer around the first semiconductor dies ─802

Forming a redistribution layer structure over the first semiconductor dies and the first dielectric encapsulation layer ─804

Forming a first bonding structure over the first semiconductor dies and the first dielectric encapsulation layer ─806

Bonding second-tier dies to the first bonding structure, wherein the second-tier dies include a second semiconductor die or a die stack, a bridge structure and a third semiconductor die ─808

Forming a second dielectric encapsulation layer around the second-tier dies ─810

Forming a plurality of first die pads over a front surface of the first semiconductor substrate and within a chip region of each of the first semiconductor dies, wherein the plurality of first die pads physically connect top metal patterns of the first interconnect structure ─812

Forming a plurality of redistribution patterns aside the plurality of first die pads and outside of the chip region of each of the first semiconductor dies ─814

Forming a plurality of bumps over the first die pads of the first semiconductor dies and the redistribution patterns ─816

Forming a support member over the second-tier dies ─818

Forming a heat spreader over the support member ─820

FIG. 41

SEMICONDUCTOR PACKAGES WITH STACKED DIES AND METHODS OF FORMING THE SAME

PRIORITY CLAIM

This application is a continuation of U.S. patent application Ser. No. 18/346,550, filed on Jul. 3, 2023, now U.S. Pat. No. 12,002,778, issued Jun. 4, 2024, entitled "Semiconductor Packages with Stacked Dies and Methods of Forming the Same," which is a continuation of U.S. patent application Ser. No. 17/315,487, filed on May 10, 2021, now U.S. Pat. No. 11,735,544 issued Aug. 22, 2023, entitled "Semiconductor Packages with Stacked Dies and Methods of Forming the Same," which claims the benefit of U.S. Provisional Application No. 63/136,752, filed on Jan. 13, 2021, entitled "Novel SoIC F2B with Mold Scheme," each application is hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, semiconductor packages (e.g., System-on-Integrated-Circuit (SoIC) components) are becoming increasingly popular for their multi-functions and compactness. However, there are challenges related to such semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 10 are cross-sectional views schematically illustrating a method of forming a semiconductor package in accordance with some embodiments of the present disclosure.

FIG. 12 to FIG. 21 are cross-sectional views schematically illustrating a method of forming a semiconductor package in accordance with other embodiments of the present disclosure.

FIG. 32 illustrates a method of forming a semiconductor package in accordance with some embodiments.

FIG. 33 illustrates a method of forming a semiconductor package in accordance with other embodiments.

FIG. 40 illustrates a method of forming a semiconductor package in accordance with some embodiments.

FIG. 41 illustrates a method of forming a semiconductor package in accordance with other embodiments.

DETAILED DESCRIPTION

Figure 2:
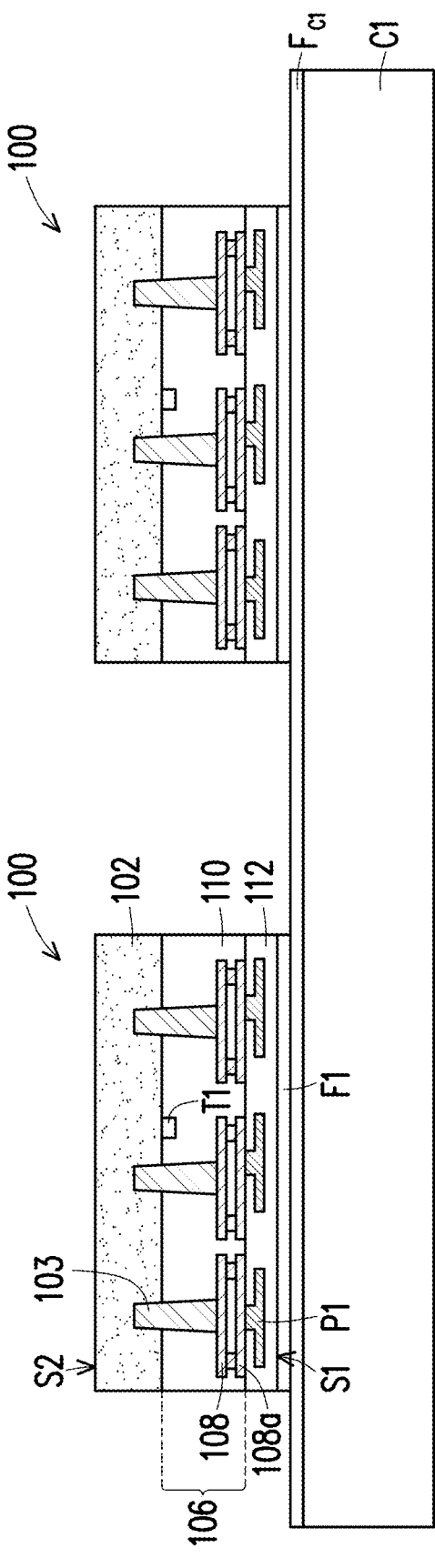

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, when two semiconductor dies with different sizes are provided, the smaller semiconductor die is configured to face a ball array, and the greater semiconductor die is configured to face away the ball array. By such configuration, the signal transmission performance of the semiconductor package can be significantly improved.

FIG. 1 to FIG. 10 are cross-sectional views schematically illustrating a method of forming a semiconductor package in accordance with some embodiments of the present disclosure. It is understood that the disclosure is not limited by the method described below. Additional operations can be provided before, during, and/or after the method and some of the operations described below can be replaced or eliminated, for additional embodiments of the methods. Although FIG. 1 to FIG. 10 are described in relation to a method, it is appreciated that the structures disclosed in FIG. 1 to FIG. 10 are not limited to such a method, but instead may stand alone as structures independent of the method.

Referring to FIG. 1, multiple semiconductor dies 100 (e.g., logic dies, memory dies, or the like) are provided. In FIG. 1, only two semiconductor dies 100 are illustrated; however, the number of the semiconductor dies 100 is not limited by the disclosure. In some embodiments, each of the semiconductor dies 100 includes active front side S1 (e.g., front surface) and a backside S2 (e.g., back surface) opposite to the front side S1. In some embodiments, the semiconductor die 100 includes a semiconductor substrate 102, at least one device T1, an interconnect structure 106, die pads P1, and a passivation layer 112. Throughout the description, the side of the semiconductor die 100 corresponding to the side of the semiconductor substrate having a device or active layer is referred to as the front side.

The semiconductor substrate 102 may include an elementary semiconductor such as silicon, germanium and/or a compound semiconductor such as silicon germanium, silicon carbide, gallium arsenic, indium arsenide, gallium nitride or indium phosphide. In some embodiments, the semiconductor substrate 102 may take the form of a planar substrate, a substrate with multiple fins, nanowires, or other forms. The semiconductor die 100 may further include through substrate vias (TSVs) 103 formed in the semiconductor substrate 102 and electrically connected to interconnect wirings or lines of the interconnect structure 106. As illustrated in FIG. 1, the through substrate vias 103 are embedded in the semiconductor substrate 102 and the interconnect structure 106, and the through substrate vias 103 are not revealed from the back surface of the semiconductor substrate 102 at this stage. The through substrate vias 103 may include Cu, Ti, Ta, W, Ru, Co, Ni, the like, an alloy thereof, or a combination thereof. In some embodiments, the through substrate vias 103 are formed by an electroplating process and may comprise one or more layers, such as barrier layers, adhesion layers, fill material, and/or the like.

The device T1 is disposed on/in the semiconductor substrate 102 and includes one or more functional devices. The functional devices may include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the semiconductor die 100 may be referred to as a "first device die," "first-tier semiconductor die," or "lower integrated circuit structure."

The interconnect structure 106 is formed on the semiconductor substrate 102 and electrically connected to the device T1. The interconnect structure 106 may include one or more dielectric layers, collectively referred to as the dielectric layer 110, and metal features 108 embedded in the at least one dielectric layer 110. The metal features 108 are disposed in the dielectric layer 110 and electrically connected with each other. A portion of the metal features 108, such as first top metal features 108a, are exposed by the dielectric layer 110. In some embodiments, the dielectric layer 110 includes an inter-layer dielectric (ILD) layer on the semiconductor substrate 102, and at least one inter-metal dielectric (IMD) layer over the inter-layer dielectric layer. In some embodiments, the dielectric layer 110 includes silicon oxide, silicon oxynitride, silicon nitride, a low dielectric constant (low-k) material or a combination thereof. The dielectric layer 110 may be a single layer or a multiple-layer structure. In some embodiments, the metal features 108 include metal plugs and metal lines. The plugs may include contacts formed in the inter-layer dielectric layer, and vias formed in the inter-metal dielectric layer. The contacts are formed between and in contact with a bottom metal line and the underlying device T1. The vias are formed between and in contact with two metal lines. The metal features 108 may include Cu, Ti, Ta, W, Ru, Co, Ni, the like, an alloy thereof, or a combination thereof. In some embodiments, a barrier layer may be disposed between each metal feature 108 and the dielectric layer 110 to prevent the material of the metal feature 108 from migrating to the underlying device T1. The barrier layer includes Ta, TaN, Ti, TiN, CoW, the like, or a combination thereof, for example. In some embodiments, the interconnect structure 106 is formed by a dual damascene process. In other embodiments, the interconnect structure 106 is formed by multiple single damascene processes. In other embodiments, the interconnect structure 106 is formed by an electroplating process.

The die pads P1 are formed over and electrically connected to the interconnect structure 106. In some embodiments, the die pads P1 are in physical contact with the topmost metal feature 108a of the interconnect structure 106. In some embodiments, the die pads P1 are aluminum pads. However, the disclosure is not limited thereto. In other embodiments, the dies pads P1 are copper pads, nickel pads or pads made by other suitable materials. Each of the die pads P1 may be a single layer or a multiple-layer structure. In some embodiments, some of the die pads P1 have probe marks on the top surfaces thereof. The semiconductor die 100 may be referred to as a "known good die" after passing testing. In some embodiments, the die pads P1 are free of probe marks. In some embodiments, the die pads P1 are formed by a sputtering process, a deposition process, an electroplating process, a combination thereof, or the like.

The passivation layer 112 is formed over the interconnect structure 106 and covers the sidewalls and top surfaces of the die pads P1. In some embodiments, the passivation layer 112 includes silicon oxide, silicon nitride, benzocyclobutene (BCB) polymer, polyimide (PI), polybenzoxazole (PBO) a combination thereof, or the like, and is formed by a suitable process such as spin coating, CVD or the like.

In some embodiments, the passivation layer 112 of the semiconductor die 100 is covered by the bonding film F1. In some embodiments, the bonding film F1 includes silicon (Si), silicon oxide ($SiO_x$, where x>0), silicon nitride ($SiN_x$, where x>0), silicon oxynitride ($SiO_x N_y$, where x>0 and y>0) or other suitable bonding materials.

Referring to FIG. 2, a carrier C1 including a bonding film $F_{C1}$ thereon is provided. The carrier C1 may be a semiconductor wafer such as a silicon wafer, and the bonding film $F_{C1}$ may be a bonding layer prepared for fusion bond. In some embodiments, the bonding film $F_{C1}$ is a deposited layer formed over the top surface of the carrier C1. In other embodiments, the bonding film $F_{C1}$ is a portion of the carrier C1 for fusion bond. In some embodiments, the bonding film $F_{C1}$ includes silicon (Si), silicon oxide ($SiO_x$, where x>0), silicon nitride ($SiN_x$, where x>0), silicon oxynitride ($SiO_xN_y$, where x>0 and y>0) or other suitable bonding materials. In some embodiments, the bonding film $F_{C1}$ and the bonding film F1 include the same material such as silicon oxide. In other embodiments, the bonding film $F_{C1}$ and the bonding film F1 include different materials.

The semiconductor dies 100 are turned over and placed on the carrier C1 such that the bonding films F1 are in contact with the bonding film $F_{C1}$. Specifically, multiple semiconductor dies 100 are picked-up and placed on the bonding film $F_{C1}$ in a side-by-side manner, such that semiconductor dies 100 are arranged in array and spaced apart from each other. In some embodiments, the semiconductor die 100 is placed on the top surface of the bonding film $F_{C1}$, such that the front sides S1 of the semiconductor dies 100 face the bonding film $F_{C1}$ of the carrier C1.

After the semiconductor dies 100 are picked up and placed on the bonding film $F_{C1}$, a chip-to-wafer fusion bonding process may be performed such that a fusion bonding interface is formed between the bonding film $F_{C1}$ and the bonding film F1. For example, the fusion bonding process for bonding the bonding film $F_{C1}$ and the bonding film F1 is performed at temperature ranging from about 100 Celsius degree to about 290 Celsius degree. The bonding film $F_{C1}$ may be directly bonded to the bonding film F1. In other words, there is no intermediate layer formed between the bonding film $F_{C1}$ and the bonding film F1. The above-mentioned fusion bonding interface formed between the bonding film $F_{C1}$ and the bonding film F1 may be a Si—Si fusion bonding interface, a Si—SiO$_x$ fusion bonding interface, a SiO$_x$—SiO$_x$ fusion bonding interface, a SiO$_x$—SiN$_x$ fusion bonding interface or other suitable fusion bonding interface.

Figure 3:
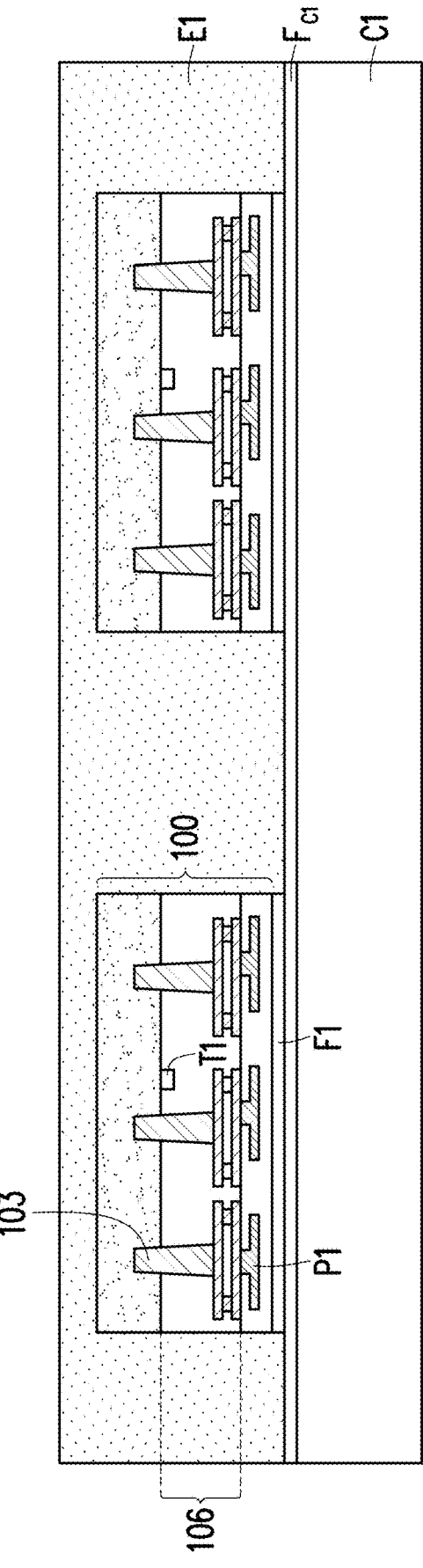

Referring to FIG. 3, after the semiconductor dies 100 are bonded to the carrier C1 through the bonding film $F_{C1}$ and the bonding films F1, a dielectric encapsulation layer E1 is formed over the carrier C1 and covers the semiconductor dies 100. In some embodiments, the dielectric encapsulation layer E1 is formed by an over-molding process or a film deposition process such that a portion of the top surface of the bonding film $F_{C1}$, side surfaces of the bonding film F1, and back surfaces and side surfaces of the semiconductor dies 100 are encapsulated by the dielectric encapsulation layer E1. In some embodiments, the dielectric encapsulation layer E1 includes a molding compound, a molding underfill, a resin, combinations thereof, or the like. In some embodiments, the dielectric encapsulation layer E1 includes a polymer material such as polybenzoxazole (PBO), polyimide, benzocyclobutene (BCB), a combination thereof, or the like. In some embodiments, the dielectric encapsulation layer E1 includes an insulating material, such as silicon oxide, silicon nitride or a combination thereof.

Figure 4:
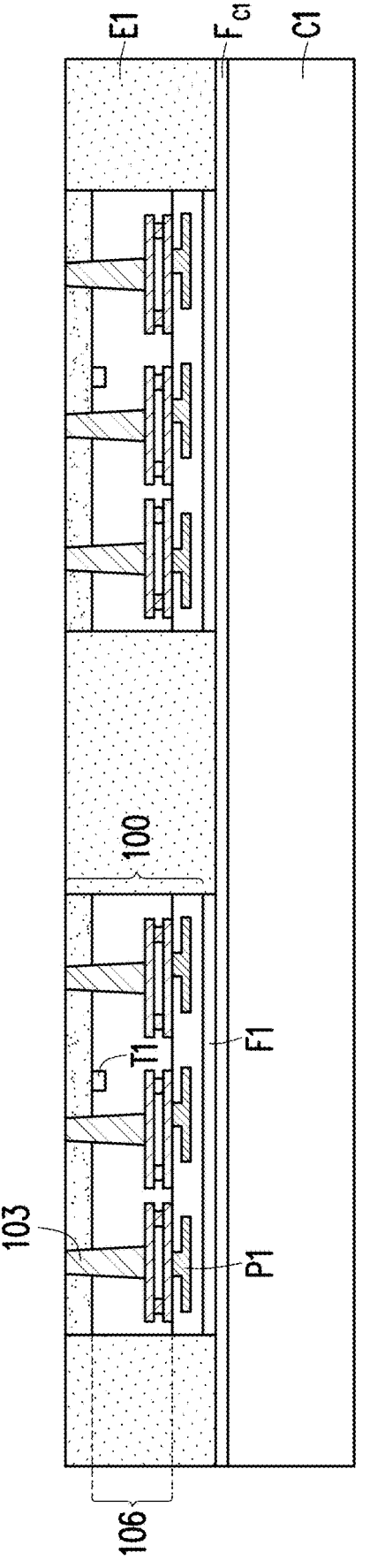

Referring to FIG. 4, after performing the over-molding process or film deposition process, a grinding process or a planarization process may be performed to reduce the thickness of the encapsulation material and the thickness of the semiconductor dies 100 until the through substrate vias 103 are exposed. In some embodiments, the grinding process includes a mechanical grinding process, a chemical mechanical polishing (CMP) process, or a combination thereof.

As illustrated in FIG. 4, in some embodiments, the thickness of the semiconductor die 100 is equal to the thickness of the dielectric encapsulation layer E1. In some embodiments, the dielectric encapsulation layer E1 is in contact with the side surfaces of the semiconductor dies 100 and the bonding films F1, and back surfaces of the semiconductor substrates 102 are accessibly revealed from the dielectric encapsulation layer E1. In other words, the top surface of the dielectric encapsulation layer E1 is substantially level, within process variations, with the exposed surfaces of the semiconductor dies 100. However, the disclosure is not limited thereto. In some embodiments, the top surface of the dielectric encapsulation layer E1 may be slightly higher than or slightly lower than the exposed surfaces of the semiconductor dies 100 due to polishing selectivity of the grinding process.

Figure 5:
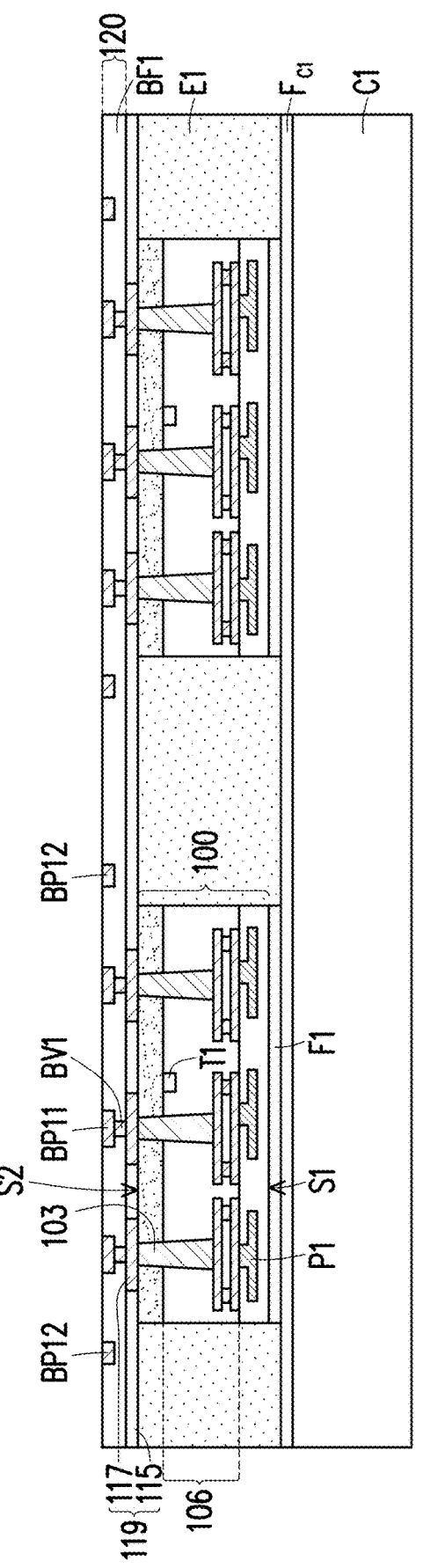

Referring to FIG. 5, a redistribution layer structure 119 is formed over the backsides S2 of the semiconductor dies 100 and the exposed surface of the dielectric encapsulation layer E1. The redistribution layer structure 119 includes at least one polymer layer 115 and conductive features 117 embedded by the polymer layer 115. The conductive features 117 include metal pads, metal lines and/or metal vias configured to electrically connect to different components. In some embodiments, the polymer layer 115 includes a photosensitive material such as polybenzoxazole (PBO), polyimide (PI), benzocyclobutene (BCB), a combination thereof or the like. The polymer layer 115 of the redistribution layer structure 119 may be replaced by a dielectric layer or an insulating layer as needed. In some embodiments, the conductive features 117 includes Cu, Ti, Ta, W, Ru, Co, Ni, the like, an alloy thereof, a combination thereof, or the like. In some embodiments, a seed layer and/or a barrier layer may be disposed between each conductive feature 117 and the polymer layer 115. The seed layer may include Ti/Cu. The barrier layer may include Ta, TaN, Ti, TiN, CoW, a combination thereof, or the like.

Still referring to FIG. 5, a bonding structure 120 is formed over the redistribution layer structure 119. The bonding structure 120 is referred to a "blanket bonding structure" in some examples, because the bonding structure 120 is formed across the semiconductor dies 100 and extends between and beyond the semiconductor dies 100.

In some embodiments, the bonding structure 120 includes at least one bonding film BF1 and bonding metal features embedded in the bonding film BF1. In some embodiments, the bonding film BF1 includes an insulating material, a dielectric material, a polymer material or a combination thereof. For example, the bonding film BF1 includes silicon (Si), silicon oxide (SiO$_x$, where x>0), silicon nitride (SiN$_x$, where x>0), silicon oxynitride (SiO$_x$ N$_y$, where x>0 and y>0) or other suitable bonding materials. The bonding metal features may include Cu, Ti, Ta, W, Ru, Co, Ni, an alloy thereof, a combination thereof, or the like. In some embodiments, a seed layer and/or a barrier layer may be disposed between each bonding metal feature and the bonding film BF1. The seed layer may include Ti/Cu. The barrier layer may include Ta, TaN, Ti, TiN, CoW or a combination thereof. In some embodiments, the bonding metal features include bonding pads BP11 and BP12, and bonding vias BV1. Specifically, as shown in FIG. 5, the bonding pads BP11 and the bonding vias BV1 are configured to bond to and electrically connected to the underlying semiconductor dies 100 and the overlying semiconductor die or die stack. In some embodiments, the bonding vias BV1 are in physical contact with the through substrate vias 103 and bonding pads BP11. Besides, the bonding pads BP12 are configured to bond to the underlying semiconductor dies 100 and the overlying semiconductor die or die stack, but are electrically insulated from the underlying semiconductor dies 100 and the overlying semiconductor die or die stack. The bonding pads BP12 are referred to "dummy bonding pads" or "floating bonding pads" in some examples because they are provided to merely enhance the bonding strength between dies. In some embodiments, the sizes (e.g., widths) of the bonding pads BP11 and BP12 are different, as shown in FIG. 5. However, the disclosure is not limited thereto. In other embodiments, the bonding pads BP11 and BP12 can have the same size.

Figure 6:
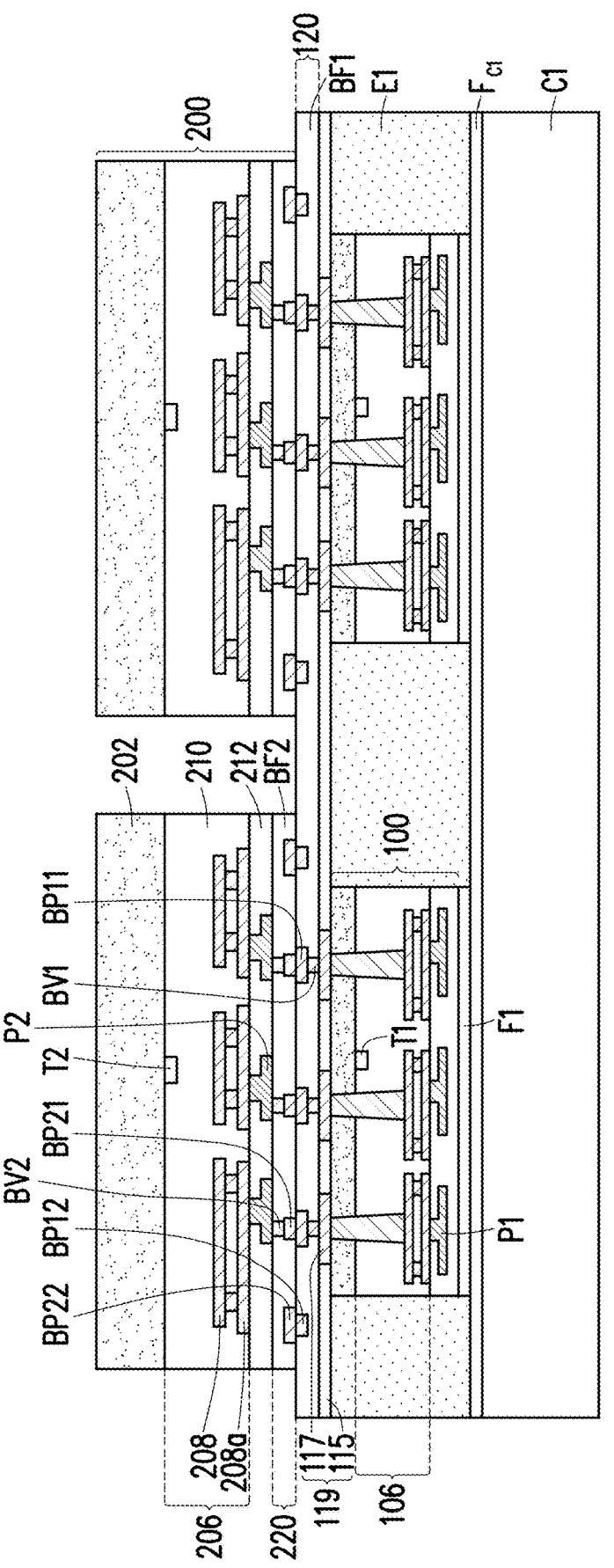

Referring to FIG. 6, multiple semiconductor dies 200 (e.g., memory dies, logic dies or other suitable dies) are provided and placed on the bonding structure 120. In FIG. 4, two semiconductor dies 200 are illustrated; however, the number of the semiconductor dies 200 is not limited by the disclosure. In some embodiments, the semiconductor dies 200 correspond to the underlying semiconductor dies 100, respectively. The semiconductor dies 200 and the semiconductor dies 100 may be the same type or different types of dies.

In some embodiments, each of the semiconductor dies 200 includes active front side (e.g., front surface) and a backside (e.g., back surface) opposite to the active side. In some embodiments, each of the semiconductor dies 200 includes a semiconductor substrate 202, at least one device T2, an interconnect structure 206, die pads P2, and a passivation layer 212. Throughout the description, the side of the semiconductor die 200 corresponding to the side of the semiconductor substrate having a device or active layer is referred to as a front side.

The semiconductor substrate 202 may include an elementary semiconductor such as silicon, germanium and/or a compound semiconductor such as silicon germanium, silicon carbide, gallium arsenic, indium arsenide, gallium nitride or indium phosphide. In some embodiments, the semiconductor substrate 202 may take the form of a planar substrate, a substrate with multiple fins, nanowires, or other forms known to people having ordinary skill in the art. If needed, the semiconductor die 200 may further include through substrate vias (TSVs) (not shown) formed in the semiconductor substrate 202 and electrically connected to interconnect wirings or lines of the interconnect structure 206.

The device T2 is disposed on/in the semiconductor substrate 202 and includes one or more functional devices. The functional devices may include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the semiconductor die 200 is referred to as a "second device die," "second-tier semiconductor die," or "upper integrated circuit structure." In some embodiments, the upper integrated circuit structure may be replaced by a die stack including multiple dies.

The interconnect structure 206 is formed on the semiconductor substrate 202 and electrically connected to the device T2. The interconnect structure 206 may include one or more dielectric layers, collectively referred to as a dielectric layer 210, and metal features 208 embedded by the dielectric layer 210. The metal features 208 are disposed in the dielectric layer 210 and electrically connected with each other. A portion of the metal features 208, such as top metal features 208a, are exposed by the dielectric layer 210. In some embodiments, the dielectric layer 210 includes an inter-layer dielectric (ILD) layer on the semiconductor substrate 202, and at least one inter-metal dielectric (IMD) layer over the inter-layer dielectric layer. In some embodiments, the dielectric layer 210 includes silicon oxide, silicon oxynitride, silicon nitride, a low dielectric constant (low-k) material, a combination thereof, or the like. The dielectric layer 210 may be a single layer or a multiple-layer structure. In some embodiments, the metal features 208 include metal plugs and metal lines. The plugs may include contacts formed in the inter-layer dielectric layer, and vias formed in the inter-metal dielectric layer. The contacts are formed between and in contact with a bottom metal line and the underlying device T2. The vias are formed between and in contact with two metal lines. The metal features 208 may include Cu, Ti, Ta, W, Ru, Co, Ni, an alloy thereof, a combination thereof, or the like. In some embodiments, a barrier layer may be disposed between each metal feature 208 and the dielectric layer 210 to prevent the material of the metal feature 208 from migrating to the underlying device T2. The barrier layer includes Ta, TaN, Ti, TiN, CoW, a combination thereof, or the like, for example. In some embodiments, the interconnect structure 206 is formed by a dual damascene process. In other embodiments, the interconnect structure 206 is formed by multiple single damascene processes. In other embodiments, the interconnect structure 206 is formed by an electroplating process.

The die pads P2 are formed over and electrically connected to the interconnect structure 206. In some embodiments, the die pads P2 are in physical contact with the topmost metal feature 208a of the interconnect structure 206. In some embodiments, the die pads P2 are aluminum pads. However, the disclosure is not limited thereto. In other embodiments, the dies pads P2 are copper pads, nickel pads or pads made by other suitable materials. Each of the die pads P2 may be a single layer or a multiple-layer structure. In some embodiments, some of the die pads P2 have probe marks on the top surfaces thereof. The semiconductor die 200 may be referred to as a "known good die" after acceptance testing. In some embodiments, the die pads P2 are free of probe marks.

The passivation layer 212 is formed over the interconnect structure 206, encapsulates the sidewalls of the die pads P2 but exposed the top surfaces of the die pads P2. In some embodiments, the passivation layer 212 includes silicon oxide, silicon nitride, benzocyclobutene (BCB) polymer, polyimide (PI), polybenzoxazole (PBO) or a combination thereof, and is formed by a suitable process such as spin coating, CVD or the like.

In some embodiments, a bonding structure 220 is further provided over the interconnect structure 206. In some embodiments, the bonding structure 220 is regarded as part of the semiconductor die 200. The bonding structure 220 is referred to a "die bonding structure" in some examples, because the edge of the bonding structure 220 is aligned with the edge of the semiconductor die 200.

In some embodiments, the bonding structure 220 includes at least one bonding film BF2 and bonding metal features embedded in the bonding film BF2. In some embodiments, the bonding film BF2 includes an insulating material, a dielectric material, a polymer material or a combination thereof. For example, the bonding film BF2 includes silicon (Si), silicon oxide ($SiO_x$, where x>0), silicon nitride ($SiN_x$, where x>0), silicon oxynitride ($SiO_x N_y$, where x>0 and y>0) or other suitable bonding materials. The bonding metal features may include Cu, Ti, Ta, W, Ru, Co, Ni, an alloy thereof, a combination thereof, or the like. In some embodiments, a seed layer and/or a barrier layer may be disposed between each bonding metal feature and the bonding film BF2. The seed layer may include Ti/Cu. The barrier layer may include Ta, TaN, Ti, TiN, CoW, a combination thereof, or the like. In some embodiments, the bonding metal features include bonding pads BP21 and BP22, and bonding vias BV2. As shown in FIG. 6, the bonding pads BP21 and the bonding vias BV2 are configured to bond to and electrically connected to the underlying semiconductor dies 100. In some embodiments, the bonding vias BV2 are in physical contact with the die pads P2 and bonding pads BP21. The bonding pads BP22 are configured to bond to the underlying semiconductor dies 100, but are electrically insulated from the underlying semiconductor dies 100 and the overlying semiconductor die 200. The bonding pads BP22 are referred to "dummy bonding pads" or "floating bonding pads" in some examples because they are provided to merely enhance the bonding strength between dies. In some embodiments, the sizes (e.g., widths) of the bonding pads BP21 and BP22 are different, as shown in FIG. 6. However, the disclosure is not limited thereto and in some embodiments, the bonding pads BP21 and BP22 can have the same size.

In some embodiments, the bonding structures 220 are aligned with the bonding structure 120, a chip-to-wafer hybrid bonding is performed such that the bonding structure 220 of the semiconductor die 200 is hybrid bonded to the bonding structure 120. In some embodiments, the semiconductor die 200 and the semiconductor die 100 may be bonded through a face-to-back hybrid bonding process.

However, the disclosure is not limited thereto. In some embodiments, the semiconductor die 200 and the semiconductor die 100 may be bonded through a face-to-face hybrid bonding process.

FIG. 6 illustrates an embodiment in which the semiconductor die 200 and the semiconductor die 100 are different sizes. The size of the semiconductor die 200 is different from (e.g., larger than) the size of the semiconductor die 100. Herein, the term "size" is refers to a height, a length, a width, a top-view area or a combination thereof. For example, from a top view, the size or area of the semiconductor die 100 is less than the size or area of the semiconductor die 200.

In some embodiments, the semiconductor die 200 and the semiconductor die 100 may differ in the die height. For example, the height of the semiconductor die 200 is different from (e.g., larger than) the critical dimension of the semiconductor die 100. For example, the height of the semiconductor die 200 ranges from about 20 to 775 um, and the height of the semiconductor die 100 ranges from about 10 to 50 um. In some embodiments, the ratio of the height of the semiconductor die 200 to the height of the semiconductor die 100 ranges from 30:1 to 15:1, such as 20:1.

In some embodiments, the semiconductor die 200 and the semiconductor die 100 may differ in the critical dimension. For example, the critical dimension of the semiconductor die 200 is different from (e.g., larger than) the critical dimension of the semiconductor die 100. Herein, the term "critical dimension" is referred to as the smallest achievable dimension for an IC feature. For example, the critical dimension includes the minimum line width of a metal line or the minimum width of an opening.

In some embodiments, to facilitate chip-to-wafer hybrid bonding between the bonding structure 120 and the bonding structure 220, surface preparation for bonding surfaces of the bonding structure 120 and the bonding structure 220 is performed. The surface preparation may include surface cleaning and activation, for example. Surface cleaning may be performed on the bonding surfaces of the bonding structure 120 and the bonding structure 220 to remove particles and/or native oxides on bonding surfaces of the bonding pads and bonding films. The bonding surfaces of the bonding structures 120 and the bonding structure 220 are cleaned by wet cleaning, for example.

After cleaning the bonding surfaces of the bonding structures 120 and the bonding structure 220, activation of the top surfaces may be performed for development of high bonding strength. In some embodiments, plasma activation is performed to treat and activate the bonding surfaces of the bonding films BF1 and BF2. When the activated bonding surface of the bonding film BF1 is in contact with the activated bonding surface of the bonding film BF2, the bonding films BF1 and BF2 are pre-bonded. The bonding structure 220 and the bonding structure 120 are pre-bonded through a pre-bonding of the bonding films BF1 and BF2. After the pre-bonding of the bonding films BF1 and BF2, the bonding pads BP11 are in contact with the bonding pads BP21, and the bonding pads BP12 are in contact with the bonding pads BP22.

After the pre-bonding process of the bonding films BF1 and BF2, a hybrid bonding of the semiconductor die 200 and the bonding structure 120 is performed. The hybrid bonding of the semiconductor die 200 and the bonding structure 120 may include a treatment for dielectric bonding and a thermal annealing for conductor bonding. The treatment for dielectric bonding is performed to strengthen the bonding between the bonding films BF1 and BF2. The treatment for dielectric bonding may be performed at temperature ranging from about 100 Celsius degree to about 150 Celsius degree, for example. After performing the treatment for dielectric bonding, the thermal annealing for conductor bonding is performed to facilitate the bonding between the bonding pads BP11 and BP21 and between the bonding pads BP12 and BP22. The thermal annealing for conductor bonding may be performed at temperature ranging from about 300 Celsius degree to about 400 Celsius degree, for example. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the bonding pads BP11 and BP21 and between the bonding pads BP12 and BP22. The conductor bonding is not limited to the pad-to-pad bonding. Via-to-via bonding or via-to-pad bonding may be applied as needed.

Figure 7:
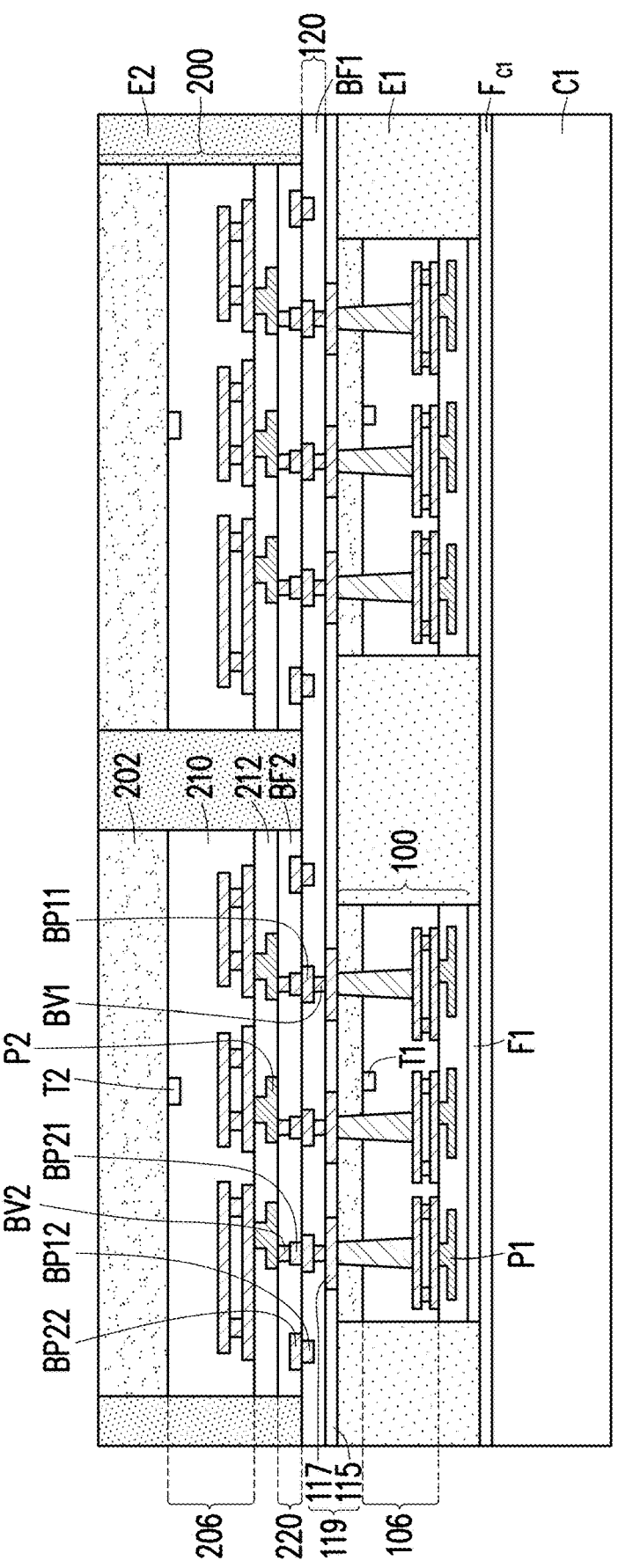

Referring to FIG. 7, after the semiconductor dies 200 are bonded to the semiconductor dies 100 through the bonding structure 120 and the bonding structure 220, a dielectric encapsulation layer E2 is formed to cover the bonding structure 120, the bonding structure 220, and the semiconductor dies 200. In some embodiments, the dielectric encapsulation layer E2 is formed by an over-molding process or a film deposition process such that a portion of the top surface of the bonding structure 120, side surfaces of the bonding structure 220, and back surfaces and side surfaces of the semiconductor dies 200 are encapsulated by the dielectric encapsulation layer E2. In some embodiments, the dielectric encapsulation layer E2 includes a molding compound, a molding underfill, a resin or the like. In some embodiments, the dielectric encapsulation layer E2 includes a polymer material (such as polybenzoxazole (PBO), polyimide, benzocyclobutene (BCB), a combination thereof, or the like), an insulating material (such as silicon oxide, silicon nitride, a combination thereof, or the like), combinations thereof, or the like.

After performing the over-molding process or film deposition process, a grinding process or a planarization process may be performed to reduce the thickness of the encapsulation material and the thickness of the semiconductor dies 200 until the back surfaces of the semiconductor dies 200 are exposed. In some embodiments, the grinding process includes a mechanical grinding process, a chemical mechanical polishing (CMP) process, or a combination thereof.

As illustrated in FIG. 7, in some embodiments, the thickness of the semiconductor dies 200 is equal to the thickness of the dielectric encapsulation layer E2. In some embodiments, the dielectric encapsulation layer E2 is in contact with the side surfaces of the semiconductor dies 200 and the bonding films BF2, and back surfaces of the semiconductor substrates 202 are accessibly revealed from the dielectric encapsulation layer E2. For example, the top surface of the dielectric encapsulation layer E2 is substantially level (within process variations) with the exposed surfaces of the semiconductor dies 200. However, the disclosure is not limited thereto. In some embodiments, the top surface of the dielectric encapsulation layer E2 may be slightly higher than or slightly lower than the exposed surfaces of the semiconductor dies 200 due to polishing selectivity of the grinding process. Furthermore, the dielectric encapsulation layer E2 is spaced apart from the dielectric encapsulation layer E1 by the bonding structure 120.

Figure 8:
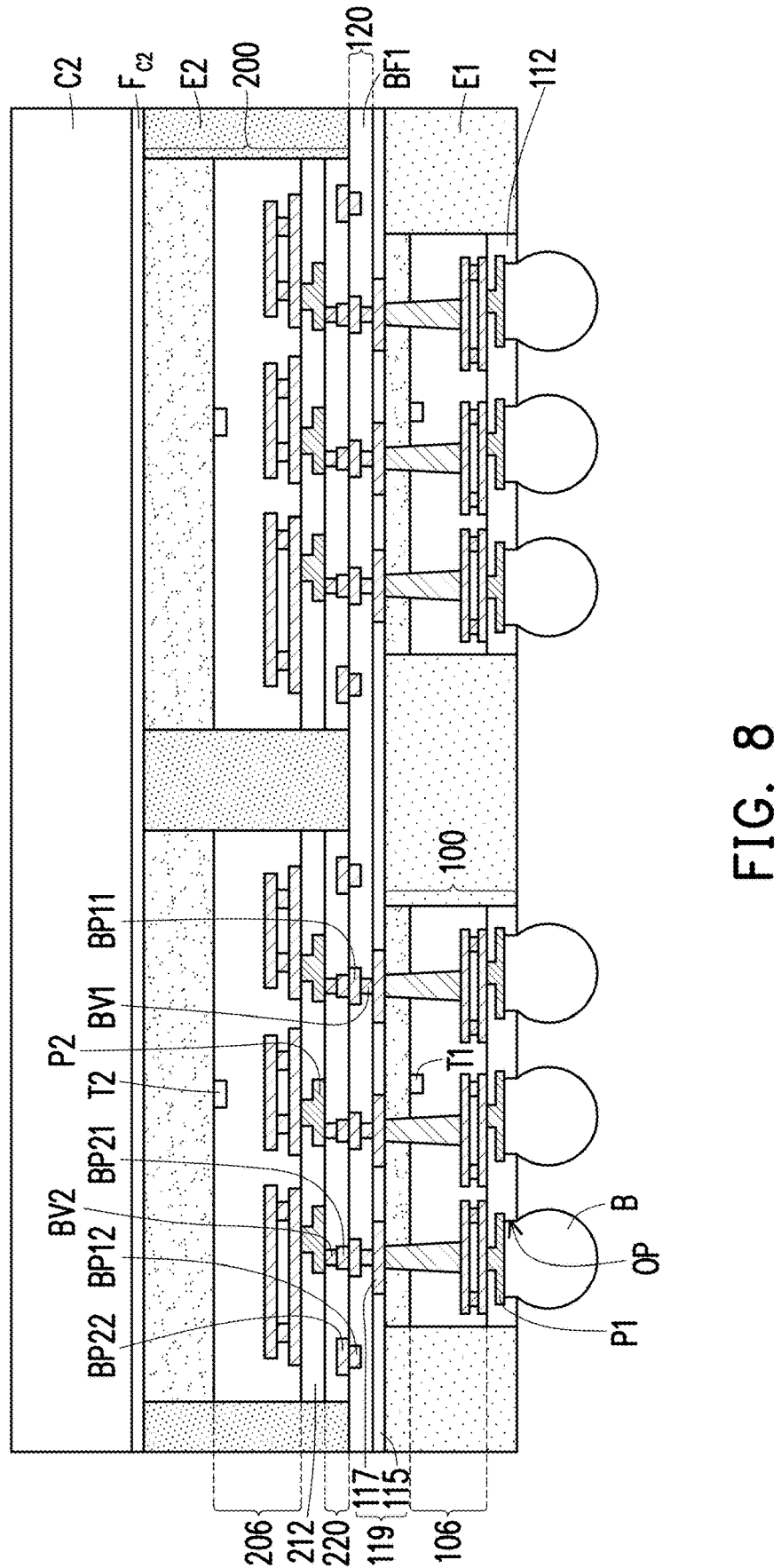

Referring to FIG. 8, a carrier C2 including a bonding film F$_{C2}$ thereon is provided. The carrier C2 may be a glass wafer, and the bonding film F$_{C2}$ may be an adhesive material. The bonding film $F_{C2}$ may include an oxide layer, a die attach tape (DAF) or a suitable adhesive. The carrier C2 is bonded to the back surfaces of the semiconductor dies 200 and the exposed surface of the dielectric encapsulation layer E2 through the bonding film $F_{C2}$. In some embodiments, a blanket bonding film may be provided between the bonding film $F_{C2}$ and the semiconductor substrate 202 and between bonding film $F_{C2}$ and the dielectric encapsulation layer E2, and the bonding film $F_{C2}$ may be bonded to the blanket bonding film through fusion bond.

Thereafter, a de-bonding process may be performed such that the bonding film $F_{C1}$ and the underlying carrier C1 are de-bonded from the bonding films F1 and the dielectric encapsulation layer E1. The de-bonding process may be a laser lift-off process or other suitable de-bonding processes. After removing the bonding film $F_{C1}$ and the carrier C1, a grinding process may be performed such that the bonding films F1 are removed to expose the passivation layer 112. During the removal of the bonding films F1, the dielectric encapsulation layer E1 may be thinned down. In some embodiments, the removal of the bonding films F1 and the thinning of the dielectric encapsulation layer E1 may be performed by the same grinding process (e.g., a CMP process). As illustrated in FIG. 8, after performing the grinding process, the semiconductor dies 100 are revealed, but the die pads P1 of the semiconductor dies 100 are not revealed and covered by the passivation layer 112 at this stage.

Still referring to FIG. 8, a patterning process of the passivation layer 112 is performed, such that multiple openings OP are formed in the passivation layer 112 and expose the die pads P1. In some embodiments, a post passivation layer (not shown) is formed to cover the dielectric encapsulation layer E1 and the passivation layer 112 of the semiconductor die 100, and the openings are formed through the post passivation layer and the passivation layer 112. In some embodiments, photolithography and etching processes are performed to form the openings OP. However, the disclosure is not limited thereto. In other embodiments, a laser drilling process is performed to form the openings OP.

Thereafter, conductive terminals or bumps B are formed within the openings OP of the passivation layer 112 and electrically connected to the die pads P1 of the semiconductor dies 100. In some embodiments, the bumps B are disposed within a chip region and in physical contact with the die pads P1. In some embodiments, the bumps B include solder bumps, and/or may include metal pillars (e.g., copper pillars), solder caps formed on metal pillars, and/or the like. The bumps B may be formed by a suitable process such as evaporation, electroplating, ball drop, or screen printing.

Figure 9:
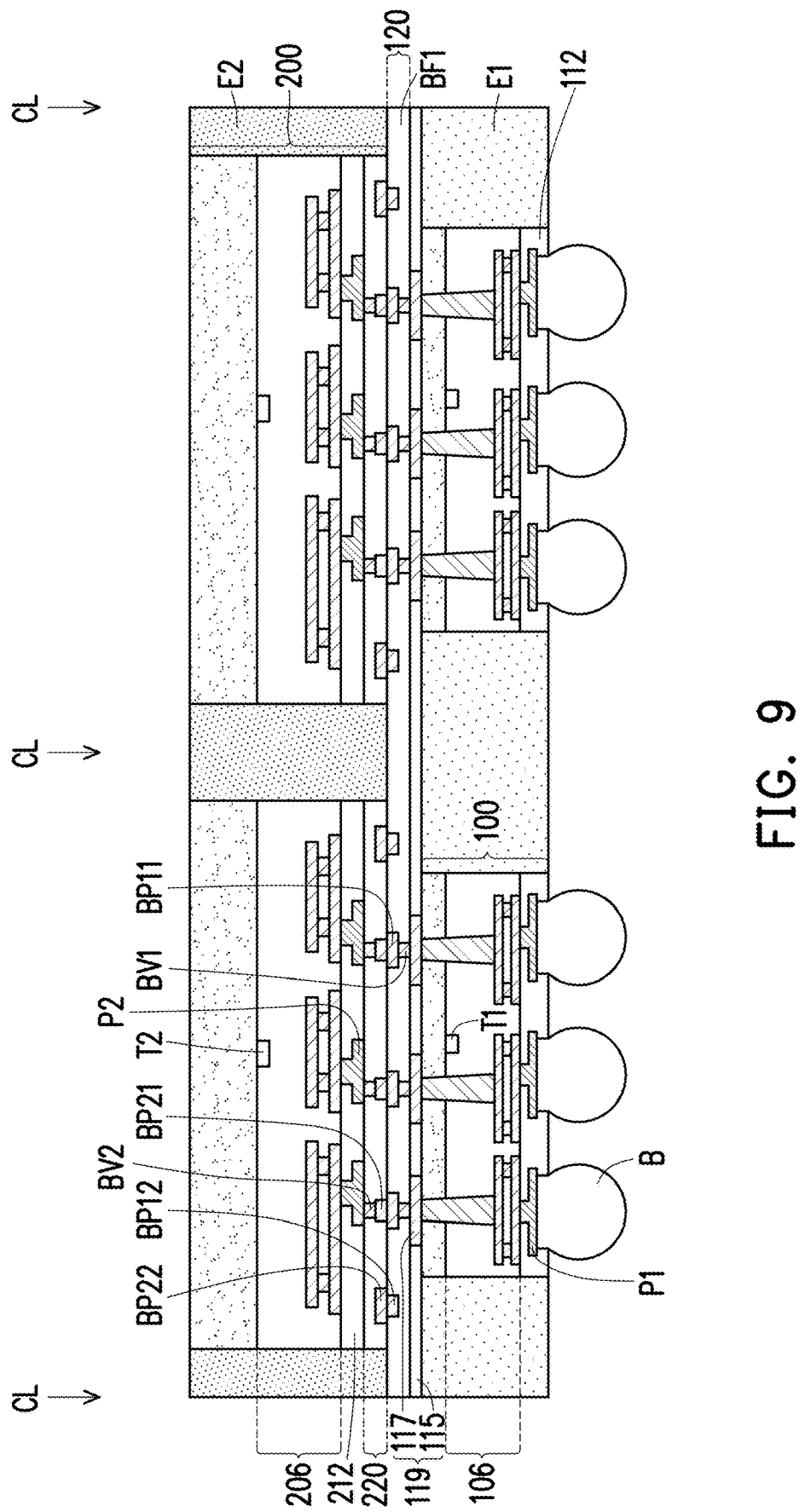

Referring to FIG. 9, the carrier C2 is de-bonded from the dielectric encapsulation layer E2. In some embodiments, the de-bonding process is a laser de-bonding process or a suitable process. The adhesive layer or the bonding film $F_{C2}$ is then removed from the dielectric encapsulation layer E2. In some embodiments, the removing process is an etching process and/or a cleaning process.

Figure 10:
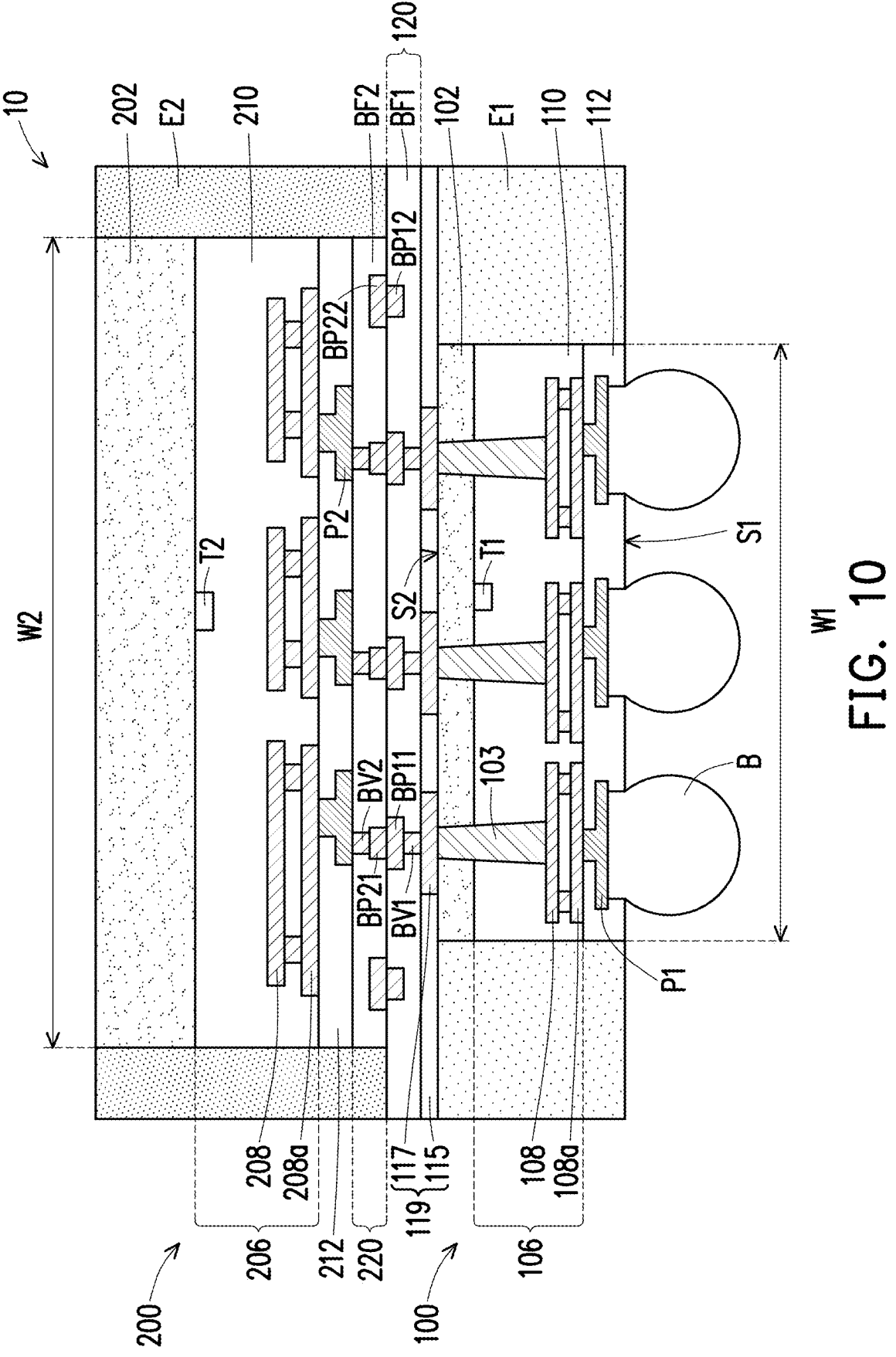

Thereafter, a wafer dicing process is performed on the structure of FIG. 9 along the cutting lines CL, so as to cut through the dielectric encapsulation layer E2, the bonding film BF1, the polymer layer 115 and the dielectric encapsulation layer E1. After the wafer dicing process or singulation process, the adjacent semiconductor packages 10 are separated from each other, as shown in FIG. 10. The semiconductor package 10 of some embodiments is thus formed. In some embodiments, a board substrate such as a printed circuit board (PCB) and/or an interposer substrate such as a silicon interposer or an organic interposer may be provided below and bonded to the semiconductor package 10 through bumps B.

Figure 11:
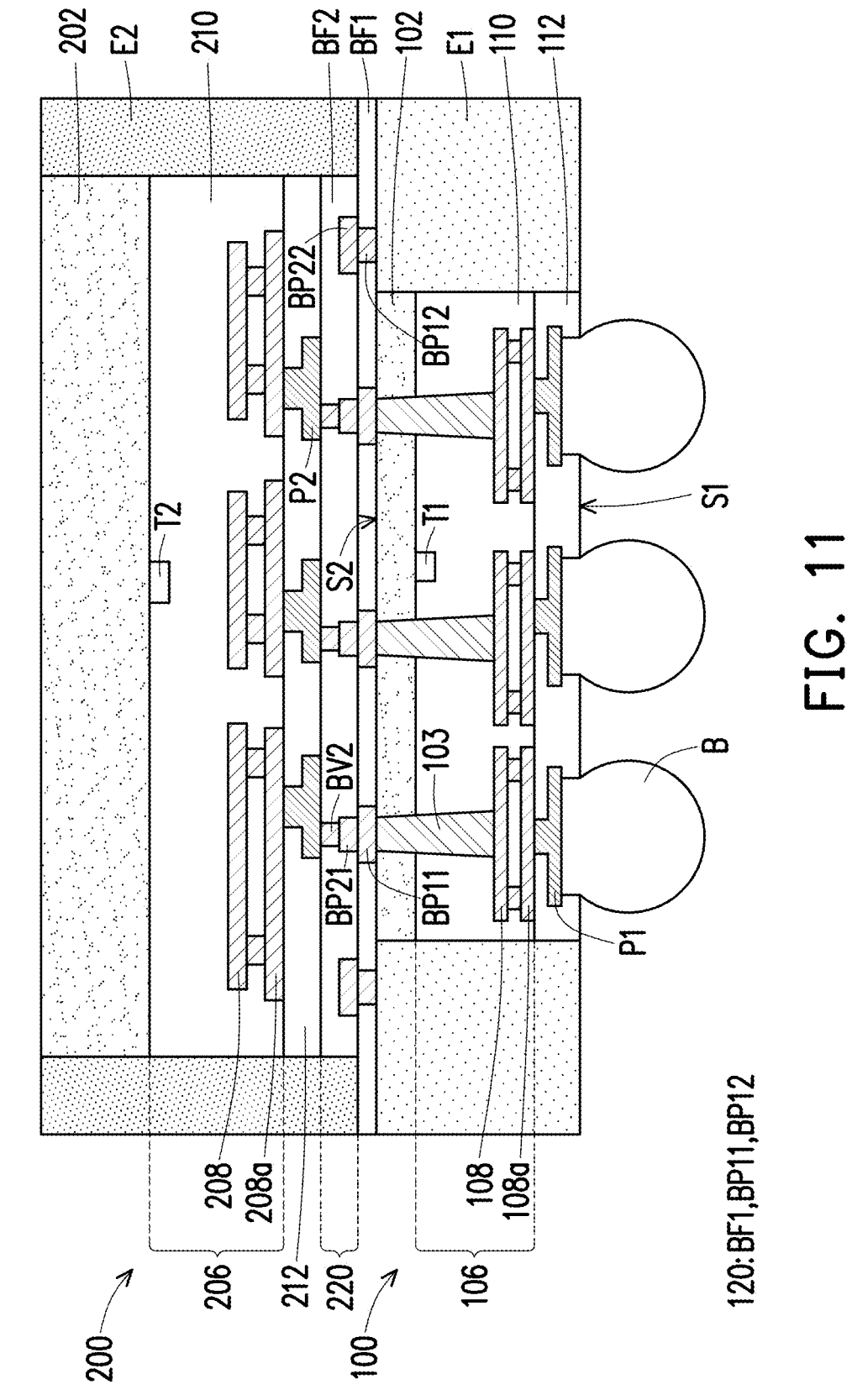
FIG. 11 is a cross-sectional view schematically illustrating a semiconductor package in accordance with some embodiments of the present disclosure.

FIG. 11 is a cross-sectional view schematically illustrating a semiconductor package in accordance with some embodiments of the present disclosure. The semiconductor package 11 of FIG. 11 is similar to the semiconductor package 10 of FIG. 10, wherein like reference numerals refer to like elements. The materials and configurations of elements of FIG. 11 may refer to those of similar elements described in the previous embodiments. The semiconductor package 11 of FIG. 11 is beneficial for cost reduction and/or size reduction. For example, the redistribution layer structure 119 may be omitted for cost reduction and/or size reduction.

The method of forming the semiconductor package 11 of FIG. 11 is similar to the method of forming the semiconductor package 10 described in FIG. 1 to FIG. 10, but with the operation of forming the redistribution layer structure 119 as shown in FIG. 5 being omitted and the structure of the bonding structure 120 may change accordingly. In some embodiments, as shown in FIG. 11, the semiconductor die 200 is bonded to the semiconductor die 100 through the bonding structure 120 and the bonding structure 220, but bonding vias BV1 as shown in FIG. 10 may be optionally omitted from the bonding structure 120. Specifically, the bonding pads BP11 are in physical contact with the bonding pads BP21 of the semiconductor die 200 and the through substrate vias 103 of the semiconductor die 100, and the bonding pads BP12 are in physical contact with the bonding pads BP22 of the semiconductor die 200 and the dielectric encapsulation layer E1.

In the disclosure, when two semiconductor dies with different sizes and critical dimensions are provided, the smaller semiconductor die (e.g., semiconductor die 100) with a smaller critical dimension is configured to face the ball array (e.g., bumps B), and the greater semiconductor die (e.g., semiconductor die 200) with a greater critical dimension is further away from the ball array (e.g., bumps B). By such configuration, the signal transmission performance of the semiconductor package can be significantly improved. The signal between the critical die and the ball array is transmitted directly without additional routing or wire bonding.

In the above embodiments, the semiconductor packages are formed with a "die pad first" process in which the die pads of the lower semiconductor die are formed before the upper semiconductor die is bonded to the lower semiconductor die. However, the disclosure is not limited thereto. In other embodiments, the semiconductor packages are formed with a "die pad last" process in which the die pads of the lower semiconductor die are formed after the upper semiconductor die is bonded to the lower semiconductor die.

FIG. 12 to FIG. 21 are cross-sectional views schematically illustrating a method of forming a semiconductor package in accordance with other embodiments of the present disclosure. It is understood that the disclosure is not limited by the method described below. Additional operations can be provided before, during, and/or after the method and some of the operations described below can be replaced or eliminated, for additional embodiments of the methods.

Although FIG. 12 to FIG. 21 are described in relation to a method, it is appreciated that the structures disclosed in FIG. 12 to FIG. 21 are not limited to such a method, but instead may stand alone as structures independent of the method.

Figure 21:
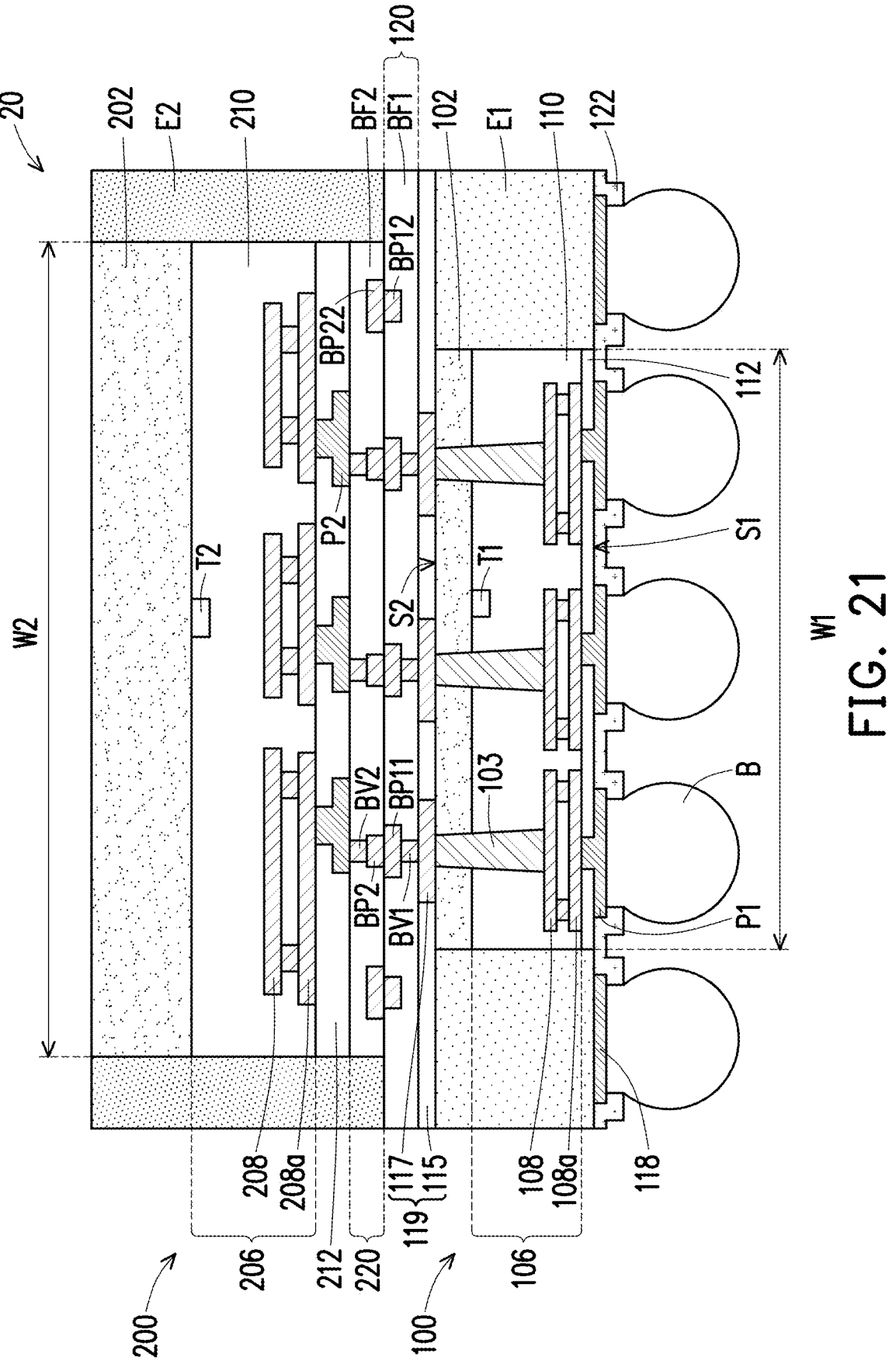

The method of forming the semiconductor package 20 of FIG. 21 is similar to the method of forming the semiconductor package 10 described in FIG. 1 to FIG. 10, wherein the forming sequence of the die pads of the lower semiconductor die differs. The difference between them is described in detail below, and the similarity is not iterated herein.

Figure 13:
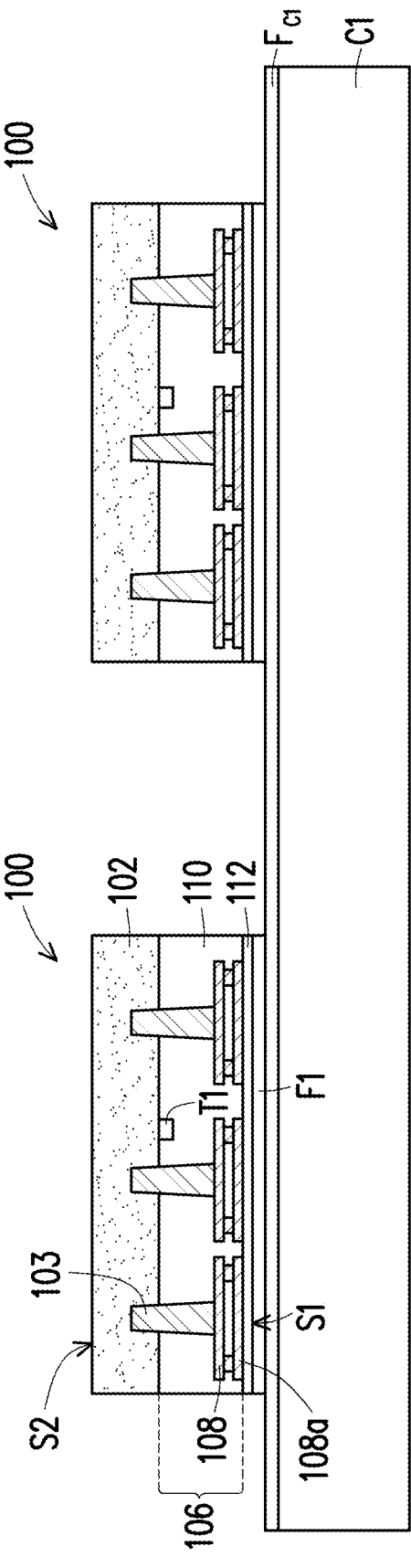

Referring to FIG. 12 and FIG. 13, multiple semiconductor dies 100 (e.g., logic dies, memory dies, or the like) are provided and bonded to a carrier C1. It is noted that in the stages of FIG. 12 and FIG. 13, the semiconductor dies 100 are provided without die pads. Specifically, the semiconductor die 100 includes a semiconductor substrate 102, at least one device T1 disposed on/in the semiconductor substrate 102, an interconnect structure 106 disposed on the semiconductor substrate 102 and electrically to the device T1, through substrate vias 103 penetrating through the semiconductor substrate 102 and electrically connected to the interconnect structure 106, and a passivation layer 112. The passivation layer 112 is formed over the interconnect structure 106 and covers the top metal features 108*a* and the dielectric layer 110. The operations, materials and configurations of elements of FIG. 12 to FIG. 13 may refer to those described in FIG. 1 to FIG. 2.

Figure 14:
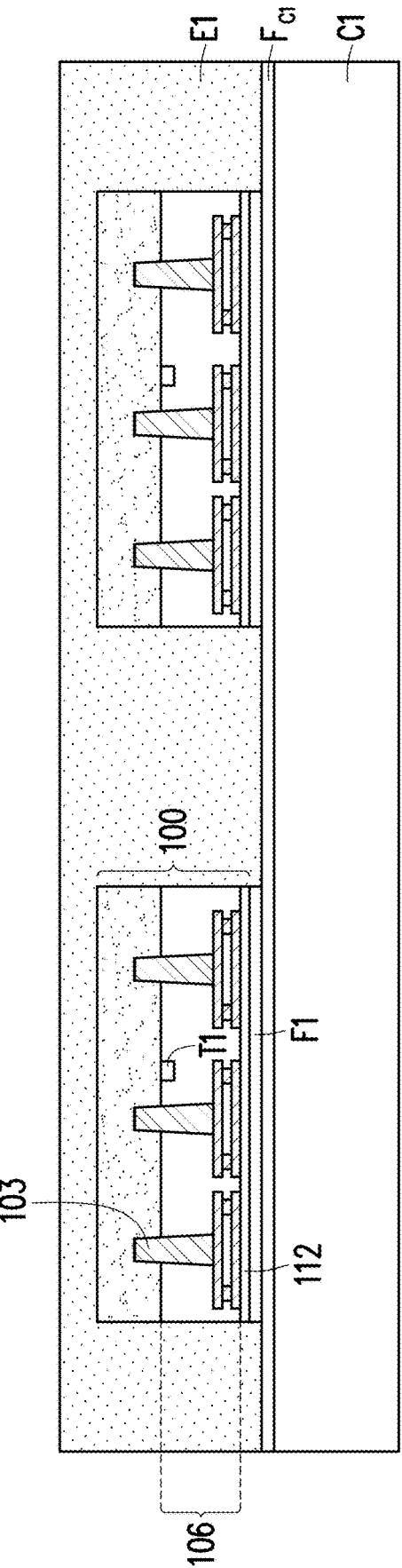
Figure 15:
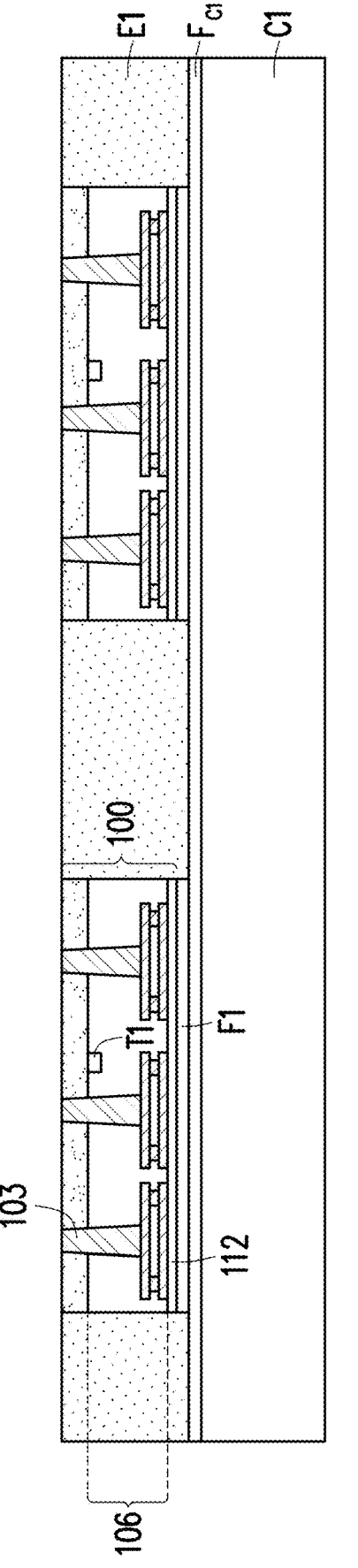

Referring to FIG. 14 and FIG. 15, after the semiconductor dies 100 are bonded to the carrier C1 through the bonding film F$_{C1}$ and the bonding films F1, a dielectric encapsulation layer E1 is formed over the carrier C1 and laterally encapsulates the semiconductor dies 100. The operations, materials and configurations of elements of FIG. 14 to FIG. 15 may refer to those described in FIG. 3 to FIG. 4.

Figure 16:
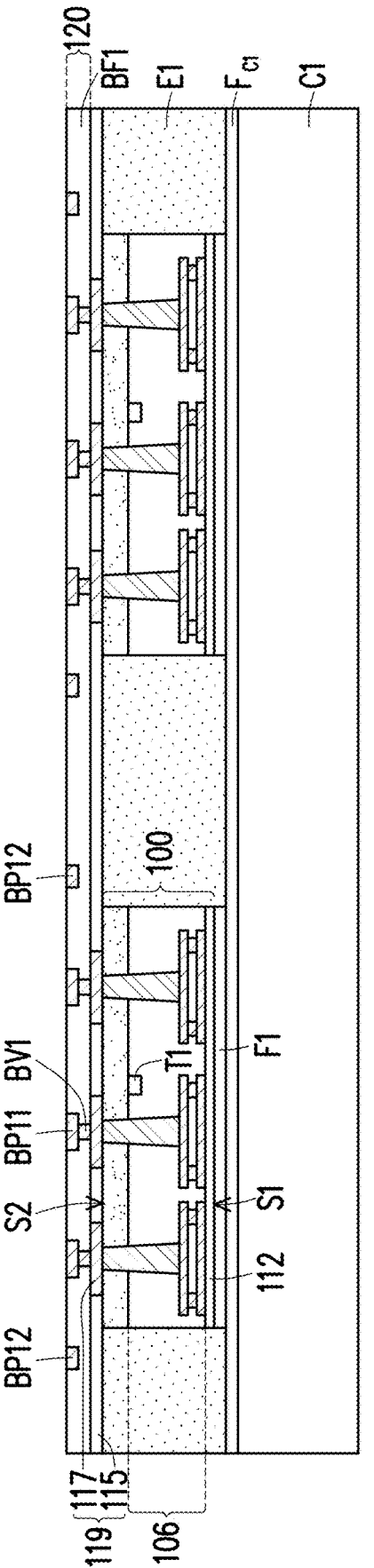

Referring to FIG. 16, a redistribution layer structure 119 is formed over the backsides S2 of the semiconductor dies 100 and the exposed surface of the dielectric encapsulation layer E1. Thereafter, a bonding structure 120 is formed over the redistribution layer structure 119. The operations, materials and configurations of elements of FIG. 16 may refer to those described in FIG. 5.

Figure 17:
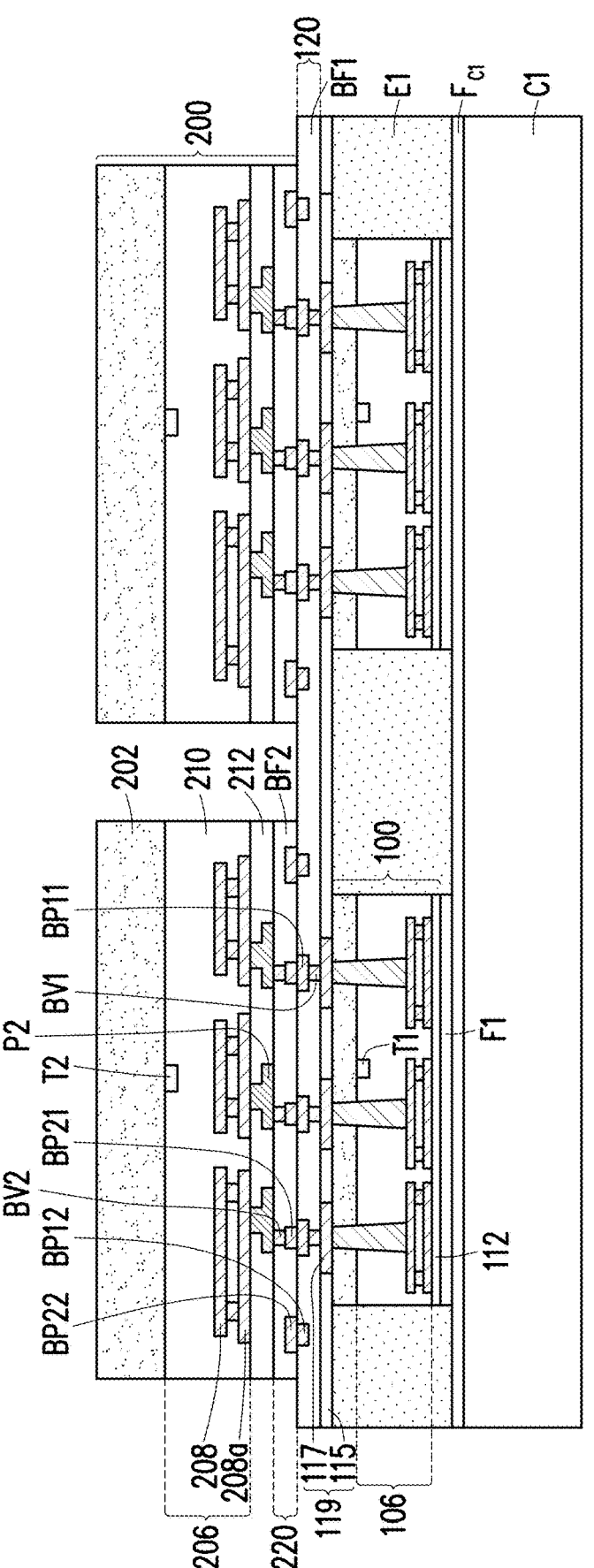

Referring to FIG. 17, multiple semiconductor dies 200 (e.g., memory dies, logic dies or other suitable dies) are provided and placed on the bonding structure 120. The operations, materials and configurations of elements of FIG. 17 may refer to those described in FIG. 6.

Figure 18:
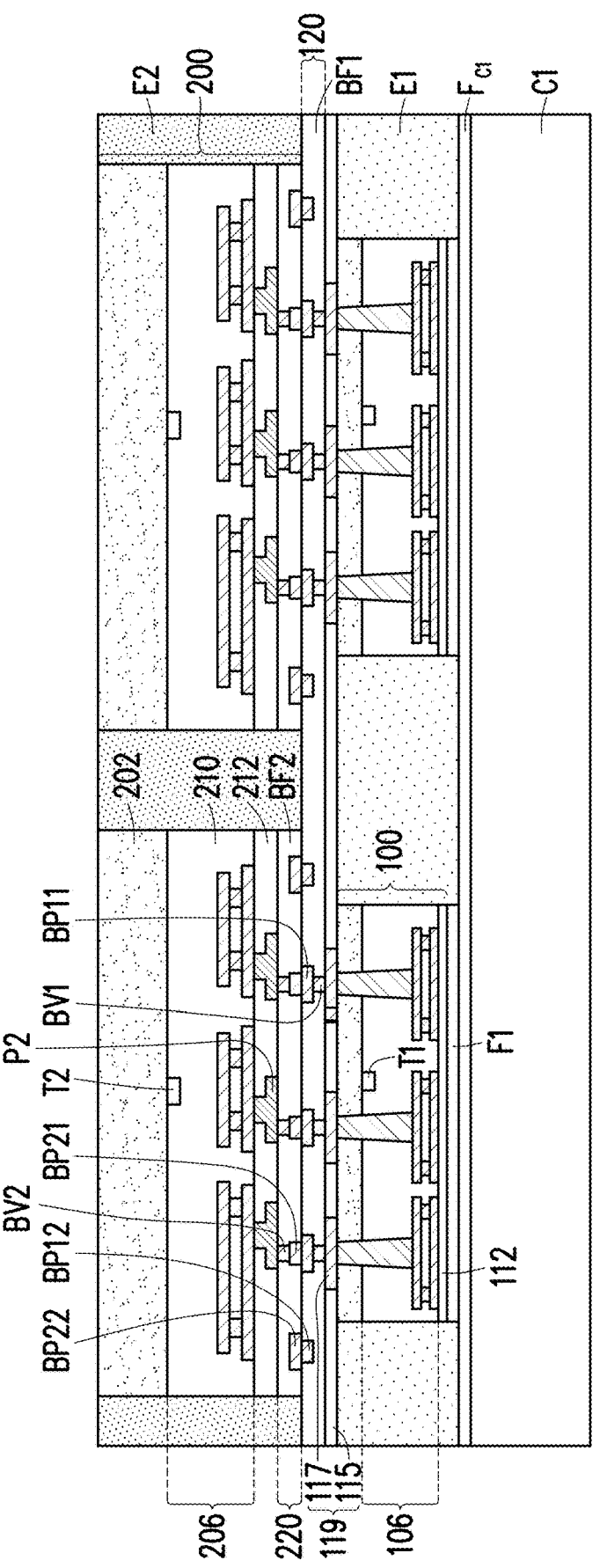

Referring to FIG. 18, after the semiconductor dies 200 are bonded to the semiconductor dies 100 through the bonding structure 120 and the bonding structure 220, a dielectric encapsulation layer E2 is formed to cover the bonding structure 120 and laterally encapsulates the semiconductor dies 200. The operations, materials and configurations of elements of FIG. 18 may refer to those described in FIG. 7.

Figure 19:
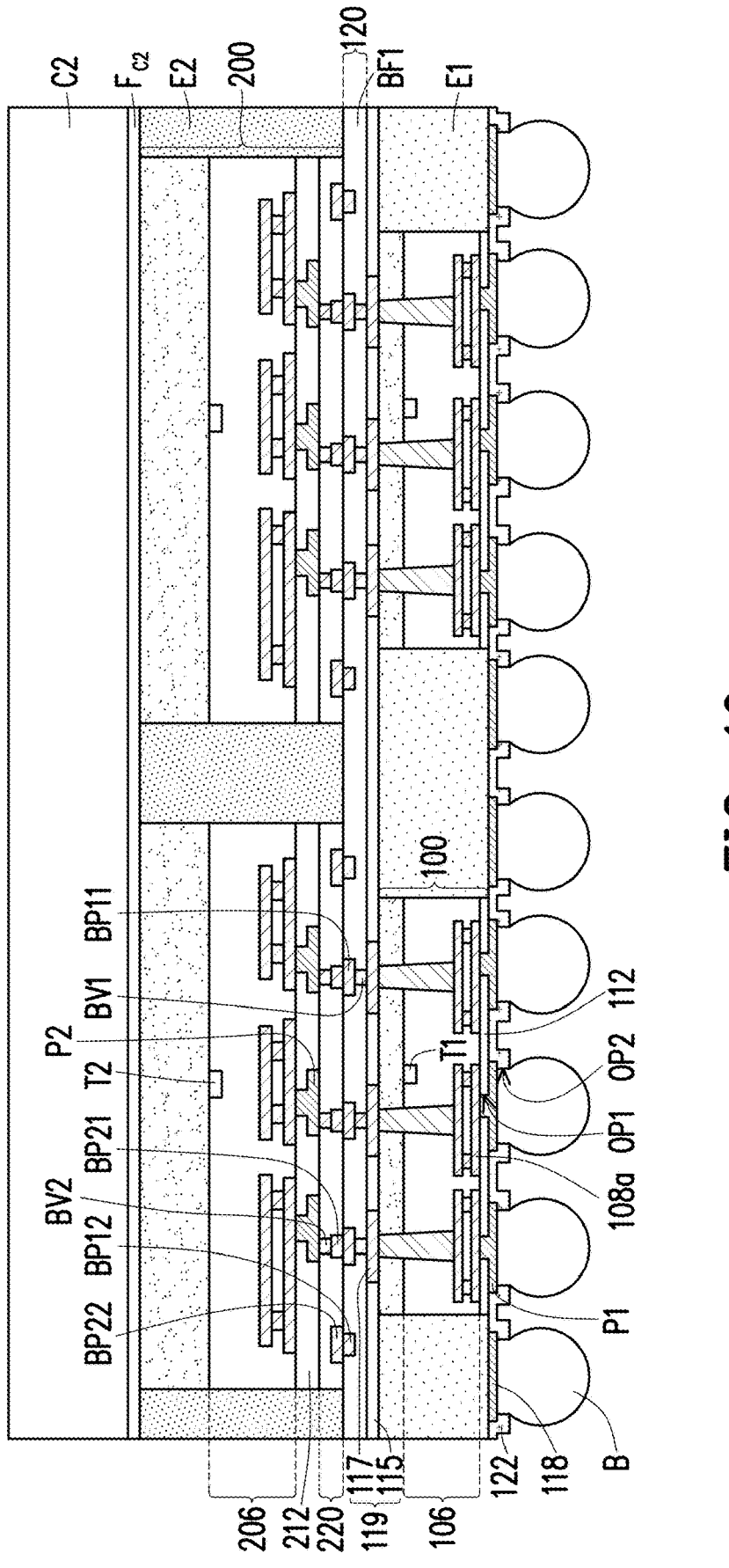

Referring to FIG. 19, a carrier C2 is provided and bonded to the back surfaces of the semiconductor dies 200 and the exposed surface of the dielectric encapsulation layer E2 through the bonding film F$_{C2}$. Thereafter, a de-bonding process may be performed such that the bonding film F$_{C1}$ and the underlying carrier C1 are de-bonded from the bonding films F1 and the dielectric encapsulation layer E1. After removing the bonding film F$_{C1}$ and the carrier C1, a grinding process may be performed such that the bonding films F1 are removed to expose the passivation layer 112. During the removal of the bonding films F1, the dielectric encapsulation layer E1 may be thinned down. In some embodiments, the removal of the bonding films F1 and the thinning of the dielectric encapsulation layer E1 may be performed by a grinding process (e.g., a CMP process). As illustrated in FIG. 19, the grinding process is performed until the passivation layer 112 of the semiconductor dies 100 is exposed. The operations, materials and configurations of elements of FIG. 19 may refer to those described in FIG. 8.

Still referring to FIG. 19, a patterning process of the passivation layer 112 is performed, such that multiple openings OP1 are formed in the passivation layer 112 and expose the top metal features 108*a* of the interconnect structure 106. In some embodiments, photolithography and etching processes are performed to form the openings OP1. However, the disclosure is not limited thereto. In other embodiments, a laser drilling process is performed to form the openings OP1.

Thereafter, die pads P1 are formed within the openings OP1 of the passivation layer 112 and electrically connected to the interconnect structure 106 of the semiconductor dies 100. In some embodiments, the die pads P1 are aluminum pads, copper pads, nickel pads, combinations thereof, or the like. Each of the die pads P1 may be a single layer or a multiple-layer structure. In some embodiments, some of the die pads P1 have probe marks on the top surfaces thereof. The semiconductor die 100 and the overlying semiconductor die 200 are referred to as "known good dies." In some embodiments, the die pads P1 are free of probe marks.

In some embodiments, during the operation of forming the die pads P1, redistribution patterns 118 are simultaneously formed aside the die pads P1. For example, the redistribution patterns 118 are formed over the dielectric encapsulation layer E1 adjacent the die pads P1. The redistribution patterns 118 are configured to spread the contact points around the semiconductor die 100 so that bumps such as solder balls can be applied, and the thermal stress of mounting can be spread. In some embodiments, the die pads P1 and the redistribution patterns 118 are formed by a sputtering process, a deposition process, an electroplating process, or the like.

Thereafter, a post passivation layer 112 is formed to cover the dielectric encapsulation layer E1, the passivation layer 112 and die pads P1 of the semiconductor die 100, and the redistribution patterns 118. In some embodiments, the post passivation layer 122 includes silicon oxide, silicon nitride, benzocyclobutene (BCB) polymer, polyimide (PI), polybenzoxazole (PBO) a combination thereof, or the like, and is formed by a suitable process such as spin coating, CVD or the like. In some embodiments, the passivation layer 112 and the post passivation layer 122 include the same material. In some embodiments, the passivation layer 122 and the post passivation layer 122 include different materials.

Afterwards, a patterning process of the post passivation layer 122 is performed, such that multiple openings OP2 are formed in the post passivation layer 122 and expose the die pads P1 of the semiconductor dies 100. In some embodiments, photolithography and etching processes are performed to form the openings OP2. However, the disclosure is not limited thereto. In other embodiments, a laser drilling process is performed to form the openings OP2.

Then, conductive terminals or bumps B are formed within the openings OP2 and electrically connected to the die pads P1 of the semiconductor dies 100 and the redistribution patterns 118 aside the die pads P1. In some embodiments, some of the bumps B are disposed within a chip region and in physical contact with the die pads P1, and some of the bumps B are disposed outside of the chip region and in physical contact with the redistribution patterns 118. In some embodiments, the bumps B include solder bumps, and/or may include metal pillars (e.g., copper pillars), solder caps formed on metal pillars, and/or the like. The bumps B may be formed by a suitable process such as evaporation, electroplating, ball drop, screen printing, or the like.

Figure 20:
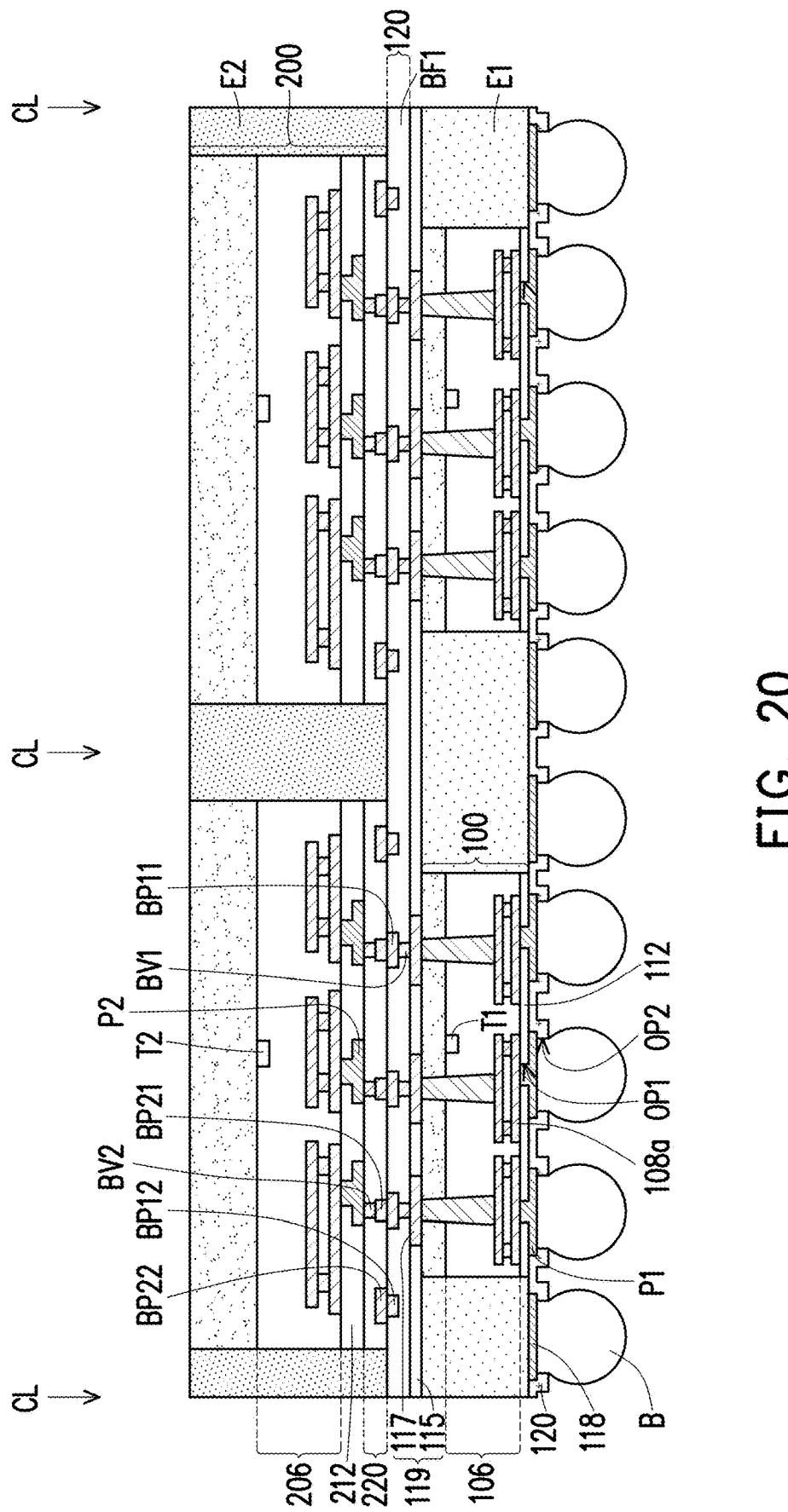

Referring to FIG. 20, the carrier C2 is de-bonded from the dielectric encapsulation layer E2. In some embodiments, the de-bonding process is a laser de-bonding process or a suitable process. The adhesive layer or the bonding film $F_{C2}$ is then removed from the dielectric encapsulation layer E2. In some embodiments, the removing process is an etching process and/or a cleaning process.

Thereafter, a wafer dicing process is performed on the structure of FIG. 20 along the cutting lines CL, so as to cut through the dielectric encapsulation layer E2, the bonding film BF1, the polymer layer 115 and the dielectric encapsulation layer E1. After the wafer dicing process or singulation process, the adjacent semiconductor packages 20 are separated from each other, as shown in FIG. 21. The semiconductor package 20 of some embodiments is thus completed. In some embodiments, a board substrate such as a printed circuit board (PCB) and/or an interposer substrate such as a silicon interposer or an organic interposer may be provided below and bonded to the semiconductor package 20 through bumps B.

Figure 22:
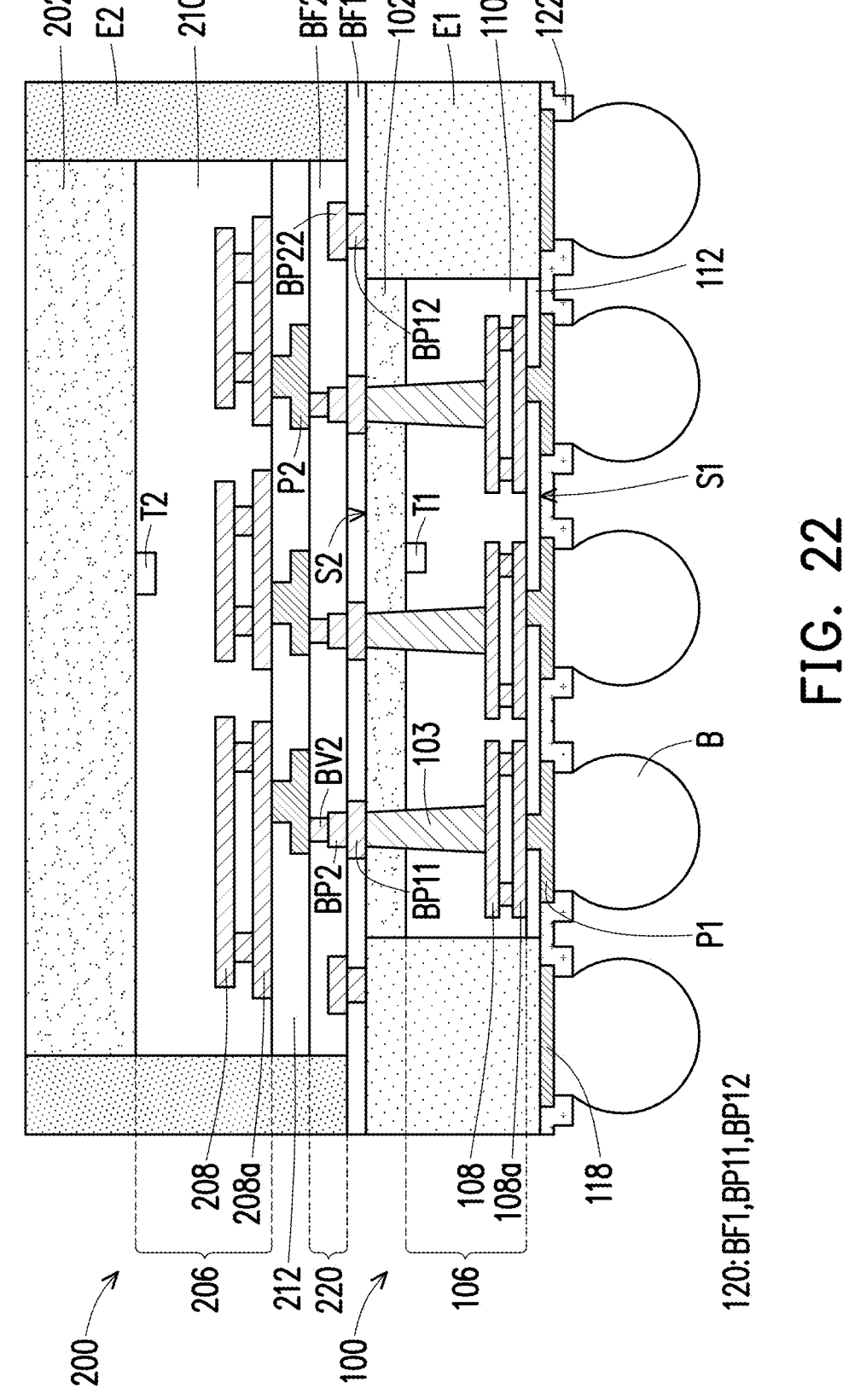
FIG. 22 to FIG. 23 are cross-sectional views schematically illustrating semiconductor packages in accordance with other embodiments of the present disclosure.
Figure 23:
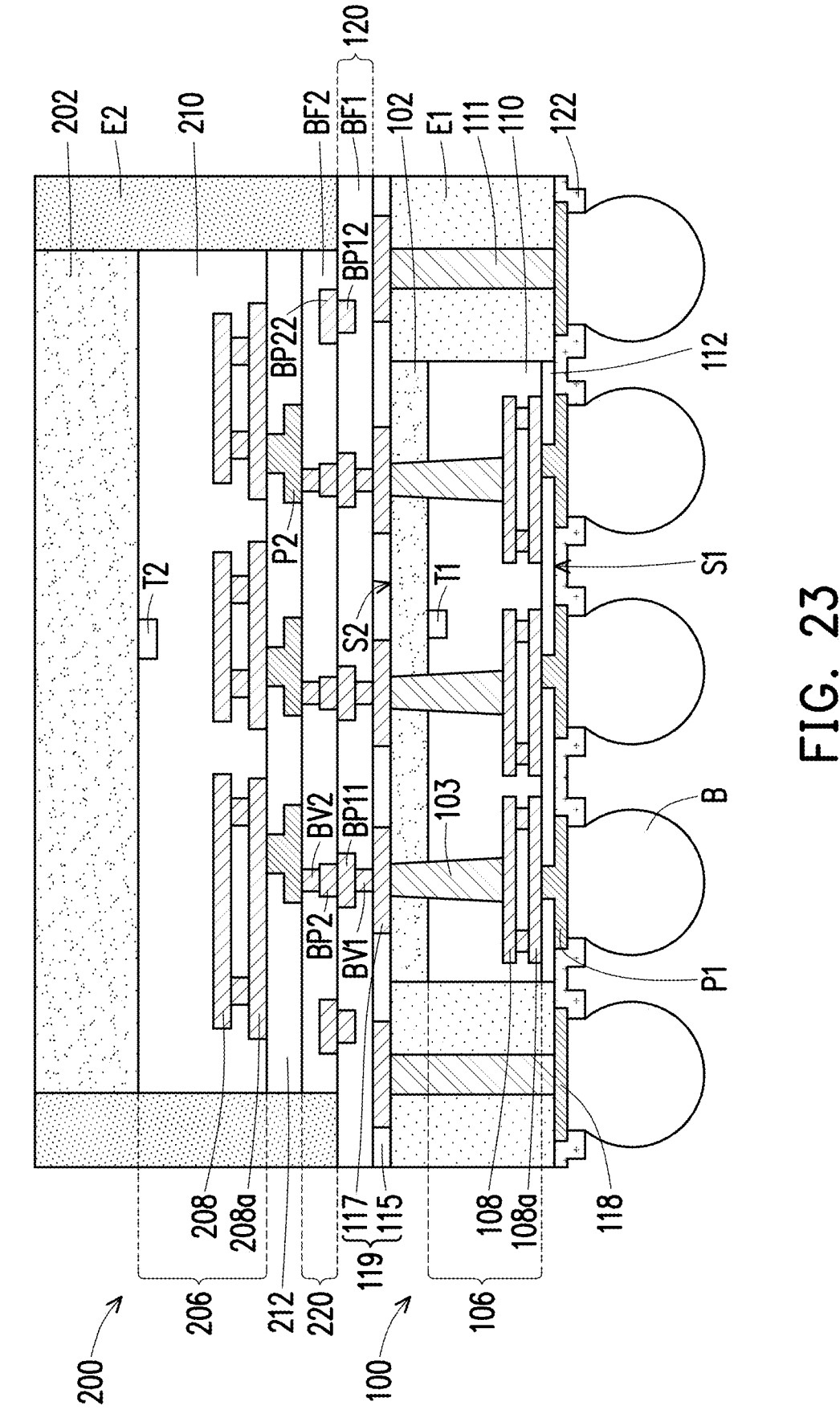

FIG. 22 to FIG. 23 are cross-sectional views schematically illustrating semiconductor packages in accordance with some embodiments of the present disclosure. The semiconductor packages 21 and 22 of FIGS. 22 and 23, respectively, are similar to the semiconductor package 20 of FIG. 21, wherein like reference numerals refer to like elements. The materials and configurations of elements of FIGS. 22 and 23 may refer to those of similar elements described in the previous embodiments. The semiconductor package 21 of FIG. 22 may be beneficial for cost reduction and/or size reduction. The semiconductor package 22 of FIG. 23 may be beneficial for spreading wiring and routing and therefore increasing the product flexibility.

The method of forming the semiconductor package 21 of FIG. 22 is similar to the method of forming the semiconductor package 20 described in FIG. 12 to FIG. 21, wherein the operation of forming the redistribution layer structure 119 as shown in FIG. 16 is omitted. In some embodiments, as shown in FIG. 21, the semiconductor die 200 is bonded to the semiconductor die 100 through the bonding structure 120 and the bonding structure 220, but bonding vias BV1 as shown in FIG. 21 may be optionally omitted from the bonding structure 120. For example, as illustrated in FIG. 21, the bonding pads BP11 are in physical contact with the bonding pads BP21 of the semiconductor die 200 and the through substrate vias 103 of the semiconductor die 100, and the bonding pads BP12 are in physical contact with the bonding pads BP22 of the semiconductor die 200 and the dielectric encapsulation layer E1.

The method of forming the semiconductor package 22 of FIG. 23 is similar to the method of forming the semiconductor package 20 described in FIG. 12 to FIG. 21, wherein an operation of forming through dielectric vias (TDVs) 111 is further included before the operation of forming the dielectric encapsulation layer E1 in FIGS. 14 and 15. The through dielectric vias 111 may include Cu, Ti, Ta, W, Ru, Co, Ni, the like, an alloy thereof, or a combination thereof. In some embodiments, the through dielectric vias 111 are formed by an electroplating process. In some embodiments, as shown in FIG. 23, the through dielectric vias 111 are electrically connected to the back-side redistribution layer structure 119 and the front-side redistribution patterns 118.

The structures of semiconductor packages of some embodiments are illustrated below with reference to FIG. 10, FIG. 11, FIG. 20, FIG. 21 and FIG. 22.

In some embodiments, a semiconductor package 10/11/20/21/22 includes a first semiconductor die 100, a second semiconductor die 200 and a plurality of bumps B. The first semiconductor die 100 has active front side S1 and a backside S2 opposite to each other. The second semiconductor die 200 is disposed at the backside S2 of the first semiconductor die 100 and electrically connected to first semiconductor die 100. The plurality of bumps B are disposed at the front side S1 of the first semiconductor die 100 and physically connect first die pads P1 of the first semiconductor die 100. In some embodiments, a total width W1 of the first semiconductor die 100 is less than a total width W2 of the second semiconductor die 200. In some embodiments, the first die pads P1 include aluminum pads. In some embodiments, a critical dimension of the first semiconductor die 100 is less than a critical dimension of the second semiconductor die 200.

In some embodiments, the semiconductor package 10/11/20/21/22 further includes a first bonding structure 120 disposed between the first semiconductor die 100 and the second semiconductor die 200, and an edge of the first bonding structure 120 extends laterally beyond an edge of the first semiconductor die 100. In some embodiments, the semiconductor package further 10/11/20/21/22 includes a second bonding structure 220 disposed between the first bonding structure 120 and the second semiconductor die 200, wherein an edge of the second bonding structure 220 is aligned with an edge of the second semiconductor die 200. In some embodiments, the first bonding structure 120 is bonded to the second bonding structure 220 through hybrid bonding including dielectric-to-dielectric bonding and metal-to-metal bonding. In some embodiments, the semiconductor package 10/11/20/21/22 further includes a first dielectric encapsulation layer E1 laterally encapsulating the first semiconductor die 100, and a second dielectric encapsulation layer E2 disposed over the first semiconductor die 100 and laterally encapsulating the second semiconductor die 200.

In some embodiments, the semiconductor package 10/20/22 further includes a redistribution layer structure 119 disposed between the first bonding structure 120 and the second bonding structure 220.

In some embodiments, the semiconductor package 20/21/22 further includes redistribution patterns 118 disposed at the front side S1 of the first semiconductor die 100 and aside the first die pads P1 of the first semiconductor die 100. In some embodiments, the semiconductor package 22 further includes through dielectric vias 111 penetrating through first dielectric encapsulation layer E1 and electrically connected to the redistribution layer structure 119 and the redistribution patterns 118.

The above embodiments in which the upper integrated circuit structure is a single semiconductor die are provided for illustration purposes, and are not to be construed as limiting the present disclosure. In some embodiments, the upper integrated circuit structure is a die stack including multiple dies vertically stacked.

Figure 24:
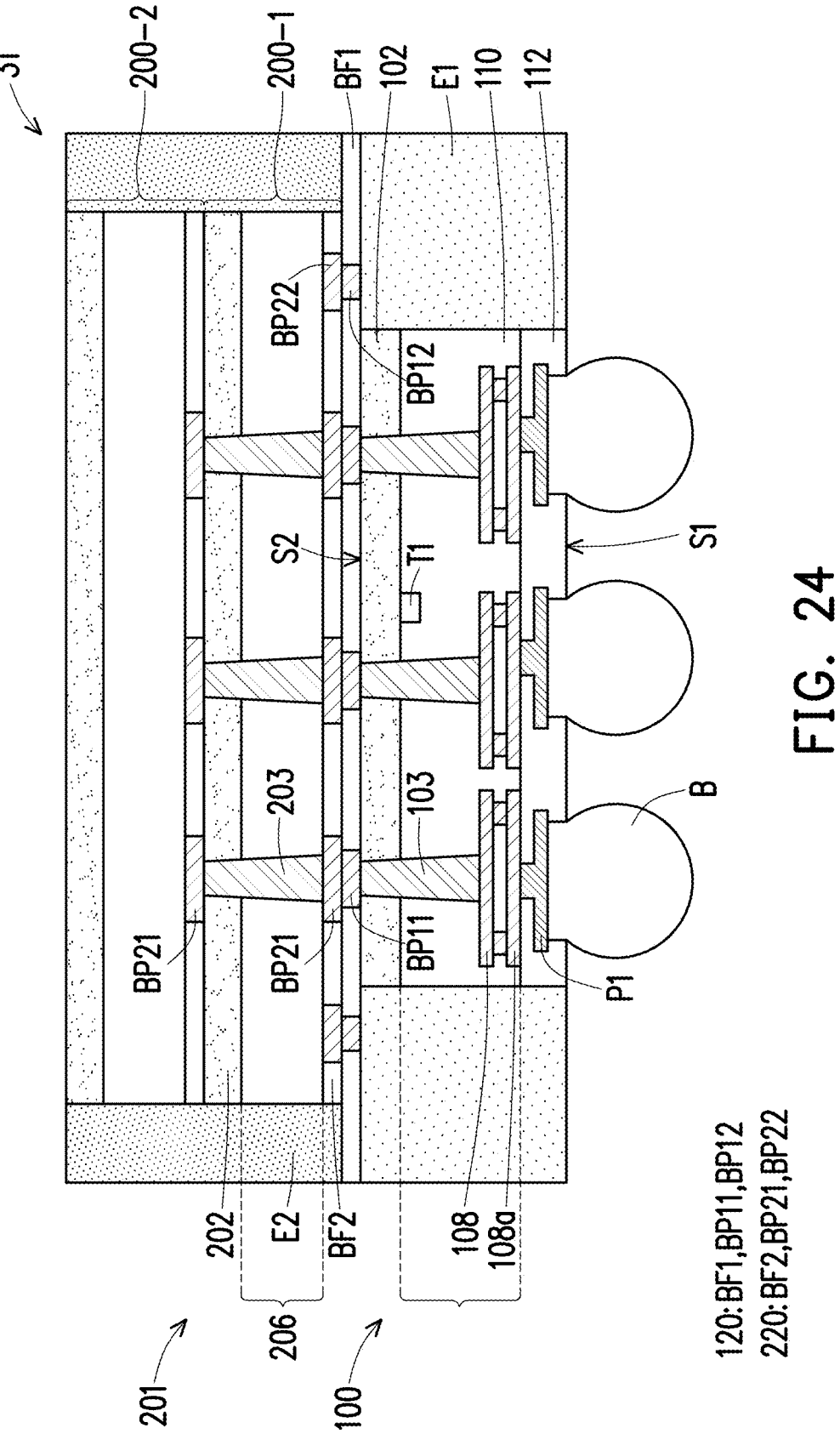
FIG. 24 to FIG. 31 are cross-sectional views schematically illustrating semiconductor packages in accordance with some embodiments of the present disclosure.

FIG. 24 is a cross-sectional view schematically illustrating a semiconductor package in accordance with some embodiments of the present disclosure. The semiconductor package 31 of FIG. 24 is similar to the semiconductor package 11 of FIG. 11, wherein like reference numerals refer to like elements. The materials and configurations of elements of FIG. 24 may refer to those of similar elements described in the previous embodiments. The semiconductor package 31 of FIG. 24 may be beneficial for product flexibility.

As shown in FIG. 24, a die stack 201 including semiconductor dies 200-1 and 200-2 are provided and bonded to the semiconductor die 100. In FIG. 24, only two semiconductor dies 200-1 and 200-2 are illustrated; however, the number of the semiconductor dies 200-1 and 200-2 is not limited by the disclosure. In some embodiments, the semiconductor die 200-1 is the lowermost die facing the semiconductor die 100, and the semiconductor die 200-2 is the uppermost die from the semiconductor die 100. One or more semiconductor dies may be interposed between the semiconductor dies 200-1 and 200-2. In some embodiments, the semiconductor die 200-1 includes a semiconductor substrate 202, an interconnection structure 206 disposed over the semiconductor substrate 202, a bonding structure 220 disposed over the interconnect structure 206, and through substrate vias (TSVs) 203 penetrating through the semiconductor substrate 202 and the interconnection structure 206 and electrically connected to the underlying semiconductor die 100 and the overlying semiconductor die 200-2. The uppermost semiconductor die 200-2 may have a structure similar to that of the semiconductor die 200-1. In some embodiments, the through substrate vias 203 may be omitted from the semiconductor die 200-2 as needed. In some embodiments, the semiconductor die 200-2 is bonded to the semiconductor die 200-1 through hybrid bonding in a face-to-back configuration. However, the disclosure is not limited thereto. The semiconductor die 200-2 may be bonded to the semiconductor die 200-1 with solder joint. The semiconductor die 200-2 may be bonded to the semiconductor die 200-1 in a face-to-face configuration or a back-to-back configuration as needed. In some embodiments, a redistribution layer structure 119 as shown in FIG. 10 may be further included in the semiconductor package 31 upon the process requirements.

Figure 25:
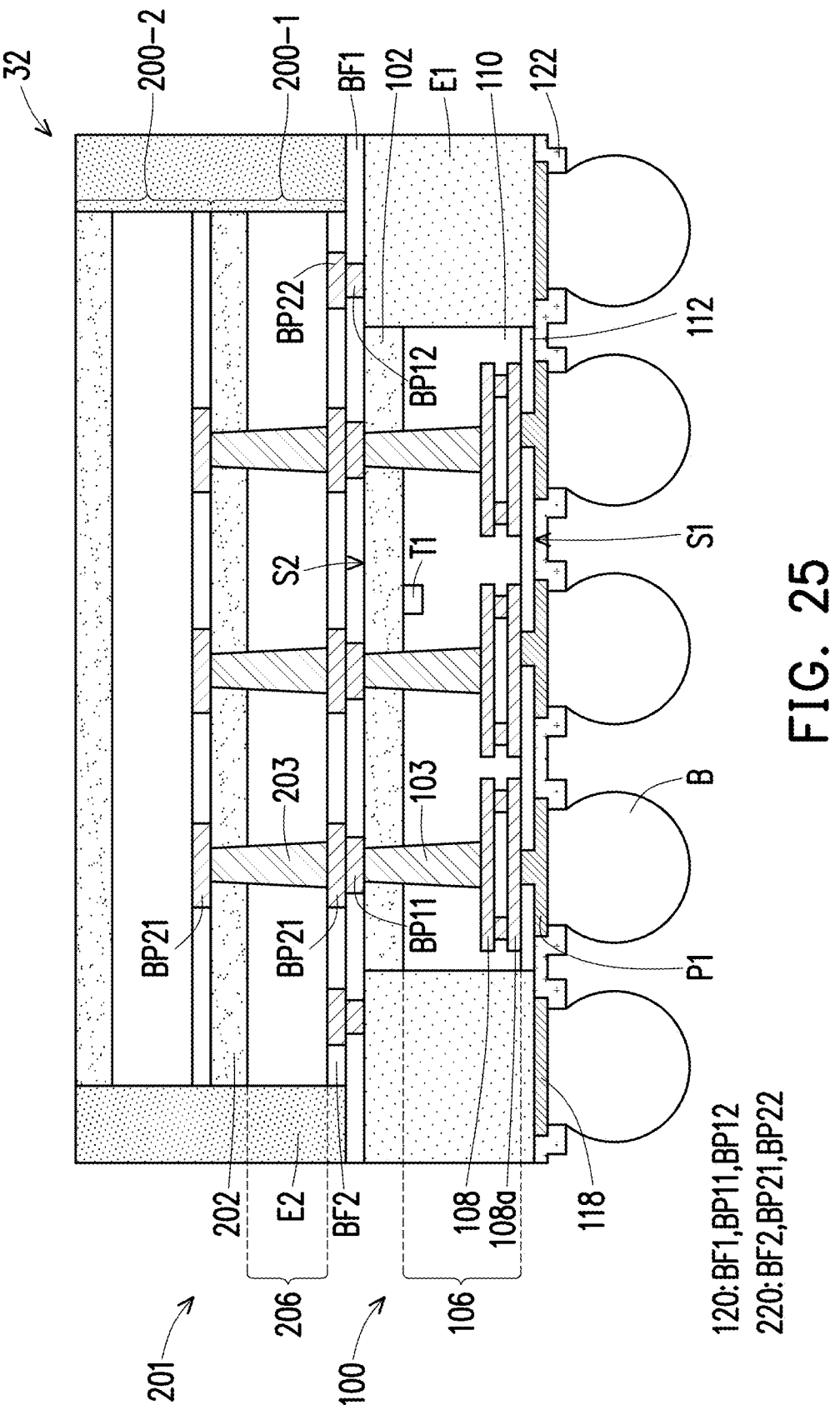

FIG. 25 is a cross-sectional view schematically illustrating a semiconductor package in accordance with other embodiments of the present disclosure. The semiconductor package 32 of FIG. 25 is similar to the semiconductor package 21 of FIG. 22, wherein like reference numerals refer to like elements. The materials and configurations of elements of FIG. 25 may refer to those of similar elements described in the previous embodiments. The semiconductor package 32 of FIG. 25 may be beneficial for product flexibility.

As shown in FIG. 25, a die stack 201 including semiconductor dies 200-1 and 200-2 are provided and bonded to the semiconductor die 100. The die stack of FIG. 25 is similar to the die stack of FIG. 24, wherein like reference numerals refer to like elements. In some embodiments, a redistribution layer structure 119 as shown in FIG. 21 may be further included in the semiconductor package 32 upon the process requirements. In some embodiments, through dielectric vias 111 as shown in FIG. 23 may be further included in the semiconductor package 32.

Figure 26:
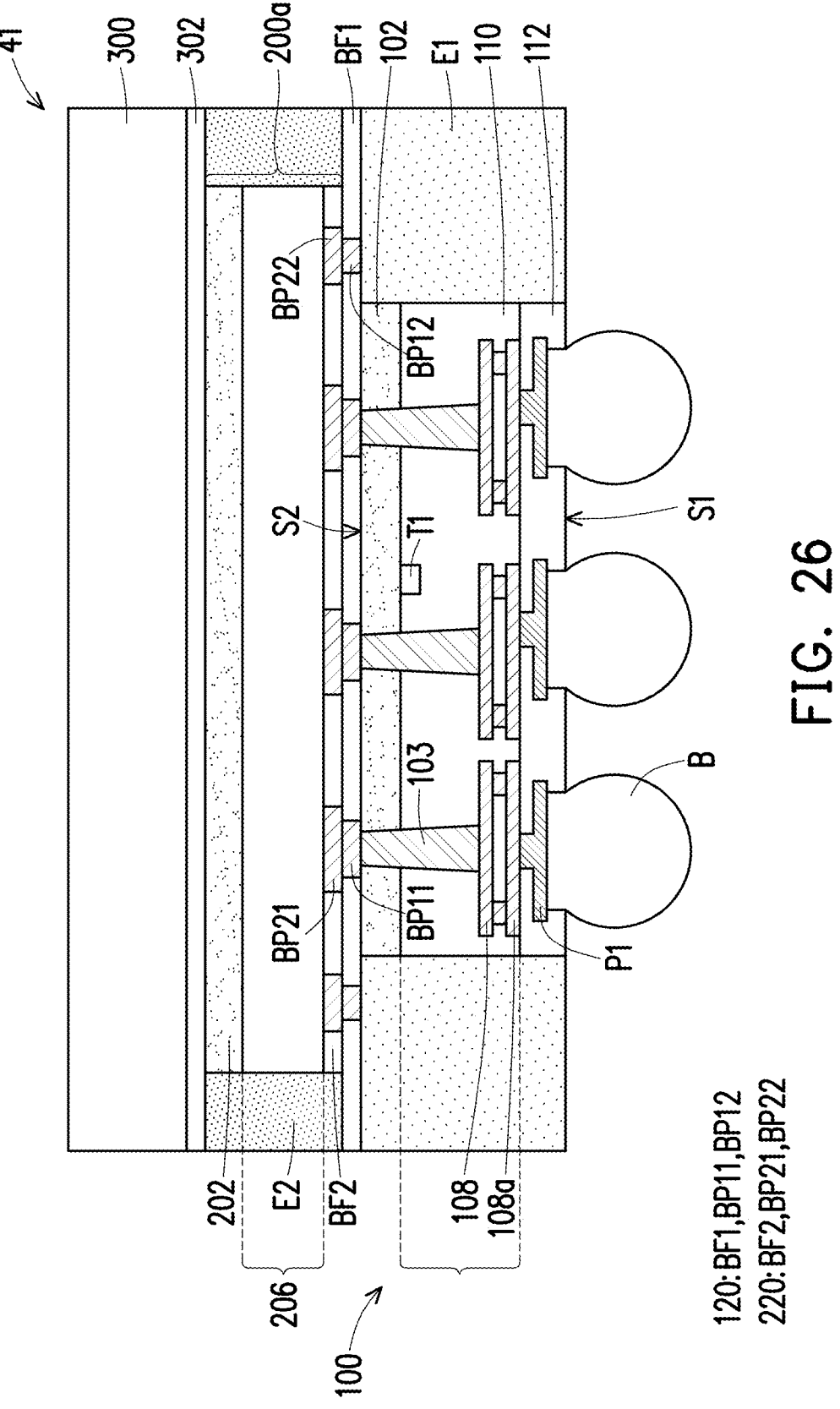
Figure 27:
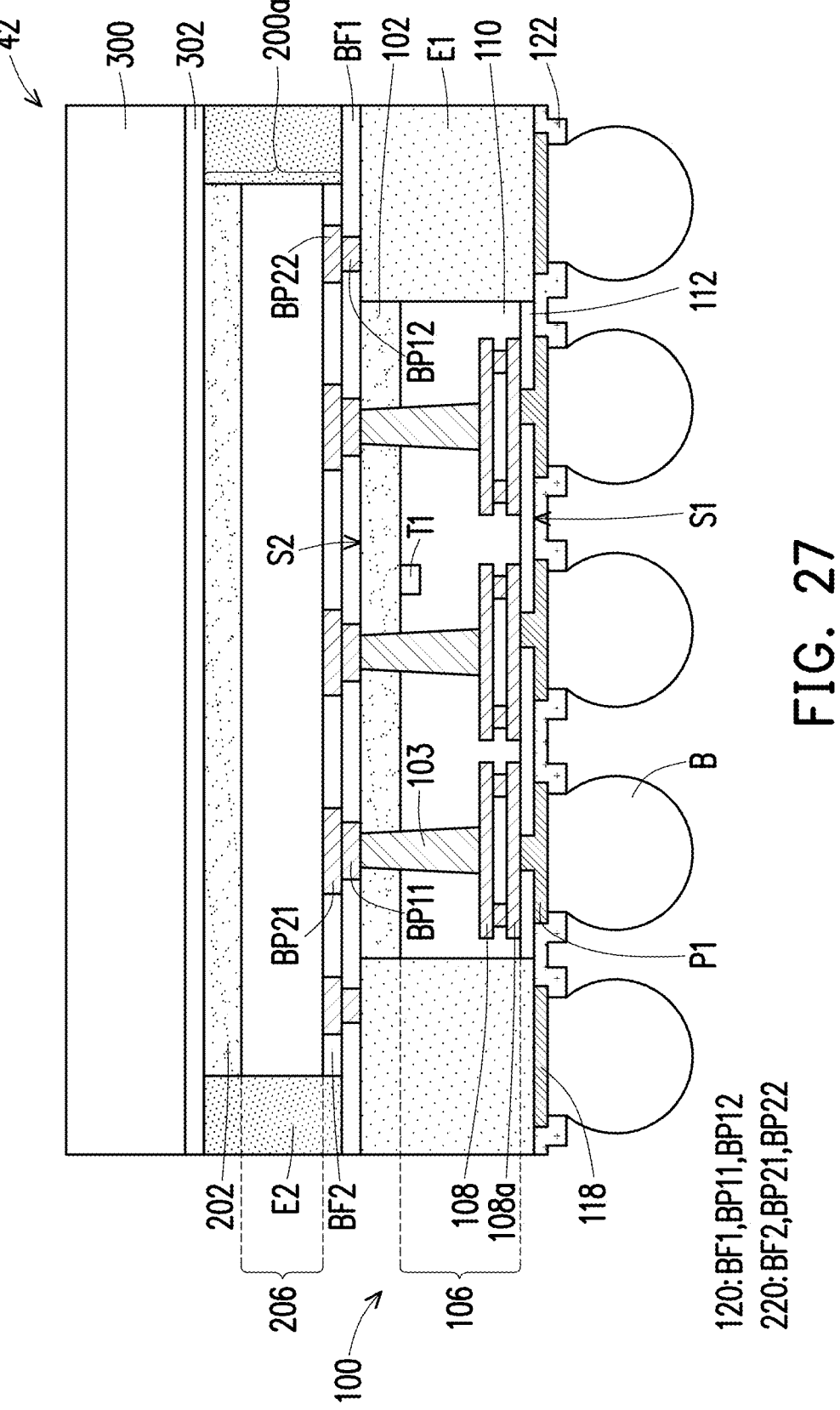

In some embodiments, a support member 300 is further included in the semiconductor package of the disclosure, as shown in FIGS. 26 and 27.

The semiconductor package 41 of FIG. 26 is similar to the semiconductor package 11 of FIG. 11, wherein like reference numerals refer to like elements. The materials and configurations of elements of FIG. 26 may refer to those of similar elements described in the previous embodiments. The semiconductor package 41 of FIG. 26 may be beneficial for product rigidity.

As shown in FIG. 26, in the semiconductor package 41, a semiconductor die 200a is provided and bonded to the semiconductor die 100. The semiconductor die 200a may have a structure similar to that of the semiconductor die 200-2 described in FIG. 24. In some embodiments, a support member 300 is further included in the semiconductor package 41. The support member 300 is disposed over the semiconductor die 200a and the dielectric encapsulation layer E2. In some embodiments, the support member 300 may be a substrate including a semiconductor material, an inorganic material, an insulating material or a combination thereof. For example, the support member 300 includes silicon, ceramic, quartz or the like. In some embodiments, the support member 300 includes a bonding film 302 formed thereon. The support member 300 may be a glass wafer, and the bonding film 302 may be an adhesive material. The bonding film 302 may include an oxide layer, a die attach tape (DAF) or a suitable adhesive. The support member 300 is bonded to the back surface of the semiconductor die 200a and the exposed surface of the dielectric encapsulation layer E2 through the bonding film 302. In some embodiments, a blanket bonding film may be provided between the bonding film 302 and the semiconductor substrate 202 and between bonding film 302 and the dielectric encapsulation layer E2, and the bonding film 302 may be bonded to the blanket bonding film through fusion bond. In some embodiments, the semiconductor die 200a may be replaced by a die stack including multiple dies vertically stacked, and the support member 300 is bonded to the uppermost die of the die stack. In some embodiments, a redistribution layer structure 119 as shown in FIG. 10 may be further included in the semiconductor package 41 upon the process requirements.

The semiconductor package 42 of FIG. 27 is similar to the semiconductor package 21 of FIG. 22, wherein like reference numerals refer to like elements. The materials and configurations of elements of FIG. 27 may refer to those of similar elements described in the previous embodiments. The semiconductor package 42 of FIG. 27 may be beneficial for product rigidity.

As shown in FIG. 27, in the semiconductor package 42, a semiconductor die 200a is provided and bonded to the semiconductor die 100. The semiconductor die 200a may have a structure similar to that of the semiconductor die 200-2 described in FIG. 25, wherein like reference numerals refer to like elements. In some embodiments, a support member 300 further included in the semiconductor package 42. In some embodiments, the support member 300 includes a bonding film 302 formed thereon. The materials and configurations of the support member 300 and the bonding film 302 may refer to those described in the previous embodiments in FIG. 26.

Figure 28:
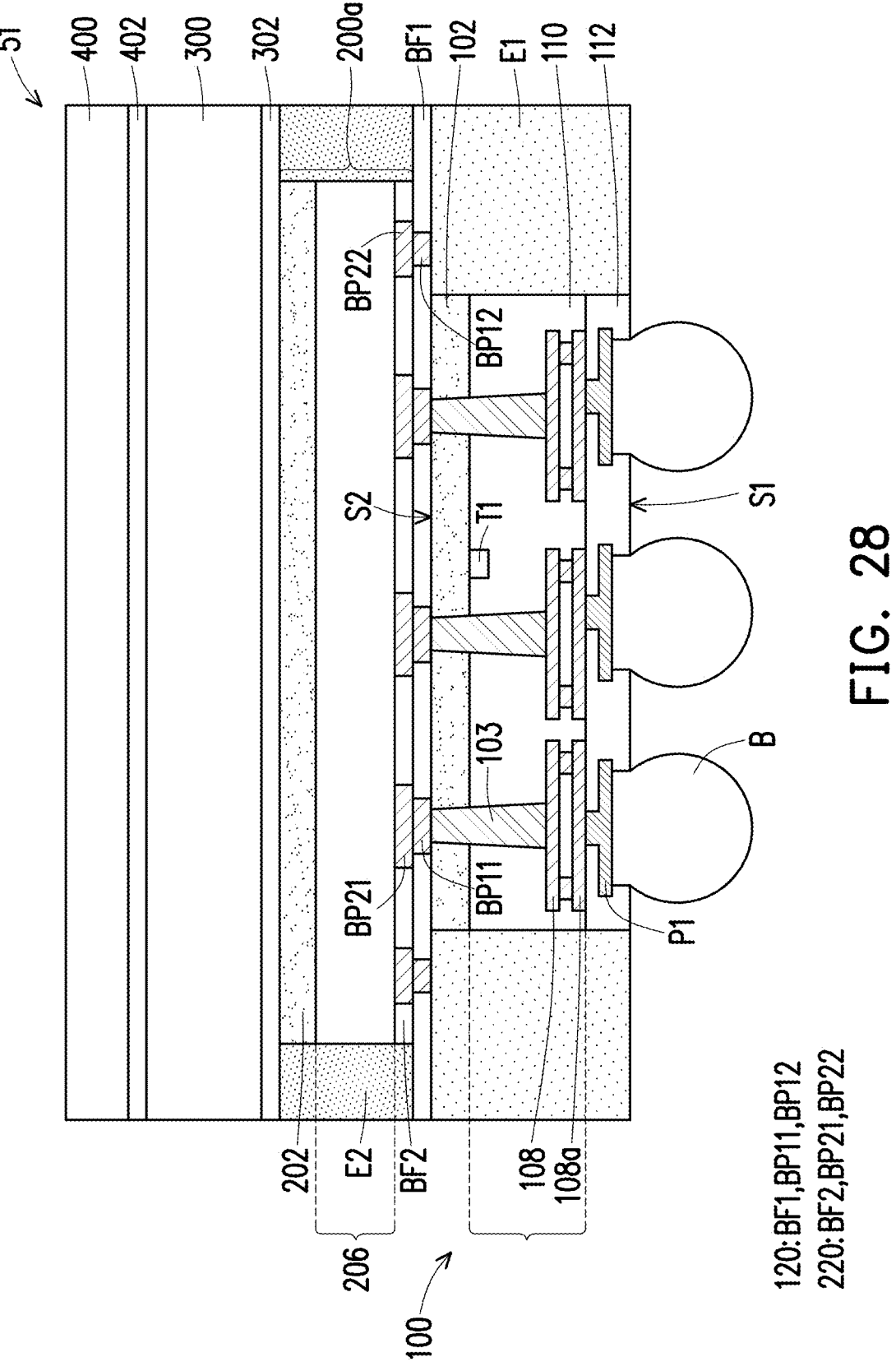
Figure 29:
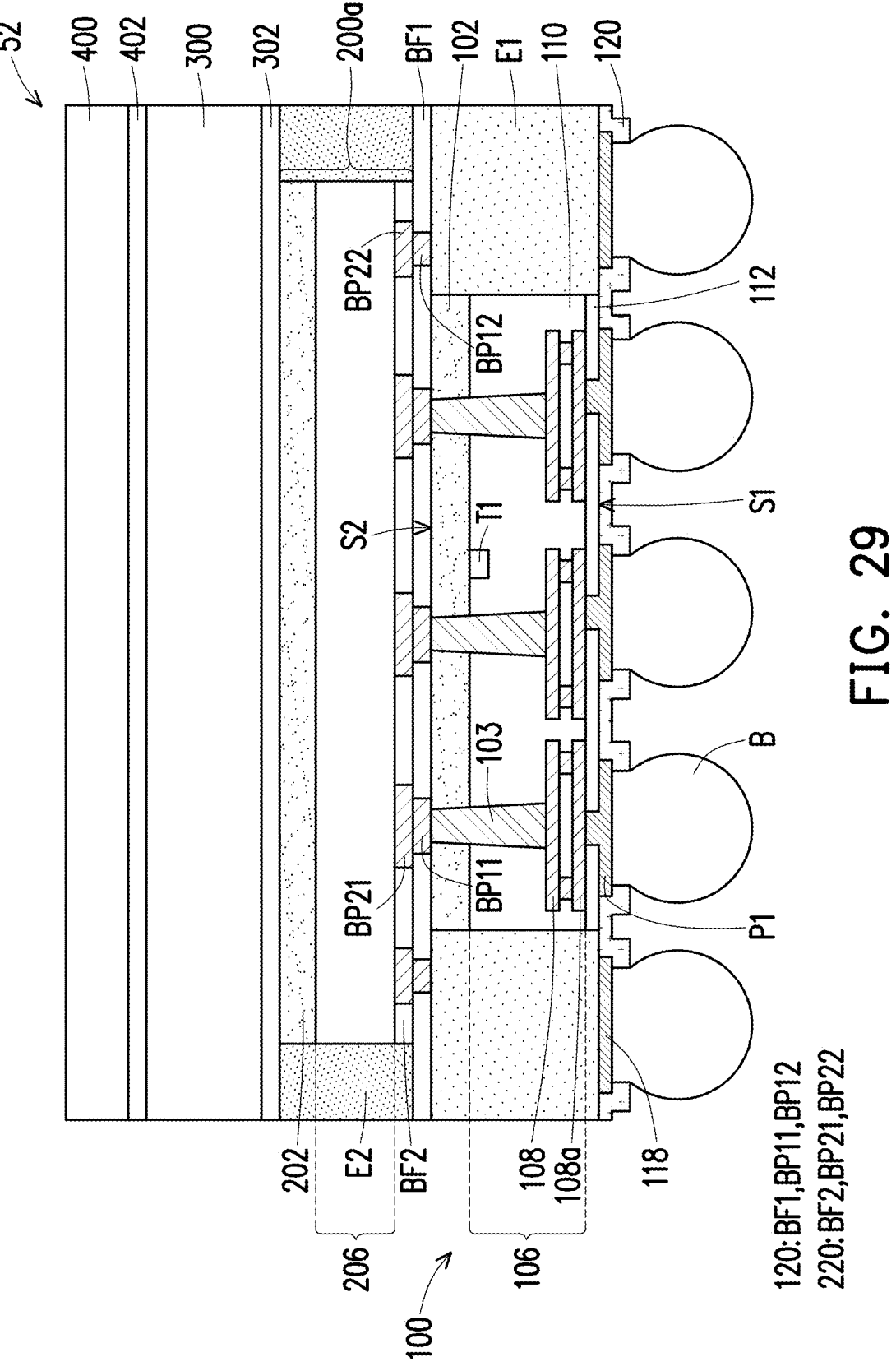

In some embodiments, a heat spreader 400 is further included in the semiconductor packages of FIGS. 28 and 29.

The semiconductor package 51 of FIG. 28 is similar to the semiconductor package 41 of FIG. 26, wherein like reference numerals refer to like elements. The materials and configurations of elements of FIG. 28 may refer to those of similar elements described in the previous embodiments. The semiconductor package 51 of FIG. 28 is beneficial for product rigidity and heat dissipation efficiency.

As shown in FIG. 28, a heat spreader 400 is further included in the semiconductor package 51. The heat spreader 400 is mounted on the support member 300. In some embodiments, the heat spreader 400 may be formed from a material with high thermal conductivity, such as steel, stainless steel, copper, a combination thereof, or the like. In some embodiments, the heat spreader 400 is coated with metal, such as gold, nickel, or the like. In some embodiments, the heat spreader 400 is a single contiguous material. In some embodiments, the heat spreader 400 includes multiple pieces that may be the same or different materials. In some embodiments, the heat spreader 400 is a cold plate with a plurality of cold pipes therein. In some embodiments, the cold pipes may be arranged at an equal interval across the semiconductor package. In some embodiments, the cold pipes may be arranged near the hot spot of the semiconductor package. In some embodiments, the heat spreader 400 is adhered to the support member 300 through a thermal interface material (TIM) 402. In some embodiments, the TIM 402 may include epoxy, glue, or the like, and may be a thermally conductive material. In some embodiments, the TIM 402 may be a polymeric material, solder paste, indium solder paste, or the like. In some embodiments, the support member 300 and the underlying bonding film 302 may be omitted from the semiconductor package 51 of FIG. 28, and the TIM 402 is in physical contact with the backside of the semiconductor die 200a and the dielectric encapsulation layer E2. In some embodiments, a redistribution layer structure 119 as shown in FIG. 10 may be further included in the semiconductor package 51 upon the process requirements.

The semiconductor package 52 of FIG. 29 is similar to the semiconductor package 42 of FIG. 27, wherein like reference numerals refer to like elements. The materials and configurations of elements of FIG. 29 may refer to those of similar elements described in the previous embodiments. The semiconductor package 52 of FIG. 29 is beneficial for product rigidity and heat dissipation efficiency.

As shown in FIG. 29, a heat spreader 400 is further included in the semiconductor package 52. In some embodiments, the heat spreader 400 is adhered to the support member 300 through a thermal interface material (TIM) 402. The materials and configurations of the heat spreader 400 and the TIM 402 may refer to those described in the previous embodiments in FIG. 28. In some embodiments, the support member 300 and the underlying bonding film 302 may be omitted from the semiconductor package 52 of FIG. 29, and the TIM 402 is in physical contact with the backside of the semiconductor die 200a and the dielectric encapsulation layer E2. In some embodiments, a redistribution layer structure 119 as shown in FIG. 21 may be further included in the semiconductor package 52 upon the process requirements. In some embodiments, through dielectric vias 111 as shown in FIG. 23 may be further included in the semiconductor package 52.

In the embodiments of FIGS. 26 and 27, the support member 300 is wider than the underlying semiconductor die 200a. For example, the width of the support member 300 is the same as the total width of the underlying SoIC structure, which is equal to the width of the semiconductor die 200a and the width of the dielectric encapsulation layer E2. In the embodiments of FIGS. 26 and 27, the bottom surface of support member 300 is physical contact with the backside of the semiconductor die 200a and the top surface of the dielectric encapsulation layer E2. However, the disclosure is not limited thereto.

Figure 30:
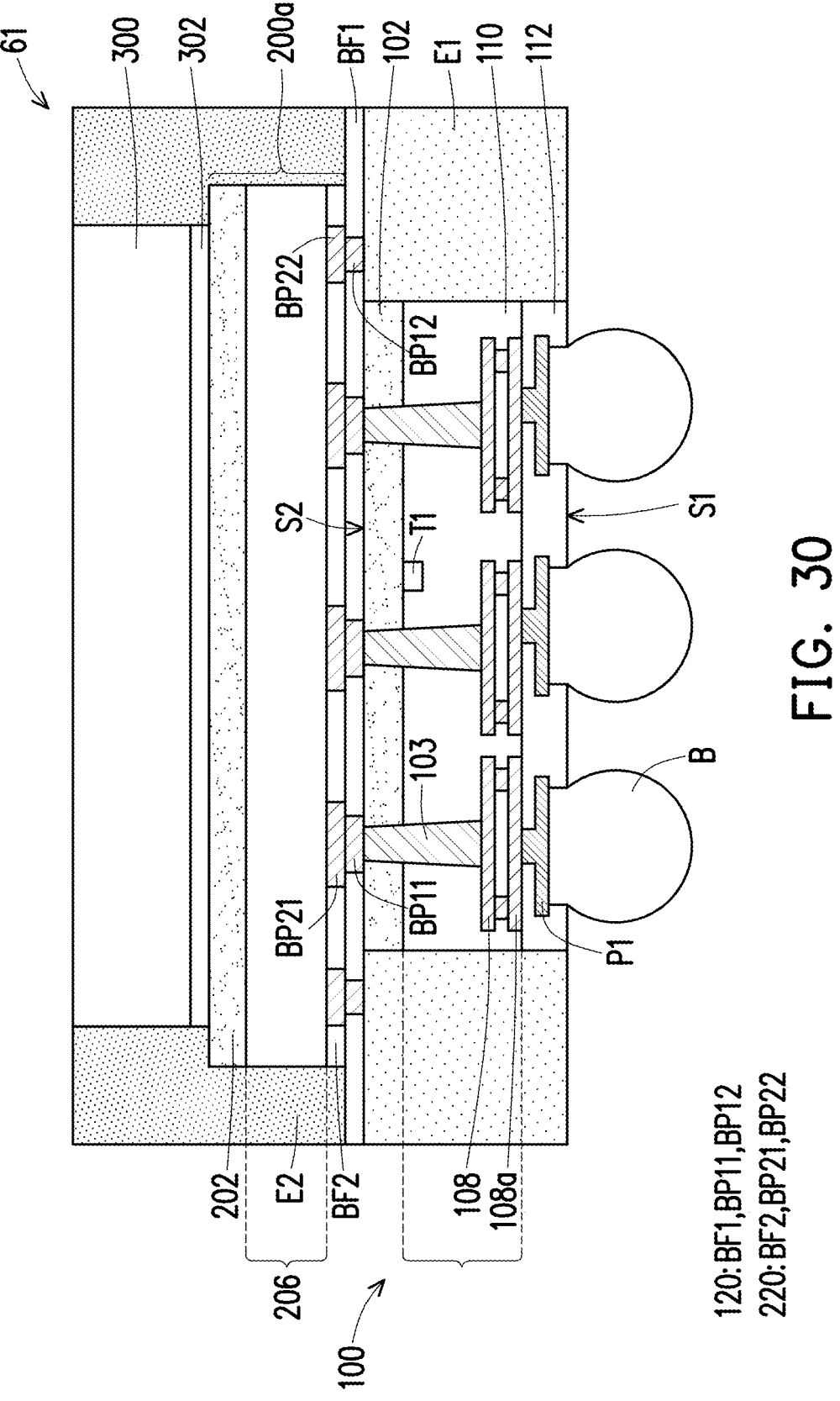
Figure 31:
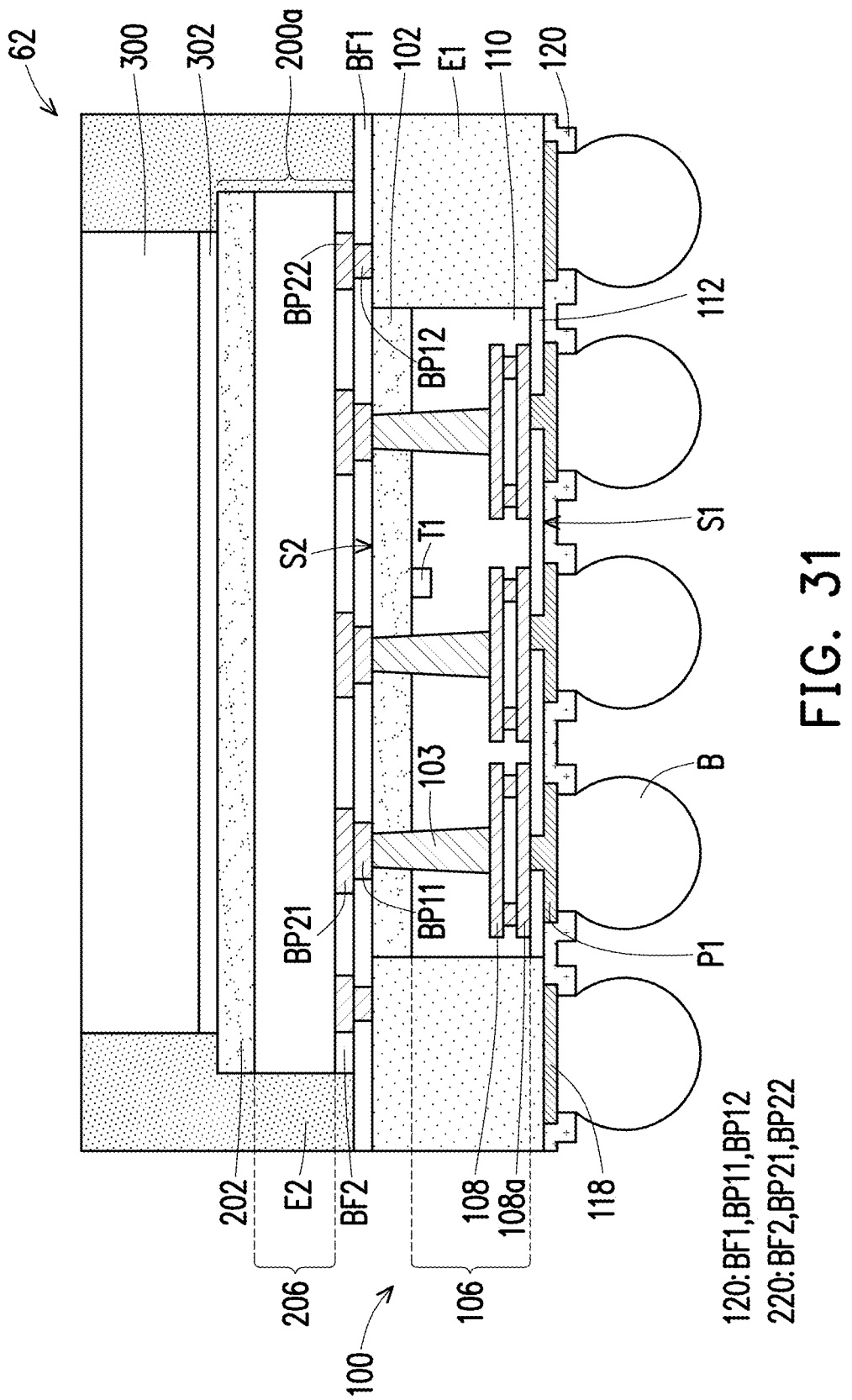

In other embodiments of FIGS. 30 and 31, the support member 300 is narrower than the underlying semiconductor die 200a. For example, the width of the support member 300 is less than the total width of the underlying SoIC structure. In the semiconductor packages 61 and 62 of FIGS. 30 and 31, the bottom surface of support member 300 is in physical contact with the backside of the semiconductor die 200a, and the dielectric encapsulation layer E2 laterally encapsulates the sidewalls of the semiconductor die 200a and the support member 300.

FIG. 32 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 500, a first semiconductor die is provided, wherein the first semiconductor die includes a first semiconductor substrate, first through substrate vias penetrating through the first semiconductor substrate, a first interconnect structure formed over a front surface of the first semiconductor substrate and electrically connected to the first through substrate vias, and a plurality of first die pads formed over and electrically connected to the first interconnect structure. FIG. 1 to FIG. 2 illustrates cross-sectional views corresponding to some embodiments of act 500. FIG. 11, FIG. 24, FIG. 26, FIG. 28 and FIG. 30 illustrate cross-sectional views corresponding to some embodiments of act 500.

At act 502, a first dielectric encapsulation layer is formed around the first semiconductor die. FIG. 3 to FIG. 4 illustrate cross-sectional views corresponding to some embodiments of act 502. FIG. 11, FIG. 24, FIG. 26, FIG. 28 and FIG. 30 illustrate cross-sectional views corresponding to some embodiments of act 502.

At act 504, a redistribution layer structure is formed over the first semiconductor die and the first dielectric encapsulation layer. FIG. 5 illustrates a cross-sectional view corresponding to some embodiments of act 504. Act 504 may be optionally omitted, as shown in FIG. 11, FIG. 24, FIG. 26, FIG. 28 and FIG. 30.

At act 506, a first bonding structure is formed over the first semiconductor die and the first dielectric encapsulation layer. FIG. 5 illustrates a cross-sectional view corresponding to some embodiments of act 506. FIG. 11, FIG. 24, FIG. 26, FIG. 28 and FIG. 30 illustrate cross-sectional views corresponding to some embodiments of act 506.

At act 508, a second semiconductor die is bonded to a back surface of the first semiconductor substrate of the first semiconductor die. FIG. 6 illustrates a cross-sectional view corresponding to some embodiments of act 508. FIG. 11, FIG. 24, FIG. 26, FIG. 28 and FIG. 30 illustrate cross-sectional views corresponding to some embodiments of act 508. In some embodiments, the second semiconductor die is bonded to the first semiconductor die through hybrid bonding.

At act 510, a third semiconductor die is bonded to the second semiconductor die. FIG. 24 illustrates a cross-sectional view corresponding to some embodiments of act 510. In some embodiments, act 510 may be optionally omitted as needed. In other embodiments, act 510 may be repeated multiple times until the desired number of semiconductor dies is vertically stacked. In some embodiments, the third semiconductor die is bonded to the second semiconductor die through hybrid bonding. In other embodiments, the third semiconductor die is bonded to the second semiconductor die through solder joint.

At act 512, a second dielectric encapsulation layer is formed around the second semiconductor die. FIG. 7 illustrates a cross-sectional view corresponding to some embodiments of act 512. FIG. 11, FIG. 24, FIG. 26, FIG. 28 and FIG. 30 illustrate cross-sectional views corresponding to some embodiments of act 512. In some embodiments, the second dielectric encapsulation layer is formed around the third semiconductor die, as shown in FIG. 24.

At act 514, a plurality of bumps is formed over the first die pads of the first semiconductor die. FIG. 8 to FIG. 10, FIG. 11, FIG. 24, FIG. 26, FIG. 28 and FIG. 30 illustrate cross-sectional views corresponding to some embodiments of act 514.

At act 516, a support member is formed over the second semiconductor die. FIG. 26, FIG. 28 and FIG. 30 illustrate cross-sectional views corresponding to some embodiments of act 516. Act 516 may be optionally omitted.

At act 518, a heat spreader is formed over the support member. FIG. 28 illustrates a cross-sectional view corresponding to some embodiments of act 518. Act 518 may be optionally omitted.

FIG. 33 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 600, a first semiconductor die is provided, wherein the first semiconductor die includes a first semiconductor substrate, first through substrate vias penetrating through the first semiconductor substrate, and a first interconnect structure formed over the first semiconductor substrate and electrically connected to the first through substrate vias. FIG. 12 to FIG. 13 illustrate cross-sectional views corresponding to some embodiments of act 600. FIGS. 22-23, FIG. 25, FIG. 27, FIG. 29 and FIG. 31 illustrate cross-sectional views corresponding to some embodiments of act 600.

At act 602, a first dielectric encapsulation layer is formed around the first semiconductor die. FIG. 14 to FIG. 15 illustrate cross-sectional views corresponding to some embodiments of act 602. FIGS. 22-23, FIG. 25, FIG. 27, FIG. 29 and FIG. 31 illustrate cross-sectional views corresponding to some embodiments of act 602.

At act 604, a redistribution layer structure is formed over the first semiconductor die and the first dielectric encapsulation layer. FIG. 16 illustrates a cross-sectional view corresponding to some embodiments of act 604. FIG. 23 illustrates a cross-sectional view corresponding to some embodiments of act 604. Act 604 may be optionally omitted, as shown in FIG. 22, FIG. 25, FIG. 27, FIG. 29 and FIG. 31.

At act 606, a first bonding structure is formed over the first semiconductor die and the first dielectric encapsulation layer. FIG. 16 illustrates a cross-sectional view corresponding to some embodiments of act 606. FIGS. 22-23, FIG. 25, FIG. 27, FIG. 29 and FIG. 31 illustrate cross-sectional views corresponding to some embodiments of act 606.

At act 608, a second semiconductor die is bonded to a back surface of the first semiconductor substrate of the first semiconductor die. FIG. 17 illustrates a cross-sectional view corresponding to some embodiments of act 608. FIGS. 22-23, FIG. 25, FIG. 27, FIG. 29 and FIG. 31 illustrate cross-sectional views corresponding to some embodiments of act 608. In some embodiments, the second semiconductor die is bonded to the first semiconductor die through hybrid bonding.

At act 610, a third semiconductor die is bonded to the second semiconductor die. FIG. 25 illustrates a cross-sectional view corresponding to some embodiments of act 610. In some embodiments, act 610 may be optionally omitted. In some embodiments, act 610 may be repeated multiple times until the desired number of semiconductor dies is vertically stacked. In some embodiments, the third semiconductor die is bonded to the second semiconductor die through hybrid bonding. In some embodiments, the third semiconductor die is bonded to the second semiconductor die through solder joint.

At act 612, a second dielectric encapsulation layer is formed around the second semiconductor die. FIG. 18 illustrates a cross-sectional view corresponding to some embodiments of act 612. FIGS. 22-23, FIG. 25, FIG. 27, FIG. 29 and FIG. 31 illustrate cross-sectional views corresponding to some embodiments of act 612. In some embodiments, the second dielectric encapsulation layer is formed around the third semiconductor die, as shown in FIG. 25.

At act 614, a plurality of first die pads are formed over a front surface of the first semiconductor substrate and within a chip region of the first semiconductor die, wherein the plurality of first die pads physically connect top metal patterns of the first interconnect structure. FIG. 19 illustrates a cross-sectional view corresponding to some embodiments of act 614. FIGS. 22-23, FIG. 25, FIG. 27, FIG. 29 and FIG. 31 illustrate cross-sectional views corresponding to some embodiments of act 614.

At act 616, a plurality of redistribution patterns are formed aside the plurality of first die pads and outside of the chip region of the first semiconductor die. FIG. 19 to FIG. 21 illustrate cross-sectional views corresponding to some embodiments of act 616. FIGS. 22-23, FIG. 25, FIG. 27, FIG. 29 and FIG. 31 illustrate cross-sectional views corresponding to some embodiments of act 616. In some embodiments, act 614 and act 616 are performed simultaneously, so the first die pads and the redistribution patterns are made by the same material. In some embodiments, act 614 and act 616 may be performed separately, so the first die pads and the redistribution patterns may include different materials. Act 616 may be optionally omitted.

At act 618, a plurality of bumps is formed over the first die pads of the first semiconductor die and the redistribution patterns. FIG. 19 to FIG. 21 illustrate cross-sectional views corresponding to some embodiments of act 618. FIGS. 22-23, FIG. 25, FIG. 27, FIG. 29 and FIG. 31 illustrate cross-sectional views corresponding to some embodiments of act 618.

At act 620, a support member is formed over the second semiconductor die. FIG. 27, FIG. 29 and FIG. 31 illustrate cross-sectional views corresponding to some embodiments of act 620. Act 620 may be optionally omitted.

At act 622, a heat spreader is formed over the support member. FIG. 29 illustrates a cross-sectional view corresponding to some embodiments of act 622. Act 622 may be optionally omitted.

The above-mentioned "die pad first" process and "die pad last" process can be applied to other semiconductor packages, so as to enhance the signal transmission performance by placing the key semiconductor die close to the ball array.

FIG. 34 to FIG. 39 are cross-sectional views schematically illustrating semiconductor packages in accordance with some embodiments of the present disclosure.

Some elements of semiconductor packages in FIG. 34 to FIG. 39 are similar to those described above, wherein like reference numerals refer to like elements. The materials and configurations of those elements of FIG. 34 to FIG. 39 may refer to those of similar elements described in the previous embodiments.

Figure 34:
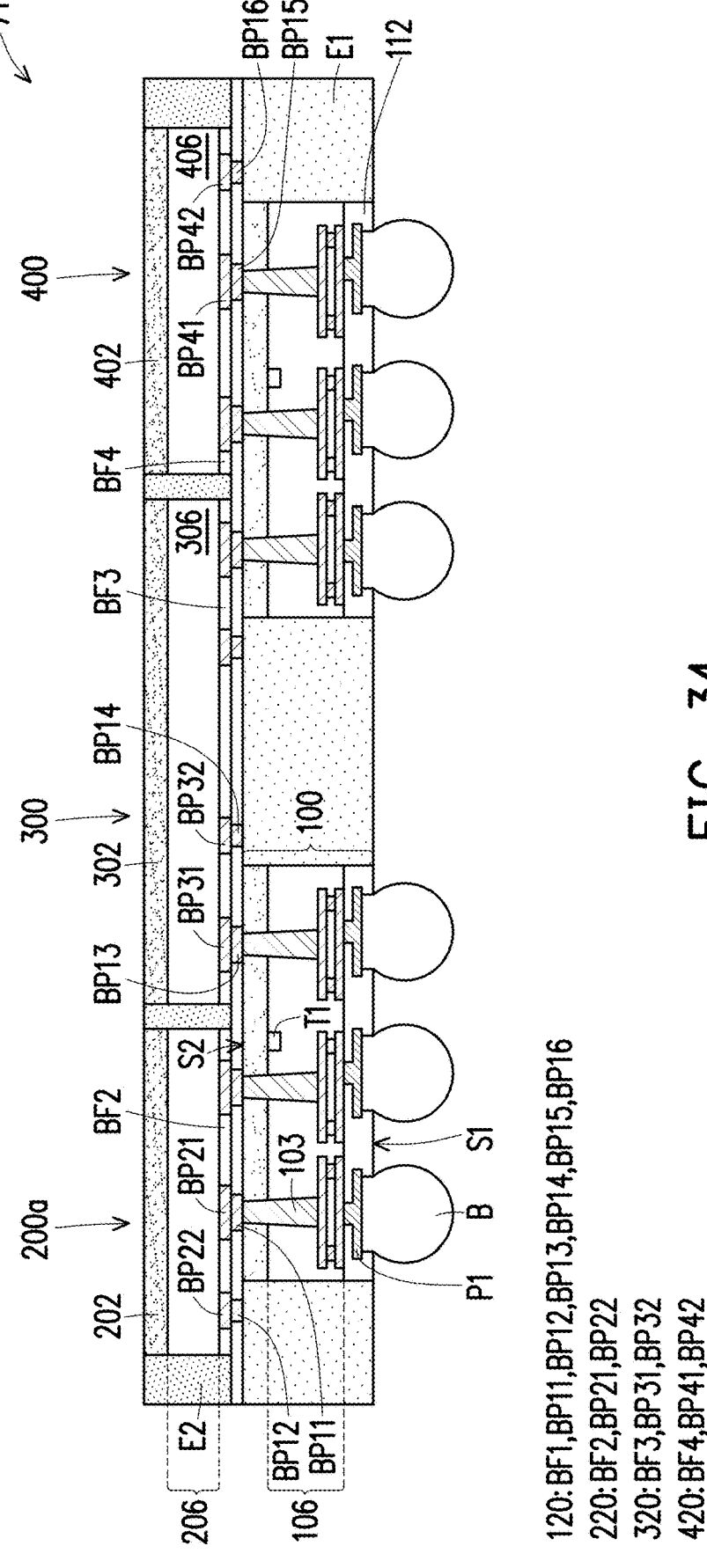
FIG. 34 to FIG. 39 are cross-sectional views schematically illustrating semiconductor packages in accordance with some embodiments of the present disclosure.

As shown in FIG. 34, a semiconductor package 71 includes two semiconductor dies 100, a dielectric encapsulation layer E1 and bumps B. The semiconductor package 71 is formed a "die pad first" process.

The two semiconductor dies 100 are disposed side-by-side. In some embodiments, each of the semiconductor dies 100 includes a front side S1 (e.g., front surface) and a backside S2 (e.g., back surface) opposite to the front side S1. In some embodiments, the semiconductor die 100 includes a semiconductor substrate 102, at least one device T1, an interconnect structure 106, die pads P1, and a passivation layer 112. The materials and configurations of elements of semiconductor die 100 may refer to the previous embodiments of FIG. 11. Throughout the description, the side of the semiconductor die 100 corresponding to the side of the semiconductor substrate having a device or active layer is referred to as the front side.

In some embodiments, the adjacent semiconductor dies 100 may have the same function. In some embodiments, the adjacent semiconductor dies 100 may have different functions. Additionally, the dimension of one of the semiconductor dies 100 may be similar to or different from the dimension of the other of the semiconductor dies 100. The dimension may be a height, a width, a size, a top-view area or a combination thereof.

The dielectric encapsulation layer E1 is around and between the semiconductor dies 100. In some embodiments, the top surface of the dielectric encapsulation layer E1 is substantially level, within process variations, with the exposed surfaces of the semiconductor substrates 102 of the semiconductor dies 100, and the bottom surface of the dielectric encapsulation layer E1 is substantially level, within process variations, with the exposed surfaces of the passivation layers 112 of the semiconductor dies 100.

The bumps B are disposed at front sides S1 of the semiconductor dies 100 and in physical contact with die pads P1 of the semiconductor dies 100. The element relationship between the bumps B, the die pads P1 and the passivation layer 112 may refer to the previous embodiments of FIG. 11.

In some embodiments, the semiconductor package 71 further includes a semiconductor die 200*a* disposed over one of the semiconductor dies 100. The semiconductor die 200*a* may be electrically coupled to one or more of the semiconductor dies 100. In some embodiments, the semiconductor die 200*a* contains active devices or functional devices, such as transistors, capacitors, resistors, diodes, photodiodes, fuse devices and/or other similar devices. The semiconductor die 200*a* is called a "device-containing die" in some examples. In some embodiments, the semiconductor die 200*a* includes a semiconductor substrate 202, an interconnection structure 206 disposed over the semiconductor substrate 202, and a bonding structure 220 disposed over the interconnect structure 206. In some embodiments, the bonding structure 220 includes at least one bonding film BF2 and bonding metal features embedded in the bonding film BF2. In some embodiments, the bonding metal features include bonding pads BP21 and BP22. The materials and configurations of elements of the semiconductor die 200*a* may refer to the previous embodiments of FIG. 26.

In some embodiments, the semiconductor package 71 further includes a semiconductor die 400 disposed over another of the semiconductor dies 100. The semiconductor die 400 may be electrically coupled to one or more of the semiconductor dies 100. In some embodiments, the semiconductor die 400 has a structure similar to the semiconductor die 200*a*. For example, the semiconductor die 400 includes a semiconductor substrate 402, an optional interconnection structure 406 disposed over the semiconductor substrate 402, and a bonding structure 420 disposed over the interconnect structure 406. The interconnection structure 406 may be omitted. In some embodiments, the bonding structure 420 includes at least one bonding film BF4 and bonding metal features embedded in the bonding film BF2. In some embodiments, the bonding metal features include bonding pads BP41 and BP42.

In some embodiments, the semiconductor die 400 is a dummy semiconductor die. Herein, the term "dummy semiconductor die" indicates a non-operating die, a die configured for non-use, a die without devices therein or a die used only to electrically couple together two other dies in the die stack. In some embodiments, a dummy semiconductor die is substantially free of any active devices or functional devices, such as transistors, capacitors, resistors, diodes, photodiodes, fuse devices and/or other similar devices. In some embodiments, a dummy semiconductor die can be constructed without an active component, a passive component or both. The semiconductor die 400 is called a "device-free die" in some examples. However, a dummy semiconductor die can include a conductive feature electrically connected to the adjacent die(s). In some embodiments, the conductive feature includes a through substrate via, a metal line, a metal plug, a metal pad or a combination thereof. Specifically, although the dummy semiconductor die of the application does not include a device, it can function as an electrical connector between adjacent dies. In some embodiments, the dummy semiconductor die of the application can be utilized to stiffen the package and protect the package against deformation. In some embodiments, the dummy semiconductor die of the application can be configured to reduce coefficient of thermal expansion (CTE) mismatch and improve the warpage profile of the resulting package. However, the disclosure is not limited thereto. In other embodiments, the semiconductor die 400 is an "active semiconductor die" or "device-containing die" upon the process requirements.

In some embodiments, the semiconductor package 71 further includes a bridge structure 300. The bridge structure 300 provides electrical routing between different dies, die stacks or interposers. The bridge structure 300 may include routing patterns disposed on/in a semiconductor substrate such as a silicon substrate. The routing patterns includes through substrate vias, lines, vias, pads and/or connectors. The bridge structure 300 is referred to as a "connection structure," "bridge die," or "silicon bridge" in some examples.

In some embodiments, the bridge structure 300 is electrically connected to the semiconductor dies 100, formed across the dielectric encapsulation layer E1 between the semiconductor dies 200*a* and 400. In other words, the bridge structure 300, the semiconductor dies 200*a* and 400 are located at a same level. In some embodiments, from the top view, the bridge structure 300 is partially overlapped with at least one of the semiconductor dies 100. In some embodiments, the bridge structure 300 has a structure similar to the semiconductor die 200*a*. For example, the bridge structure 300 includes a semiconductor substrate 302, an optional interconnection structure 306 disposed over the semiconductor substrate 302, and a bonding structure 320 disposed over the interconnect structure 306. The interconnection structure 306 may be omitted. In some embodiments, the bonding structure 320 includes at least one bonding film BF3 and bonding metal features embedded in the bonding film BF32. In some embodiments, the bonding metal features include bonding pads BP31 and BP32.

In some embodiments, the semiconductor dies 100 are at a same level, and the semiconductor dies 200a and 400 and the bridge structure 300 are located at a same level. The semiconductor dies 100 are regarded as "first-tier semiconductor dies" and the semiconductor dies 200a and 400 and the bridge structure 300 are regarded as "second-tier semiconductor dies" in some examples.

In some embodiments, the semiconductor package 71 further includes a bonding structure 120 between the first-tier semiconductor dies and the second-tier semiconductor dies. In some embodiments, the bonding structure 120 includes at least one bonding film BF1 and bonding metal features embedded in the bonding film BF1. In some embodiments, the bonding metal features include bonding pads BP11, BP12, BP13, BP14, BP15 and BP16.

In some embodiments, the semiconductor die 200a is bonded to the corresponding semiconductor die 100 through the bonding structure 220 and the bonding structure 120. Specifically, the bonding pads BP21 and BP22 of the bonding structure 220 are bonded to the bonding pads BP11 and BP12 of the bonding structure 120, and the bonding film BF2 of the bonding structure 220 is bonded to the bonding film BF1 of the bonding structure 120. Such bonding may be referred to as a "hybrid bonding." In some embodiments, the bonding pads BP11 and BP21 are referred to as "active bonding pads" because they are configured to provide both the bonding and electrical functions between adjacent dies. The bonding pads BP12 and BP22 are referred to as "dummy bonding pads" because they are configured to merely provide bonding function between adjacent dies.

In some embodiments, the bridge structure 300 is bonded to the corresponding semiconductor die 100 through the bonding structure 320 and the bonding structure 120. Specifically, the bonding pads BP31 and BP32 of the bonding structure 320 are bonded to the bonding pads BP13 and BP14 of the bonding structure 120, and the bonding film BF3 of the bonding structure 320 is bonded to the bonding film BF1 of the bonding structure 120. Such bonding is referred to as a "hybrid bonding." In some embodiments, the bonding pads BP13 and BP31 are referred to as "active bonding pads" because they are configured to provide both the bonding and electrical functions between adjacent dies. The bonding pads BP14 and BP32 are referred to as "dummy bonding pads" because they are configured to merely provide bonding function between adjacent dies.

In some embodiments, the semiconductor die 400 is bonded to the corresponding semiconductor die 100 through the bonding structure 420 and the bonding structure 120. For example, the bonding pads BP41 and BP42 of the bonding structure 420 are bonded to the bonding pads BP15 and BP16 of the bonding structure 120, and the bonding film BF4 of the bonding structure 420 is bonded to the bonding film BF1 of the bonding structure 120. Such bonding is referred to as a "hybrid bonding." In some embodiments, the bonding pads BP15 and BP41 are referred to as "active bonding pads" because they are configured to provide both the bonding and electrical functions between adjacent dies. The bonding pads BP16 and BP42 are referred to as "dummy bonding pads" because they are configured to merely provide bonding function between adjacent dies.

A dielectric encapsulation layer E2 is further included in the semiconductor package 71. In some embodiments, dielectric encapsulation layer E2 is around and between the semiconductor die 200a, the bridge structure 300 and the semiconductor 400. In some embodiments, the top surface of the dielectric encapsulation layer E2 is substantially level, within process variations, with the exposed surfaces of the semiconductor substrates of the semiconductor die 200a, the bridge structure 300 and the semiconductor 400, and the bottom surface of the dielectric encapsulation layer E2 is substantially level, within process variations, with the bonding films of the bonding structures 220, 320 and 420.

In some embodiments, a redistribution layer structure 119 as shown in FIG. 10 may be further included in the semiconductor package 71. In such case, the redistribution layer structure may be disposed between the bonding structure 120 and each of the dielectric encapsulation layer E1 and the semiconductor dies 100. In some embodiments, the support member 300 and/or the heat spreader 400 as shown in FIGS. 26, 28 and 30 may be optionally included in the semiconductor package 71.

Figure 35:
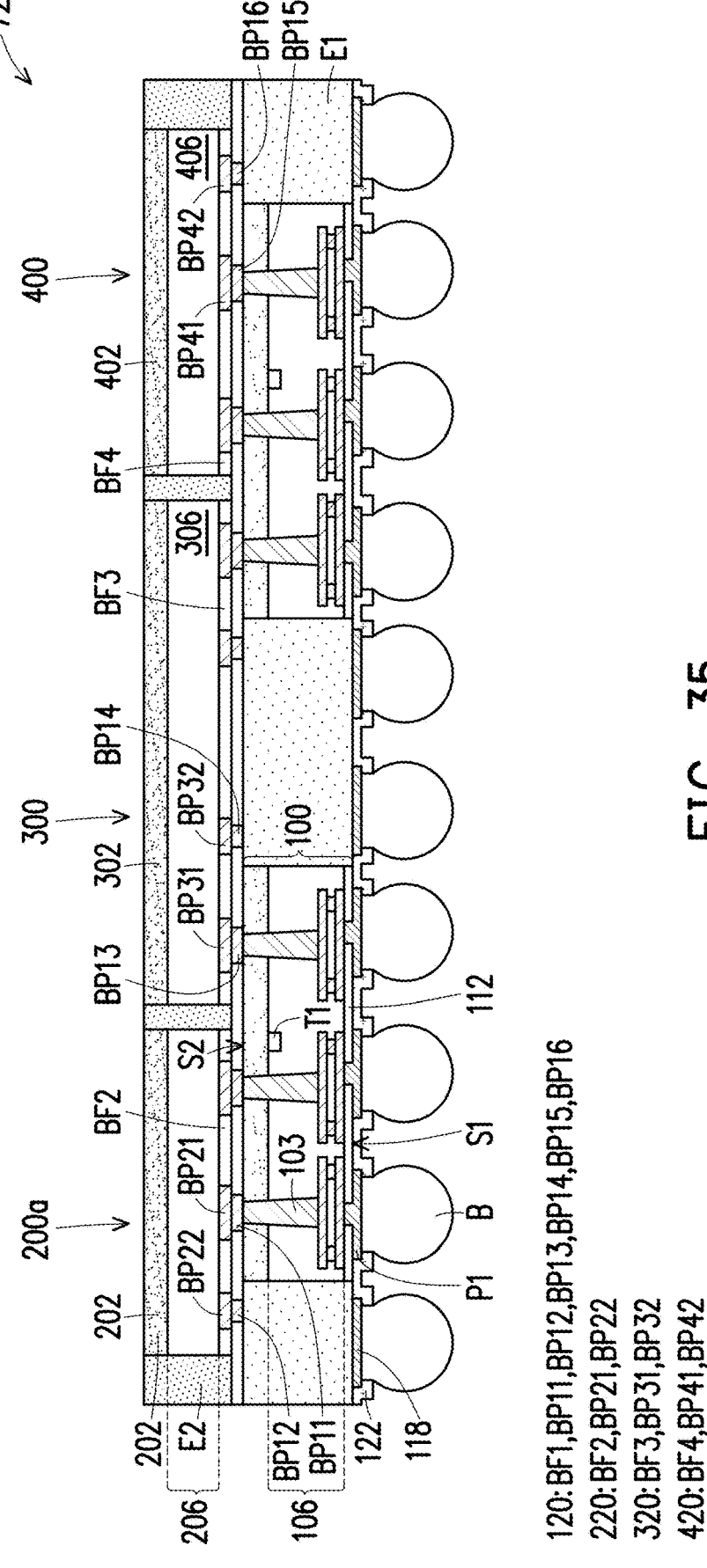

The semiconductor package 72 of FIG. 35 is similar to the semiconductor package 71 of FIG. 34, and the difference between them lies in the forming sequences of the die pads of the first-tier semiconductor dies. For example, the semiconductor package 71 of FIG. 34 is formed with a "die pad first" process while semiconductor package 72 of FIG. 35 is formed with a "die pad last" process, so the difference between them is described in details below and the similarity is not iterated herein. The materials and configurations of elements of FIG. 35 may refer to those of similar elements described in the previous embodiments. In the embodiments of FIG. 35, redistribution patterns 118 are disposed around and between the die pads P1 of the semiconductor dies 100, a passivation layer 122 is formed across the semiconductor dies 100 and the dielectric encapsulation layer E2, and bumps B penetrates through the passivation layer 112 and electrically connected to the die pads P1 and the redistribution patterns 118.

In some embodiments, a redistribution layer structure 119 as shown in FIG. 21 may be further included in the semiconductor package 72 upon the process requirements. In such case, the redistribution layer structure may be disposed between the bonding structure 120 and each of the dielectric encapsulation layer E1 and the semiconductor dies 100. In some embodiments, the support member 300 and/or the heat spreader 400 as shown in FIGS. 27, 29 and 31 may be optionally included in the semiconductor package 72 as needed. In some embodiments, through dielectric vias 111 as shown in FIG. 23 may be further included in the semiconductor package 72 as needed.

Figure 36:
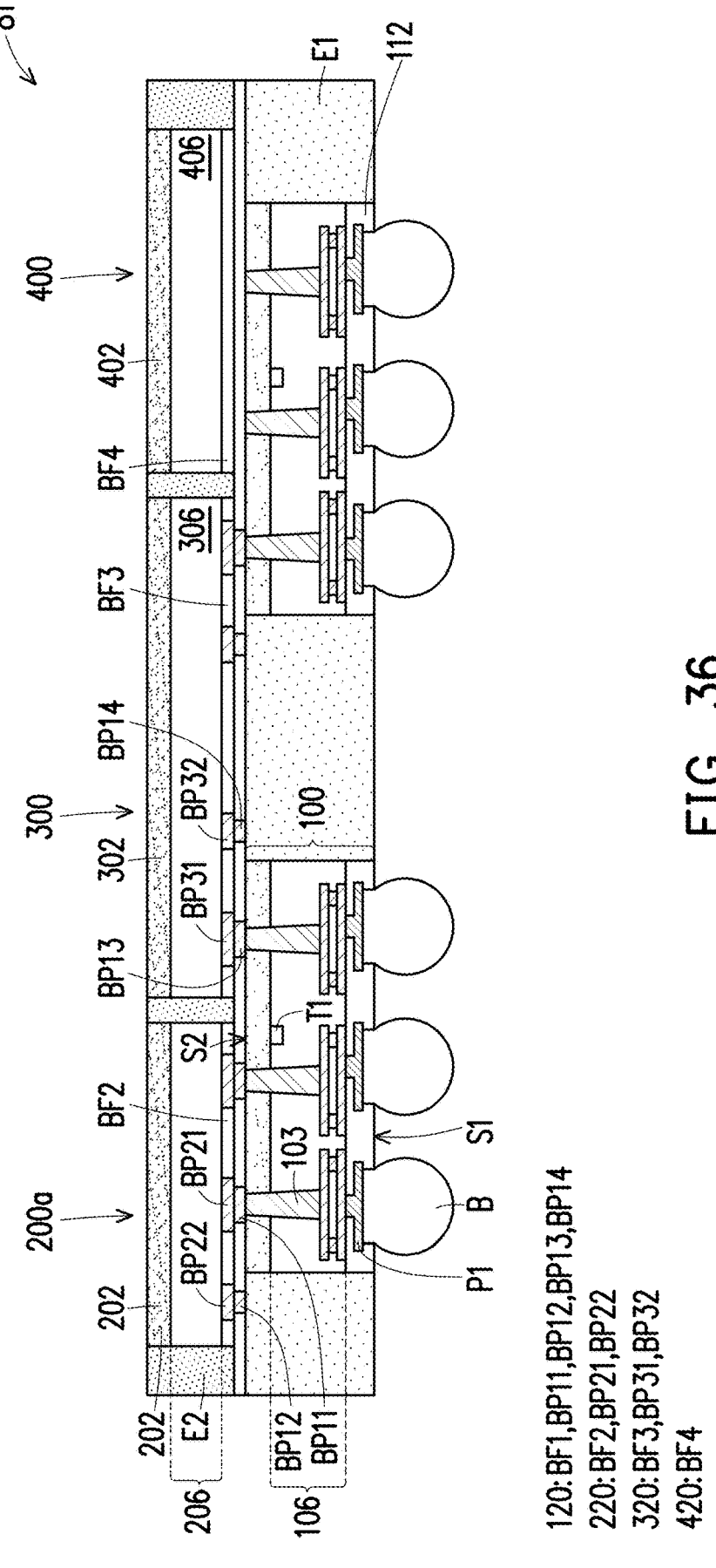

The semiconductor package 81 of FIG. 36 is similar to the semiconductor package 71 of FIG. 34, wherein the bonding mechanism between the semiconductor die 400 and the semiconductor die 100 differs. In the semiconductor package 71 of FIG. 34, the semiconductor die 400 is bonded to the semiconductor die 100 through hybrid bonding of the bonding structure 420 and the bonding structure 120. However, in the semiconductor package 81 of FIG. 36, the semiconductor die 400 is bonded to the semiconductor die 100 through fusion bonding of the bonding structure 420 and the bonding structure 120. For example, the bonding pads BP15 and BP16 of FIG. 34 are omitted from the bonding structure 120, and the bonding pads BP41 and BP42 of FIG. 34 are omitted from the bonding structure 420.

Figure 37:
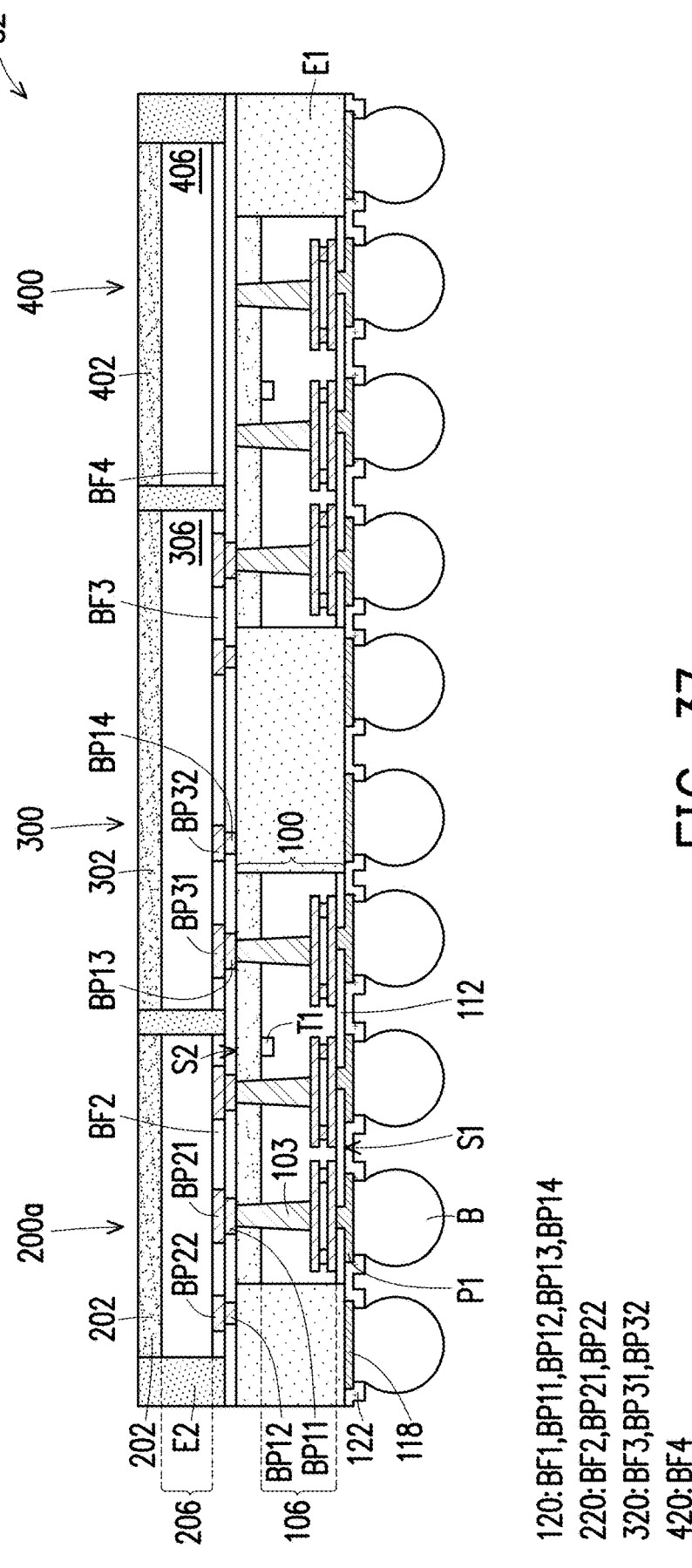

The semiconductor package 82 of FIG. 37 is similar to the semiconductor package 72 of FIG. 35, wherein the bonding mechanism between the semiconductor die 400 and the semiconductor die 100 differs. In the semiconductor package 72 of FIG. 35, the semiconductor die 400 is bonded to the semiconductor die 100 through hybrid bonding of the bonding structure 420 and the bonding structure 120. However, in the semiconductor package 82 of FIG. 37, the semiconductor die 400 is bonded to the semiconductor die 100 through fusion bonding of the bonding structure 420 and the bonding structure 120. For example, the bonding pads BP15 and BP16 of FIG. 35 are omitted from the bonding structure 120, and the bonding pads BP41 and BP42 of FIG. 35 are omitted from the bonding structure 420.

Figure 38:
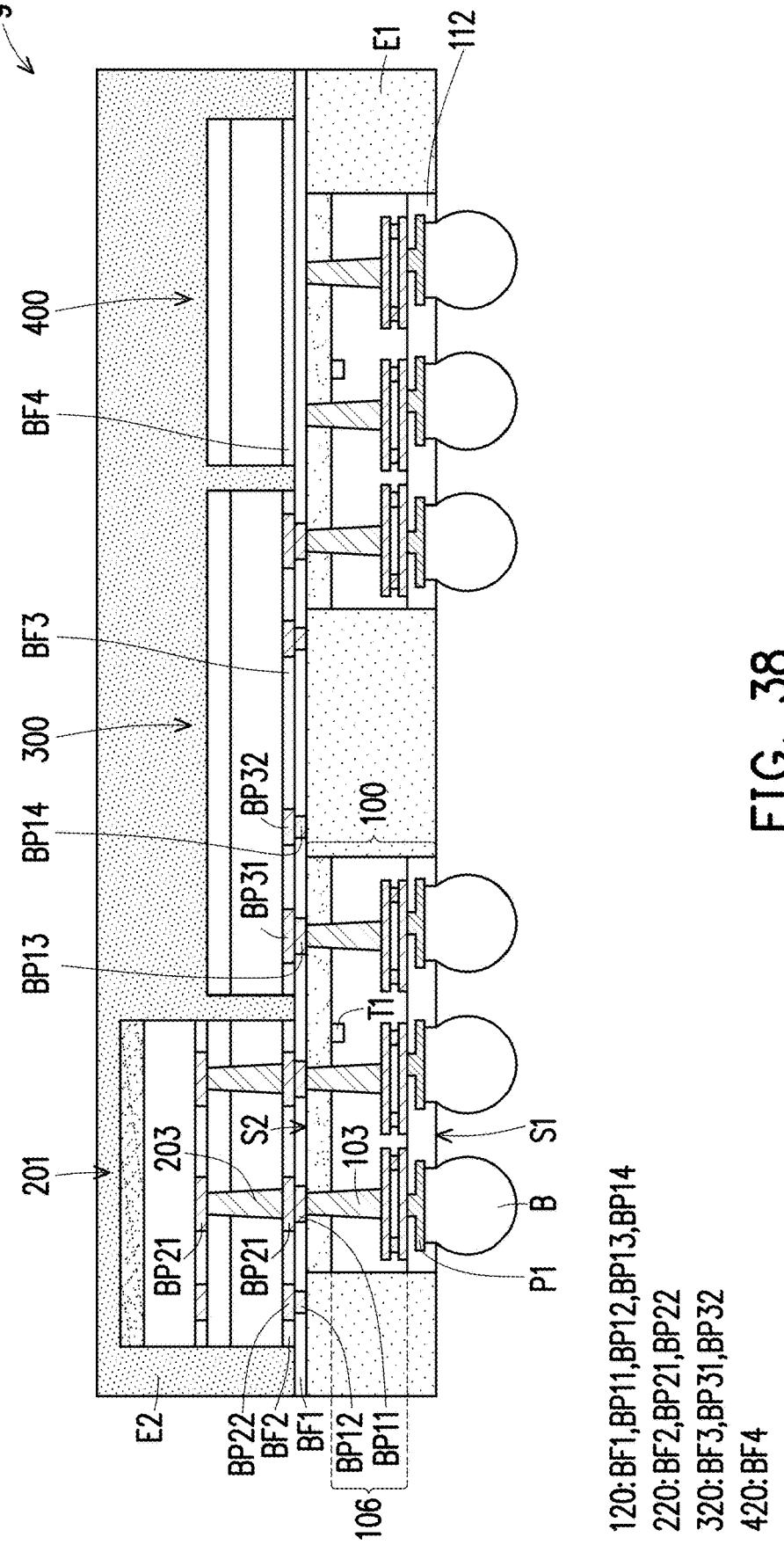

The semiconductor package 91 of FIG. 38 is similar to the semiconductor package 81 of FIG. 36, wherein the die configuration at the second-tier level of the semiconductor packages differs. For example, the semiconductor die 200*a* in the semiconductor package 81 of FIG. 36 is replaced by a die stack 201, and the dielectric encapsulation layer E2 is formed covering the sidewalls and tops of the die stack 201 and the sidewalls and tops of the semiconductor die 400 and the bridge structure 300. The materials and configurations of elements of the die stack 201 may refer to the previous embodiments of FIG. 24.

Figure 39:
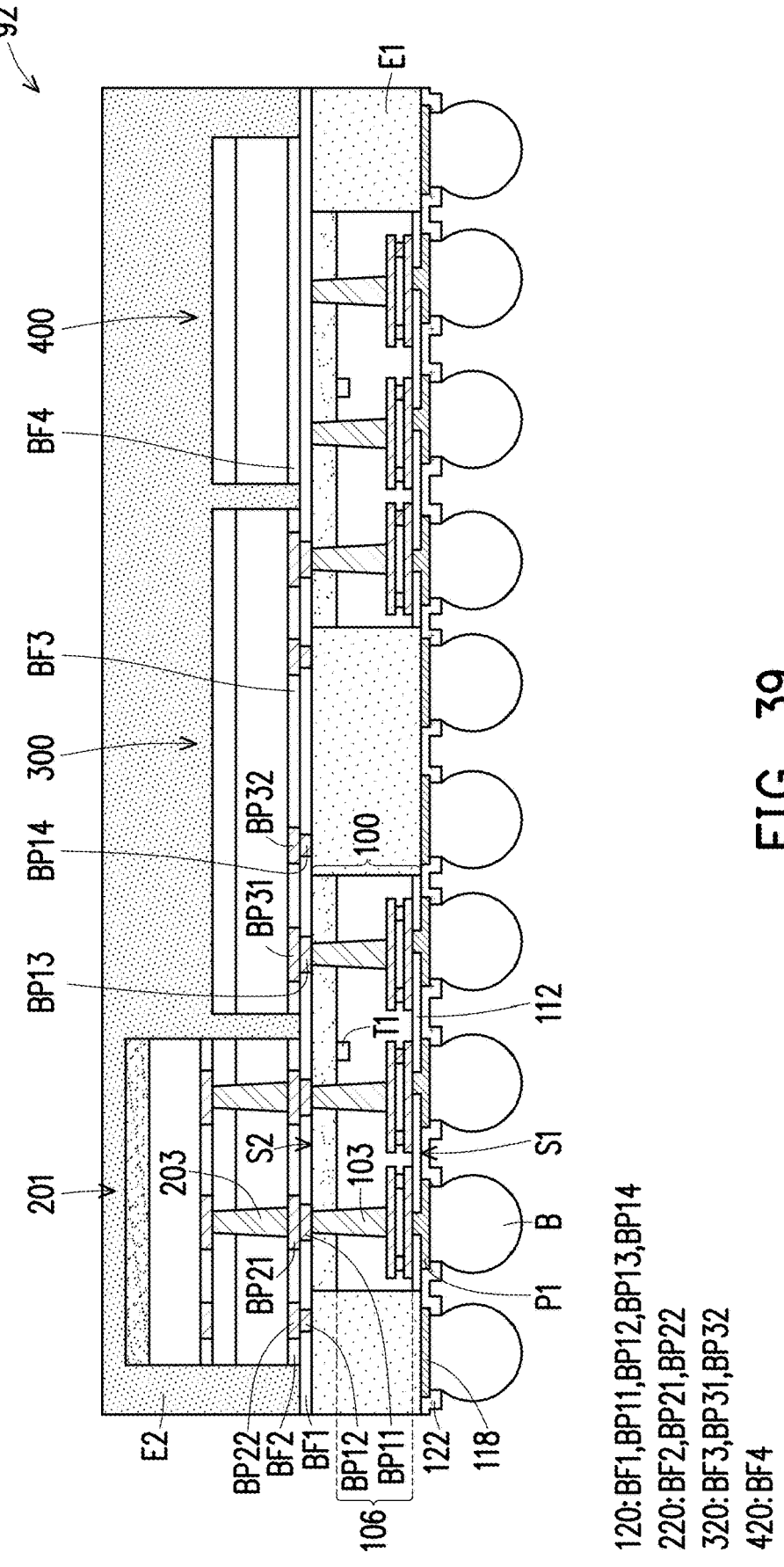

The semiconductor package 92 of FIG. 39 is similar to the semiconductor package 82 of FIG. 37, wherein the die configuration at the second-tier level of the semiconductor packages differs. For example, the semiconductor die 200*a* in the semiconductor package 82 of FIG. 37 is replaced by a die stack 201, and the dielectric encapsulation layer E2 is formed covering the sidewalls and tops of the die stack 201 and the sidewalls and tops of the semiconductor die 400 and the bridge structure 300. The materials and configurations of elements of the die stack 201 may refer to the previous embodiments of FIG. 25.

The structures of semiconductor packages of some embodiments are illustrated below with reference to FIG. 34-39.

In some embodiments, a semiconductor structure 71/72/81/82/91/92 includes two first semiconductor dies 100, bumps B, a first bonding structure 120 and a bridge structure 300. The two first semiconductor dies 100 are disposed side by side. The bumps B are disposed at front sides S1 of the first semiconductor dies 100 and in physical contact with first die pads P1 of the first semiconductor dies 100. The first bonding structure 120 is disposed at backsides S2 of the first semiconductor dies 100 and extends laterally beyond the first semiconductor dies 100, wherein the front side S1 is opposite to the backside S2. The bridge structure 300 is disposed over the first bonding structure 120 and between the first semiconductor dies 100.

In some embodiments, the semiconductor package 71/72/81/82/91/92 further includes a second semiconductor die 200*a* or a die stack 201 disposed over the first bonding structure 120 and corresponding to one of the first semiconductor dies 100.

In some embodiments, in the semiconductor package 71/72, the second semiconductor die 200*a* or the die stack 201 includes a second bonding structure 220, and the second bonding structure 220 is bonded to the first bonding structure 120 through hybrid bonding.

In some embodiments, in the semiconductor package 71/72/81/82/91/92, the semiconductor package further includes a dummy semiconductor die 400 disposed over the first bonding structure 120 and corresponding to one of the first semiconductor dies 100.

In some embodiments, in the semiconductor package 71/72, the dummy semiconductor die 400 includes a third bonding structure 420, and the third bonding structure 420 is bonded to the first bonding structure 120 through hybrid bonding.

In some embodiments, in the semiconductor package 81/82/91/92, the dummy semiconductor die 400 includes a third bonding structure 420, and the third bonding structure 420 is bonded to the first bonding structure 120 through fusion bonding.

FIG. 40 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The process flow of FIG. 40 are similar to that of FIG. 32, and the difference lies in the numbers of the semiconductor dies at the first-tier level and the second-tier level. Some components of the following acts may not be shown in FIGS. 34, 36 and 38, but they may be included in the semiconductor packages as needed.

At act 700, first-tier dies are provided, wherein the first tier dies include two first semiconductor die arranged side by side, and each of the first semiconductor dies includes a first semiconductor substrate, first through substrate vias penetrating through the first semiconductor substrate, a first interconnect structure formed over a front surface of the first semiconductor substrate and electrically connected to the first through substrate vias, and a plurality of first die pads formed over and electrically connected to the first interconnect structure.

At act 702, a first dielectric encapsulation layer is formed around the first semiconductor dies.

At act 704, a redistribution layer structure is formed over the first semiconductor dies and the first dielectric encapsulation layer. Act 704 may be optionally omitted.

At act 706, a first bonding structure is formed over the first semiconductor dies and the first dielectric encapsulation layer.

At act 708, second-tier dies are bonded to the first bonding structure, wherein the second-tier dies include a second semiconductor die or a die stack, a bridge structure and a third semiconductor die.

At act 710, a second dielectric encapsulation layer is formed around the second-tier dies.

At act 712, a plurality of bumps are formed over the first die pads of the first semiconductor dies.

At act 714, a support member is formed over the second-tier dies. Act 714 may be optionally omitted.

At act 716, a heat spreader is formed over the support member. Act 716 may be optionally omitted.

FIG. 41 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The process flow of FIG. 41 is similar to that of FIG. 33, wherein the numbers of the semiconductor dies at the first-tier level and the second-tier level differ. Some components of the following acts may not be shown in FIGS. 35, 37 and 39, but they may be included in the semiconductor packages.

At act 800, first-tier dies are provided, wherein the first tier dies include two first semiconductor die arranged side by side, and each of the first semiconductor dies includes a first semiconductor substrate, first through substrate vias penetrating through the first semiconductor substrate, and a first interconnect structure formed over the first semiconductor substrate and electrically connected to the first through substrate vias.

At act 802, a first dielectric encapsulation layer is formed around the first semiconductor dies.

At act 804, a redistribution layer structure is formed over the first semiconductor dies and the first dielectric encapsulation layer. Act 804 may be optionally omitted.

At act 806, a first bonding structure is formed over the first semiconductor dies and the first dielectric encapsulation layer, At act 808, second-tier dies are bonded to the first bonding structure, wherein the second-tier dies include a second semiconductor die or a die stack, a bridge structure and a third semiconductor die.

At act 810, a second dielectric encapsulation layer is formed around the second-tier dies.

At act 812, a plurality of first die pads are formed over a front surface of the first semiconductor substrate and within a chip region of each of the first semiconductor dies, wherein the plurality of first die pads physically connect top metal patterns of the first interconnect structure.

At act 814, a plurality of redistribution patterns are formed aside the plurality of first die pads and outside of the chip region of each of the first semiconductor dies. Act 814 may be optionally omitted.

At act 816, a plurality of bumps is formed over the first die pads of the first semiconductor dies and the redistribution patterns.

At act 818, a support member is formed over the second-tier dies. Act 818 may be optionally omitted.

At act 820, a heat spreader is formed over the support member. Act 820 may be optionally omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a first semiconductor die, a second semiconductor die and a plurality of bumps. The first semiconductor die has a front side and a backside opposite to each other. The second semiconductor die is disposed at the backside of the first semiconductor die and electrically connected to first semiconductor die. The plurality of bumps are disposed at the front side of the first semiconductor die and physically contact first die pads of the first semiconductor die. Besides, a size of the first semiconductor die is less than a size of the second semiconductor die.

In accordance with some embodiments of the disclosure, a semiconductor structure includes two first semiconductor dies, bumps, a first bonding structure and a bridge structure. The two first semiconductor dies are disposed side by side. The bumps are disposed at front sides of the first semiconductor dies and in physical contact with first die pads of the first semiconductor dies. The first bonding structure is disposed at backsides of the first semiconductor dies and extends laterally beyond the first semiconductor dies, wherein the front side is opposite to the backside. The bridge structure is disposed over the first bonding structure and between the first semiconductor dies.

In accordance with some embodiments of the disclosure, a method of forming a semiconductor package includes following operations. A first semiconductor die is provided, wherein the first semiconductor die includes a first semiconductor substrate, first through substrate vias penetrating through the first semiconductor substrate, and a first interconnect structure formed over the first semiconductor substrate and electrically connected to the first through substrate vias. The second semiconductor die is bonded to a back surface of the first semiconductor substrate of the first semiconductor die. A plurality of first die pads are formed over a front surface of the first semiconductor substrate and within a chip region of the first semiconductor die, wherein the plurality of first die pads physically connect top metal patterns of the first interconnect structure. A plurality of bumps is formed over the first die pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first semiconductor device, having a front side and a backside opposite to the front side, the first semiconductor device comprising die pads;
a first encapsulant laterally encapsulating the first semiconductor device;
a second semiconductor device disposed at the backside of the first semiconductor device and electrically connected to the first semiconductor device, a front side of the second semiconductor device facing the first semiconductor device, wherein the backside of the first semiconductor device is between the front side of the first semiconductor device and the second semiconductor device;
a backside redistribution layer over the backside of the first semiconductor device;
a first bonding structure disposed between the backside redistribution layer and the second semiconductor device, wherein the backside redistribution layer and the first bonding structure extend laterally beyond an edge of the first semiconductor device;

a second bonding structure bonded to the first bonding structure, wherein an edge of the second bonding structure is aligned with an edge of the second semiconductor device;

a front side redistribution pattern over the front side of the first semiconductor device, wherein the front side redistribution pattern includes contact pads over a surface of the first encapsulant; and a plurality of bumps, disposed at the front side of the first semiconductor device and physically contacting the contact pads of the front side redistribution pattern, wherein a width of the first semiconductor device is less than a width of the second semiconductor device.

2. The package of claim 1, wherein the first bonding structure comprises a first bond pad, wherein the second bonding structure comprises a second bond pad directly bonded to the first bond pad.

3. The package of claim 2, wherein a width of the first bond pad is greater than a width of the second bond pad.

4. The package of claim 2, wherein a width of the first bond pad is less than a width of the second bond pad.

5. The package of claim 2, wherein the first bond pad is electrically isolated from the first semiconductor device.

6. The package of claim 1, wherein a first bump of the plurality of bumps is below the first encapsulant along a line perpendicular to a major surface of the first semiconductor device.

7. The package of claim 1, further comprising:

a second encapsulant laterally encapsulating the second semiconductor device, wherein the second encapsulant contacts the first bonding structure.

8. A semiconductor package, comprising:

two first semiconductor dies, disposed side by side, the first semiconductor dies comprising first die pads at front sides of the first semiconductor dies;

a first encapsulant laterally encapsulating the first semiconductor dies;

a redistribution pattern extending over the first encapsulant;

bumps, disposed at the front sides of the first semiconductor dies and in physical contact with respective ones of the first die pads of the first semiconductor dies and respective conductive features of the redistribution pattern;

a first bonding structure, disposed at backsides of the first semiconductor dies and extending laterally beyond the first semiconductor dies, wherein the front sides of the first semiconductor dies are opposite to the backsides of the first semiconductor dies, wherein the first bonding structure comprises first bond pads;

a bridge structure, disposed over the first bonding structure and overlapping the first semiconductor dies, wherein the bridge structure is bonded to the first bonding structure through metal-to-metal bonds and dielectric-to-dielectric bonds; and a dummy semiconductor die disposed over the first bonding structure and overlapping one of the first semiconductor dies.

9. The package of claim 8, wherein the dummy semiconductor die comprises a dummy bond pad, wherein the dummy bond pad is metal-to-metal bonded to one of the first bond pads.

10. The package of claim 8, wherein at least one of the first bond pads is over the first encapsulant between the two first semiconductor dies.

11. The package of claim 8, further comprising:

a second encapsulant over the first bonding structure and between the bridge structure and the dummy semiconductor die.

12. The package of claim 11, wherein the second encapsulant directly contacts the first bonding structure.

13. The package of claim 8, further comprising:

a first heat spreader over the bridge structure.

14. The package of claim 13, further comprising:

a second heat spreader over the dummy semiconductor die.

15. A semiconductor package, comprising:

a first semiconductor device, having a front side and a backside opposite to the front side;

a first encapsulant along sidewalls of the first semiconductor device;

a backside redistribution layer over the first encapsulant and the backside of the first semiconductor device;

a first bonding structure over the backside redistribution layer, wherein the backside redistribution layer and the first bonding structure extend laterally beyond an edge of the first semiconductor device;

a second semiconductor device over the backside of the first semiconductor device and electrically connected to the first semiconductor device, wherein the backside of the first semiconductor device is between the front side of the first semiconductor device and the second semiconductor device;

a second bonding structure on a front side of the second semiconductor device and bonded to the first bonding structure, wherein an edge of the second bonding structure is aligned with an edge of the second semiconductor device;

a front side redistribution pattern over the front side of the first semiconductor device, wherein the front side redistribution pattern includes contact pads over a surface of the first encapsulant;

a through via extending through the first encapsulant to electrically couple a conductive feature of the front side redistribution pattern to a conductive feature of the backside redistribution layer; and a plurality of bumps, disposed at the front side of the first semiconductor device and physically contacting first device pads of the first semiconductor device and the front side redistribution pattern, wherein a width of the first semiconductor device is less than a width of the second semiconductor device.

16. The package of claim 15, wherein the first bonding structure comprises a first dummy bond pad, wherein the second bonding structure comprises a second dummy bond pad, wherein the first dummy bond pad is direct bonded to the second dummy bond pad.

17. The package of claim 15, further comprising a second encapsulant along sidewalls of the second semiconductor device.

18. The package of claim 17, wherein the first bonding structure completely separates the first encapsulant from the second encapsulant in a cross-sectional view.

19. The package of claim 15, wherein the second semiconductor device overlaps the through via.

20. The package of claim 15, wherein a width of the second semiconductor device is greater than a width of the first semiconductor device.

* * * * *